(12) United States Patent
Ohuchi et al.

(10) Patent No.: US 8,591,633 B2
(45) Date of Patent: Nov. 26, 2013

(54) EXHAUST GAS TREATMENT SYSTEM

(75) Inventors: Tai Ohuchi, Chiyoda-ku (JP); Takashi Okabe, Chiyoda-ku (JP); Tsuyoshi Asano, Chiyoda-ku (JP)

(73) Assignee: JX Nippon Oil & Energy Corporation, Chiyoda-Ku, Tokyo (JP)

(*) Notice: Subject to any disclaimer, the term of this patent is extended or adjusted under 35 U.S.C. 154(b) by 0 days.

(21) Appl. No.: 13/610,131

(22) Filed: Sep. 11, 2012

(65) Prior Publication Data

US 2013/0008311 A1 Jan. 10, 2013

Related U.S. Application Data

(63) Continuation of application No. PCT/JP2011/001474, filed on Mar. 14, 2011.

(30) Foreign Application Priority Data

| Mar. 12, 2010 | (JP) | 2010-055396 |
| Mar. 12, 2010 | (JP) | 2010-055397 |
| Mar. 12, 2010 | (JP) | 2010-055398 |

(51) Int. Cl.
*B01D 53/22* (2006.01)

(52) U.S. Cl.
USPC .......... 96/4; 96/417; 96/422; 95/1; 95/8; 95/12; 95/14; 95/23; 95/55; 95/56

(58) Field of Classification Search
USPC .......... 96/4, 417, 422; 95/1, 8, 12, 14, 23, 45, 95/55, 56
See application file for complete search history.

(56) References Cited

U.S. PATENT DOCUMENTS 4,806,132 A * 2/1989 Campbell .......... 95/55
4,941,893 A * 7/1990 Hsieh et al. .......... 95/55
(Continued)

FOREIGN PATENT DOCUMENTS

| JP | 62-134414 A | 6/1987 |
| JP | 08-083772 A | 3/1996 |

(Continued)

OTHER PUBLICATIONS

International Search Report (FormPCT/ISA/210) dated Apr. 26, 2011, issued in corresponding International Application No. PCT/JP2011/001474, and an English Translation thereof. (4 pages).

(Continued)

*Primary Examiner* — Jason W Greene
(74) *Attorney, Agent, or Firm* — Buchanan Ingersoll & Rooney PC

(57) ABSTRACT

An exhaust gas treatment system treats a mixed gas containing at least hydrogen and monosilane discharged from a semiconductor fabrication equipment. The exhaust gas treatment system includes a pump unit which emits the mixed gas discharged from the semiconductor fabrication equipment, a compressor which compresses the mixed gas emitted by the pump unit and sends the mixed gas to a rear stage, a gas accommodation unit which collects and accommodates the compressed mixed gas, a flow rate control unit which controls a flow rate of the mixed gas supplied from the gas accommodation unit, and a membrane separation unit which causes the hydrogen to selectively permeate therethrough and separates the monosilane and the hydrogen from the mixed gas. Accordingly, the exhaust gas treatment system may be stably operated in a state where a change in pressure of the mixed gas discharged from the semiconductor fabrication equipment is alleviated.

9 Claims, 47 Drawing Sheets

(56) References Cited

U.S. PATENT DOCUMENTS

| | | | |
|---|---|---|---|
| 5,053,058 A * | 10/1991 | Mitariten | 95/55 |
| 5,730,780 A * | 3/1998 | Booth, III | 96/8 |
| 6,221,131 B1 * | 4/2001 | Behling et al. | 95/55 |
| 6,866,698 B2 * | 3/2005 | Erickson et al. | 95/56 |
| 2004/0134348 A1 * | 7/2004 | Krueger et al. | 95/56 |
| 2012/0210873 A1 | 8/2012 | Samura et al. | |

FOREIGN PATENT DOCUMENTS

| | | |
|---|---|---|
| JP | 09-239239 A | 9/1997 |
| JP | 2005-008430 A | 1/2005 |
| JP | 2010-207771 A | 9/2010 |
| JP | 2010-221097 A | 10/2010 |
| WO | 2009/125457 A1 | 10/2009 |
| WO | 2010/103846 A1 | 9/2010 |
| WO | 2010/103847 A1 | 9/2010 |

OTHER PUBLICATIONS

International Preliminary Report on Patentability and Written Opinion of the International Searching Authority (Form PCT/IB/373 and PCT/ISA/237) dated Oct. 2, 2012, issued in corresponding International Application No. PCT/JP2011/001474, and an English Translation thereof. (10 pages).

* cited by examiner

EXHAUST GAS TREATMENT SYSTEM

BACKGROUND OF THE INVENTION

1. Field of the Invention

The present invention relates to an exhaust gas treatment system which treats a gas containing hydrogen and a silane gas discharged from a semiconductor fabrication equipment.

2. Description of the Related Art

An exhaust gas which is discharged from a semiconductor fabrication equipment, and particularly, a plasma CVD device that forms a film of thin-film silicon used in a solar cell contains monosilane that needs to be detoxified, hydrogen that does not need to be detoxified, and fine particles (high-order silane) in a mixed state. In an existing exhaust gas treatment device, fine particles are removed by a filter, nitrogen is added to a mixed gas (hydrogen/monosilane=2 to 100) containing remaining monosilane and hydrogen, and the resultant gas is treated by a detoxifying device. The addition amount of nitrogen is adjusted so that the concentration of monosilane becomes 2% or less from the viewpoint of the production of powder.

CITATION LIST

Patent Literature

Patent Literature 1: Japanese Patent Application Laid-Open (JP-A) No. 62-134414
Patent Literature 2: JP-A No. 09-239239

SUMMARY OF THE INVENTION

In the existing exhaust gas treatment device, since the detoxifying treatment is performed on the mixed gas containing a small amount of monosilane which needs to be detoxified and a large amount of hydrogen which does not need to be detoxified, an instrument necessary for detoxifying the monosilane and further the exhaust gas treatment device increase in size. Further, in a case where the monosilane is detoxified by combustion, the consumption amount of an LPG gas for combustion increases, and the energy efficiency degrades. Further, since the pressure and the flow rate of the exhaust gas discharged from the semiconductor fabrication equipment drastically change due to the operation condition of the semiconductor fabrication equipment, it was difficult to stably operate the exhaust gas treatment device.

The invention is made in view of such circumstances, and it is an object of the invention to provide a technique of decreasing a size of a system which treats an exhaust gas discharged from a semiconductor fabrication equipment. It is another object of the invention to provide a technique of decreasing a size of a system which treats an exhaust gas discharged from a semiconductor fabrication equipment and of stably operating the system for a long period of time.

An embodiment of the present invention relates to an exhaust gas treatment system which treats a mixed gas containing at least hydrogen and monosilane discharged from a semiconductor fabrication equipment. The exhaust gas treatment system includes: a pump which emits the mixed gas discharged from the semiconductor fabrication equipment; a compressor which compresses the mixed gas emitted by the pump and sends the mixed gas to a rear stage; a gas accommodation unit which collects and accommodates the compressed mixed gas; a flow rate control unit which controls a flow rate of the mixed gas supplied from the gas accommodation unit; and a membrane separation unit which causes the hydrogen to selectively permeate therethrough and separates the monosilane and the hydrogen from the mixed gas.

According to the embodiment, since the mixed gas containing at least the hydrogen and the monosilane discharged from the semiconductor fabrication equipment is separated into the monosilane which needs to be detoxified and the hydrogen which does not need to be detoxified by the membrane separation unit and the hydrogen and the monosilane which are separated from the mixed gas are respectively treated, a treatment instrument may be decreased in size, and further the exhaust gas treatment system may be made to be compact.

According to another embodiment, an exhaust gas treatment system treats a mixed gas containing at least hydrogen and monosilane discharged from a semiconductor fabrication equipment, and the exhaust gas treatment system includes: a membrane separation unit which causes the hydrogen to selectively permeate therethrough and separates the monosilane and the hydrogen from the mixed gas; a hydrogen recovery rate acquisition unit which acquires information on a recovery rate of the hydrogen separated by the membrane separation unit and calculates the recovery rate of the hydrogen; and a pressure control unit which controls a permeation side pressure of the membrane separation unit in response to a change in hydrogen recovery rate.

The pressure control unit may change the permeation side pressure based on the following equation. The equation is expressed by $\Delta P = C_1 \times \Delta A$, $C_1 \geq 0.5$. Here, $\Delta A$ indicates a decrease rate (%) of the hydrogen recovery rate, and $\Delta P$ indicates a decrease amount (kPa) of the permeation side pressure.

Another embodiment of the invention relates to an exhaust gas treatment system. The exhaust gas treatment system treats a mixed gas containing at least hydrogen and monosilane discharged from a semiconductor fabrication equipment, and the exhaust gas treatment system includes: a membrane separation unit which causes the hydrogen to selectively permeate therethrough and separates the monosilane and the hydrogen from the mixed gas; a hydrogen recovery rate acquisition unit which acquires information on a recovery rate of the hydrogen separated by the membrane separation unit and calculates the recovery rate of the hydrogen; and a temperature control unit which controls a temperature of the mixed gas flowing into the membrane separation unit in response to a change in hydrogen recovery rate.

The temperature control unit may change the temperature of the mixed gas flowing into the membrane separation unit based on the following equation. The equation is expressed by $\Delta T = C_2 \times \Delta A$, $C_2 \geq 0.8$. Here, $\Delta A$ indicates a decrease rate (%) of the hydrogen recovery rate, and $\Delta T$ indicates an increase amount (° C.) of the temperature of the mixed gas.

The hydrogen recovery rate acquisition unit may include a mixed gas analysis unit which measures a flow rate of the mixed gas flowing and a concentration of the hydrogen and the monosilane into the membrane separation unit, and a permeation side gas analysis unit which measures a flow rate of a gas and a concentration of the hydrogen and the monosilane, the gas comprising the hydrogen, and the monosilane being separated while permeating the membrane separation unit.

Further, the hydrogen recovery rate acquisition unit may include: a flow rate control unit which controls a flow rate of the mixed gas flowing into the membrane separation unit; a mixed gas analysis unit which measures a concentration of the hydrogen and the monosilane in the mixed gas of which the flow rate is controlled; and a permeation side gas analysis unit which measures a flow rate of a gas and a concentration of the hydrogen and the monosilane, the gas comprising the hydrogen, and the monosilane being separated while permeating the membrane separation unit.

Still another embodiment of the invention relates to an exhaust gas treatment system which treats a mixed gas containing at least hydrogen and monosilane discharged from a semiconductor fabrication equipment. The exhaust gas treatment system is an exhaust gas treatment system which separates respective gases, by membrane separation, from a mixed gas containing at least hydrogen and monosilane discharged from a semiconductor fabrication equipment, the exhaust gas treatment system including: a gas addition unit which adds a third element gas to the mixed gas discharged from the semiconductor fabrication equipment; a membrane separation unit which causes the hydrogen to selectively permeate therethrough and separates the monosilane and the hydrogen from the mixed gas having the third element gas added thereto; and a hydrogen recovery rate acquisition unit which acquires a recovery rate of the hydrogen separated by the membrane separation unit, wherein the third element gas addition unit changes the addition amount of the third element gas according to the following equation.

$$\Delta F = C_1 \times \Delta A, \quad C_1 \geq 0.3 \qquad \text{Equation (3-1)}$$

Here, $\Delta A$ indicates a decrease rate (%) of the hydrogen recovery rate, and $\Delta F$ indicates a decrease amount (L/min) of the addition amount of the third element gas.

The exhaust gas treatment system according to the above embodiment includes a pressure control unit which controls a permeation side pressure of the membrane separation unit, wherein the pressure control unit may change the permeation side pressure of the membrane separation device according to the following equation.

$$\Delta P = C_2 \times \Delta A, \quad C_2 \geq 0.5$$

Here, $\Delta A$ indicates a decrease rate (%) of the hydrogen recovery rate, and $\Delta P$ indicates a decrease amount (kPa) of the permeation side pressure of the membrane separation device.

Further, the exhaust gas treatment system according to the above embodiment includes a temperature control unit which controls a temperature of the mixed gas, wherein the temperature control unit may change the temperature of the mixed gas according to the following equation.

$$\Delta T = C_3 \times \Delta A, \quad C_3 \geq 0.8$$

Here, $\Delta A$ indicates a decrease rate (%) of the hydrogen recovery rate, and $\Delta T$ indicates an increase amount (° C.) of the temperature of the mixed gas.

The hydrogen recovery rate acquisition unit may include a mixed gas analysis unit which measures a flow rate of the mixed gas flowing into the membrane separation unit and a concentration of the hydrogen and the monosilane, and a permeation side gas analysis unit which measures a flow rate of a gas separated while permeating the membrane separation unit and a concentration of the hydrogen and the monosilane.

According to the invention, it is possible to decrease the size of a system which treats an exhaust gas discharged from a semiconductor fabrication equipment.

DETAILED DESCRIPTION OF THE INVENTION

Figure 1:
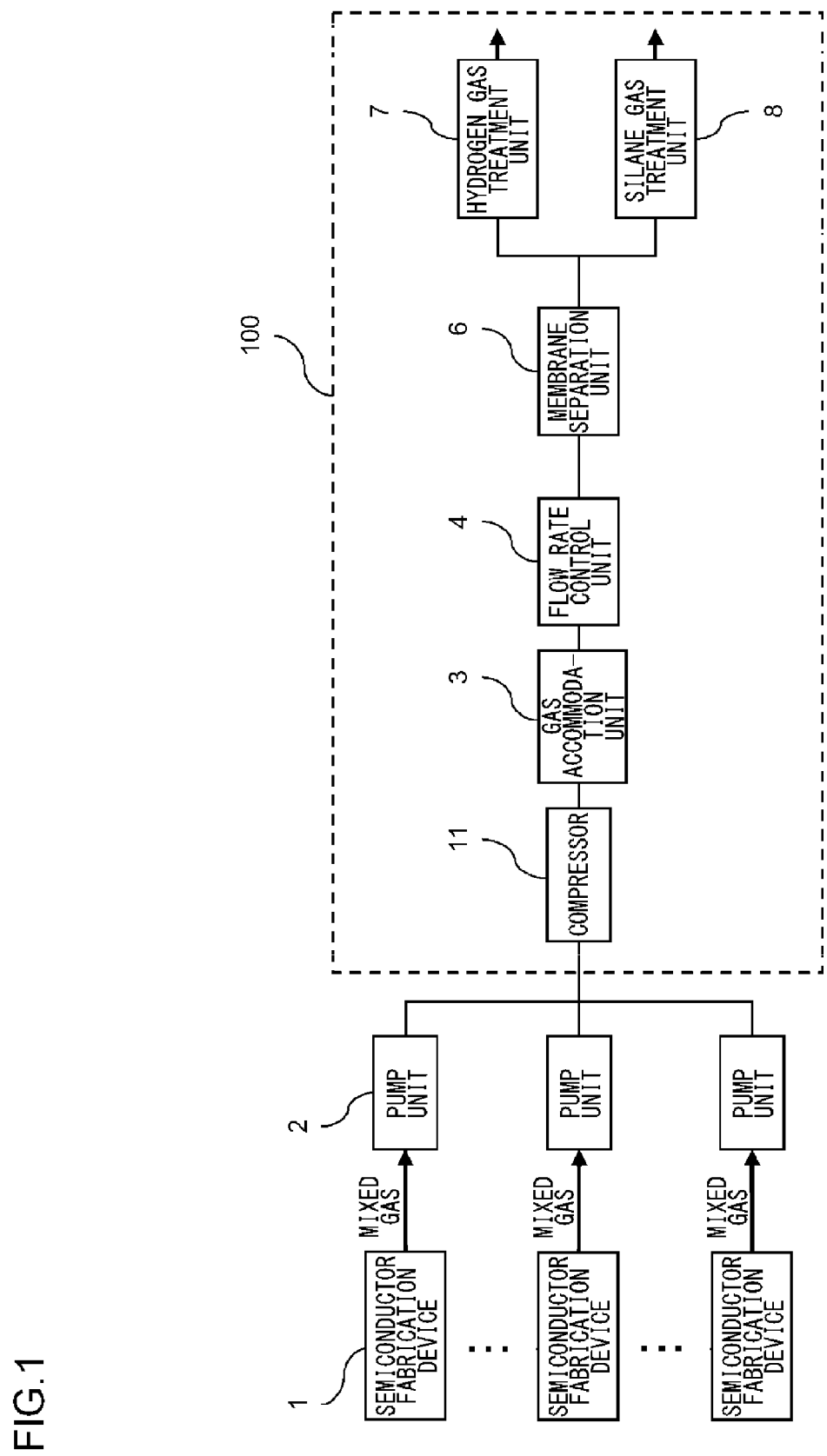
FIG. 1 is a system diagram illustrating a schematic example of an exhaust gas treatment system according to a first embodiment.

Hereinafter, embodiments of the invention will be described by referring to the drawings. Furthermore, in all drawings, the same reference numerals will be given to the same components, and the description thereof will not be repeated.

(First Embodiment)

Figure 2:
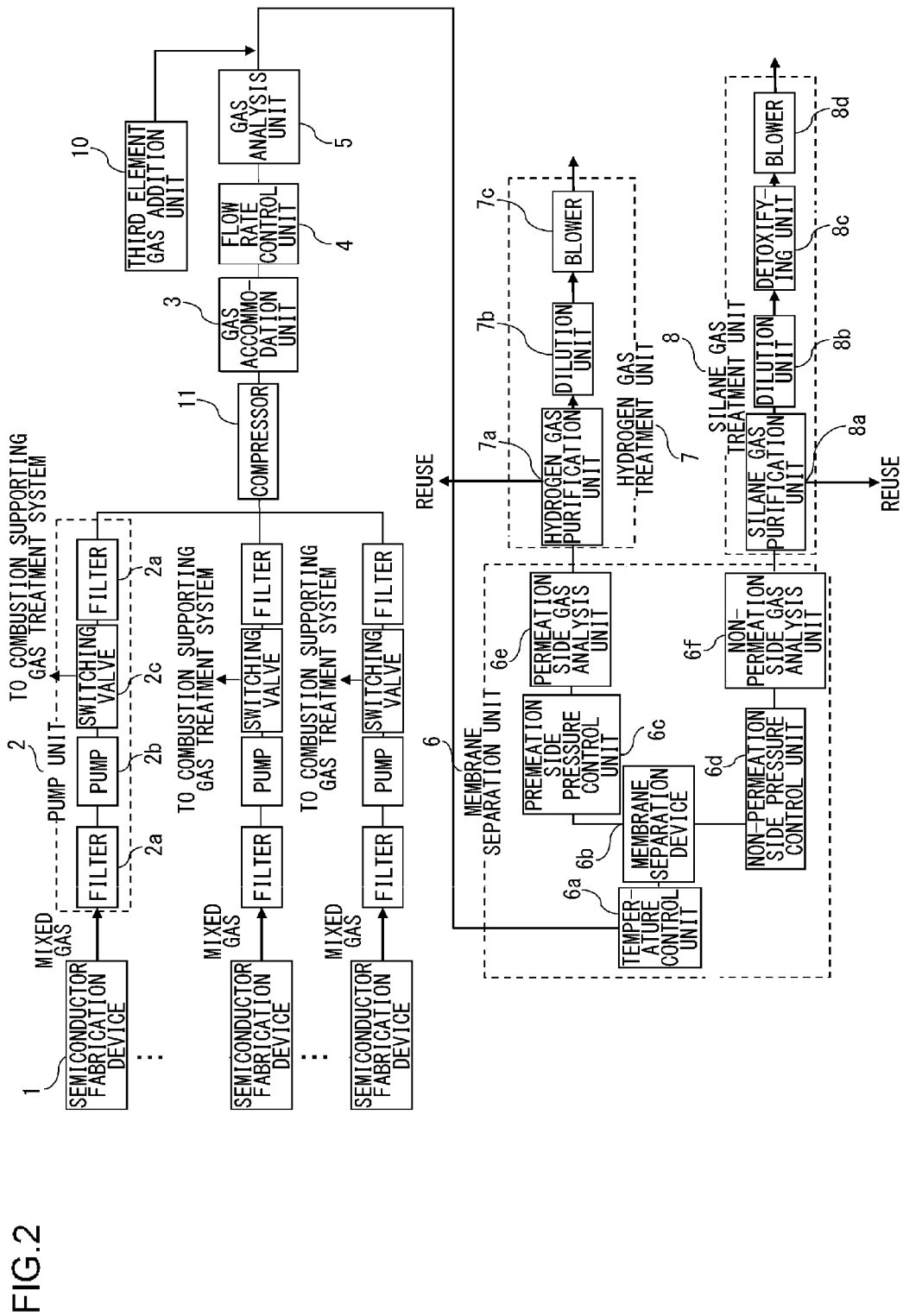
FIG. 2 is a system diagram more specifically illustrating a configuration of the exhaust gas treatment system according to the first embodiment.
Figure 3:
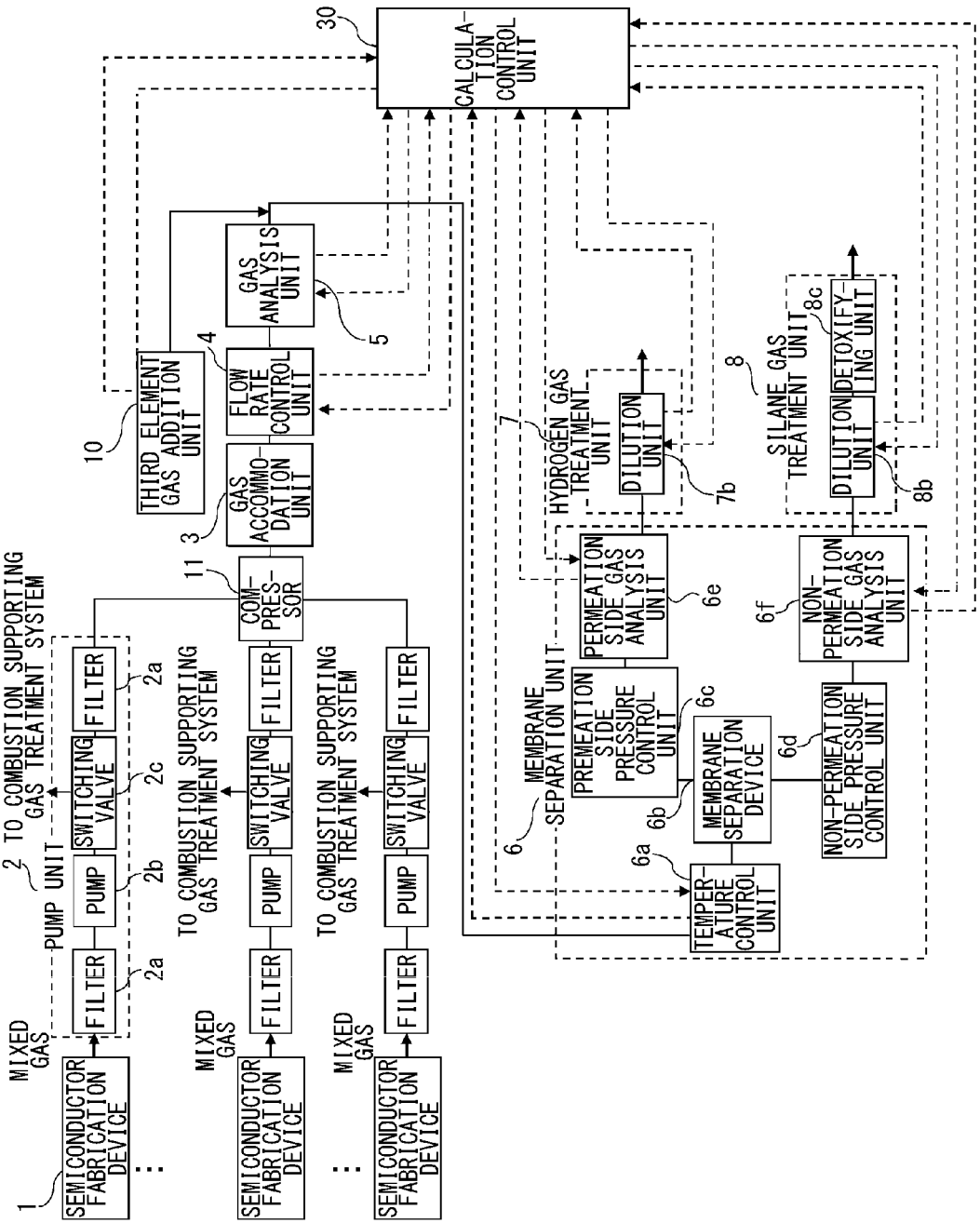
FIG. 3 is a system diagram illustrating an example of data processing in the respective components of the exhaust gas treatment system according to the first embodiment.

FIG. 1 is a system diagram illustrating a schematic example of an exhaust gas treatment system according to the embodiment. FIG. 2 is a system diagram more specifically illustrating a configuration of the exhaust gas treatment system according to the embodiment. FIG. 3 is a system diagram illustrating an example of data processing of the respective components of the exhaust gas treatment system according to the embodiment.

As illustrated in FIG. 1, an exhaust gas treatment system 100 according to the embodiment includes a compressor 11 which collects and compresses a mixed gas containing at least hydrogen and monosilane discharged from plural semiconductor fabrication equipments 1 through a pump unit 2, a gas accommodation unit 3 which accommodates the mixed gas discharged from the compressor 11, a flow rate control unit 4 which controls a flow rate of the mixed gas from the gas accommodation unit 3, a membrane separation unit 6 which separates the monosilane and the hydrogen from the mixed gas, a hydrogen gas treatment unit 7 which treats the hydrogen separated by the membrane separation unit 6, and a silane gas treatment unit 8 which treats the silane gas separated by the membrane separation unit 6.

The semiconductor fabrication equipment 1 is not particularly limited, but a plasma CVD device or the like which forms a film by thin-film silicon used in a solar cell may be exemplified.

The composition of the mixed gas discharged from the semiconductor fabrication equipment 1 is not particularly limited, but for example, contained are monosilane which need to be detoxified, hydrogen which does not need to be detoxified, nitrogen, and a small amount of impurities. As the small amount of impurities, high-order silane including plural Si such as disilane or trisilane, $PH_3$, and $B_2H_6$ (which are respectively 0.001 to 1%) may be exemplified.

The pump unit 2 suctions the mixed gas discharged from the semiconductor fabrication equipment 1, and sends the mixed gas to the compressor 11 of the rear stage. The type of pump to be used is not particularly limited, but a dry pump is used in the semiconductor fabrication equipment in many cases. The dry pump may introduce a purging gas for the purpose of maintaining air-tightness, preventing unnecessary deposited material, preventing the corrosion inside the pump, and improving the emission performance. The purging gas is not particularly limited, but an inert gas such as nitrogen or argon is used in many cases.

Further, even the introduction amount of the purging gas is not particularly limited, but in general, the introduction amount is 10 to 50 NL/min for each pump.

Further, as illustrated in FIG. 2, a filter 2a may be provided at the front stage and/or the rear stage of a pump 2b. In particular, when a comparatively large amount of fine particles such as high-order silane exist in the exhaust gas, it is desirable to provide the filter 2a. The filter 2a is a fine particle capturing filter which selectively removes fine particles such as high-order silane contained in the mixed gas. The filter to be used is not particularly limited, but a vortex filter or the like may be used.

Further, in the semiconductor fabrication equipment 1, chemical cleaning may be performed so as to remove a deposited material produced inside a chamber due to the film forming. In the chemical cleaning, it is general to perform a plasma treatment under the introduction of a gas such as $NF_3$ or $F_2$ so as to remove a silicon thin film deposited in the chamber. However, since such a gas has a combustion supporting property, there is a need to prevent the gas from contacting a combustible gas such as hydrogen or monosilane, and hence it is desirable to provide a switching valve 2c in rear of the pump 2b as in a case of FIG. 2. Accordingly, when the exhaust gas of the chemical cleaning comes out, a combustion supporting gas treatment system is selected, so that such an exhaust gas is prevented from being mixed with a treatment line of a silane gas. Furthermore, in the switching valve 2c, such a mechanism may be built in the pump.

The compressor 11 is not particularly limited, but a diaphragm type compressor, a centrifugal compressor, an axial flow compressor, a reciprocating compressor, a twin screw compressor, a single screw compressor, a scroll compressor, a rotary compressor, and the like may be exemplified. Among these, the diaphragm type compressor is more desirable.

The operation condition of the compressor 11 is not particularly limited, but it is desirable to operate the compressor so that the temperature of the compressed mixed gas becomes 200° C. or less which is a decomposition temperature of monosilane. That is, when it is supposed that the mixed gas discharged from the pump unit 2 is compressed from normal pressure, it is desirable to operate the compressor so that the compression ratio becomes 4.4 or less.

The compressor configuration used in the compressor 11 is not particularly limited, but in order to stably operate the compressor even when the flow rate of the mixed gas supplied to the compressor changes, it is desirable to have a configuration in which inverters are provided in parallel or a spill-back type configuration in which the mixed gas once compressed by the compressor is returned to the suction side of the compressor again.

The gas accommodation unit 3 is used to collect the mixed gas discharged from the plural semiconductor fabrication equipments 1 through the pump unit 2 in a tank having a sufficient capacity or the like, and is used to average a change in flow rate and pressure of the mixed gas discharged from the respective semiconductor fabrication equipments 1 and to circulate the mixed gas with the constant flow rate and the constant pressure to the membrane separation unit 6 at all times. Further, a function of removing fine particles contained in the mixed gas may be provided by devising a structure.

The size of the tank used in the gas accommodation unit 3 is not particularly limited, but it is desirable that the size is equal to or larger than the sum of the maximum flow rates of the gases supplied to the respective semiconductor fabrication equipments 1.

The pressure inside the tank used in the gas accommodation unit 3 is not particularly limited, but it is desirable that the pressure is 1 MPaG at maximum.

Further, when the operation of the equipment starts, it is desirable that the exhaust gas or the purging gas of the pump is supplied from the compressor 11 to the gas accommodation unit 3 and is accumulated in the gas accommodation unit 3 while the outlet valve of the gas accommodation unit 3 is closed. Accordingly, even when the flow rate of the exhaust gas of the semiconductor fabrication equipment largely changes, it is possible to maintain a pressure sufficient for maintaining the supply flow rate to the separation equipment to be constant and to increase the amount of a gas which may be accommodated in the gas accommodation unit 3. Accordingly, it is possible to decrease the volume of the gas accommodation unit. Further, when a sufficient pressure is accumulated, the non-permeation side pressure of the membrane separation device may be set to be high, which is advantageous in operation due to a sufficient differential pressure with respect to the permeation side.

The flow rate control unit 4 is used to control the flow rate and the pressure of the mixed gas collected in the gas accommodation unit 3 so that the flow rate and the pressure become constant. The control method thereof is not particularly limited, but it is desirable that the control method is not influenced by a change in pressure of the mixed gas supplied to the flow rate control unit 4, for example, a mass flow controller or the like may be exemplified. Further, even as for the pressure, the necessary pressure may be ensured by selecting the operation condition of the compressor 11.

The membrane separation unit 6 includes at least a membrane separation device 6b and a permeation side pressure control unit 6c and/or a non-permeation side pressure control unit 6d as illustrated in FIG. 2. The membrane separation device 6b is a membrane through which hydrogen selectively permeate. There is no particular limitation if metal elements, for example, palladium, nickel, and the like reacting with monosilane are not contained as a main element, and various semipermeable membranes may be exemplified. The semipermeable membrane includes, for example, a dense layer through which hydrogen selectively permeates and a porous base material which supports the dense layer. As the shape of the semipermeable membrane, a flat membrane, a spiral membrane, and a hollow fiber membrane may be exemplified. Among these, the hollow fiber membrane is more desirable.

As the material used in the dense layer, polyimide, polysiloxane, polysilazane, acrylonitrile, polyester, cellulose polymer, polysulfone, polyalkylene glycol, polyethylene, polybutadiene, polystyrene, polyvinylhalide, polyvinylidene halide, polycarbonate, and block copolymers having several repeating units of these may be exemplified.

As the material used in the base material, an inorganic material such as glass, ceramic, and sintered metal and a porous organic material may be exemplified. As the porous organic material, polyether, polyacrylonitrile, polyether, poly(arylene oxide), polyetherketone, polysulfide, polyethylene, polypropylene, polybutene, polyvinyl, and the like may be exemplified.

The flow rate, the pressure, and the temperature of the mixed gas supplied to the membrane separation device 6b, the concentration of the monosilane gas, and the non-permeation side pressure and the permeation side pressure of the membrane separation device 6b are not particularly limited. For example, as the flow rate, the flow rate is 5 NL/min to 500 NL/min with respect to the capacity of 1 L of the membrane separation device, and is desirably 10 NL/min to 100 NL/min. As the pressure, −90 kPaG to 1.0 MPaG is desirable. As the temperature, about −20° C. to 100° C. is desirable. As the concentration of the monosilane gas, 30 vol % or less, desirably 20 vol % or less, more desirably, 10 vol % or less is desirable. As the non-permeation side pressure of the membrane separation device 6b, −90 kPaG to 0.85 MPaG is desirable. As the permeation side pressure, −100 kPaG to 0.9 MPaG is desirable.

Here, the capacity of the membrane separation device indicates the volume of the portion in which the separation membrane is sufficiently charged inside the membrane separation device.

Further, when the operation is performed at a temperature other than a room temperature as the temperature of the mixed gas supplied to the membrane separation device 6b, there is a need to provide a temperature control unit 6a illustrated in FIG. 2.

The temperature control unit 6a is not particularly limited if a function of cooling or heating the mixed gas is provided, but an electric heater, various heat exchangers, or the like may be exemplified. The mixed gas which is cooled or heated by the temperature control unit 6a is supplied to the membrane separation device 6b.

In fact, the membrane separation conditions are closely concerned with each other. For example, in a case of the membrane separation capacity of 1 L, the supply flow rate to the membrane separation device is desirably 20 NL/min to 50 NL/min, the concentration of the monosilane gas is desirably 10 vol % or less, the temperature is desirably 10° C. to 40° C., the non-permeation side pressure of the membrane separation device is desirably the atmospheric pressure or more, and the permeation side pressure is desirably −100 kPaG to −60 kPaG.

Figure 4:
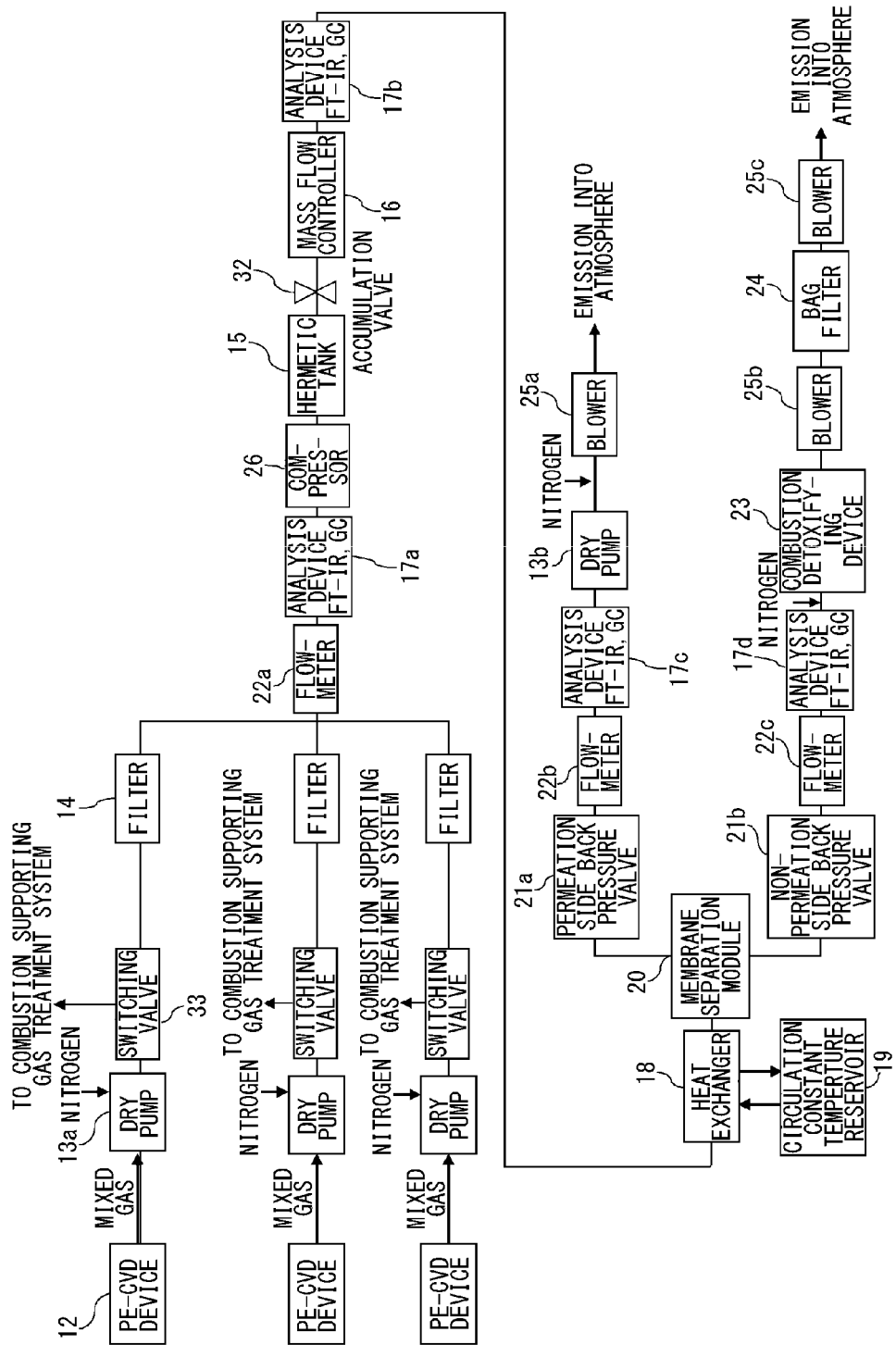
FIG. 4 is a system diagram illustrating a configuration of an exhaust gas treatment system according to Example 1-1.

The respective gases separated by the membrane separation device 6b are sent to the hydrogen gas treatment unit 7 and the silane gas treatment unit 8. In the hydrogen gas treatment unit 7, the simply collected hydrogen is used for a combustion treatment or fuel. For example, as illustrated in FIG. 2, the hydrogen may be diluted by a dilution unit 7b by nitrogen, air, or the like so as to be an explosion limit or less and may be discharged to the outside. Further, at the dilution time, it is desirable to dilute the hydrogen so that the concentration of the hydrogen becomes an explosion lower limit or less (4 vol % or less) from the viewpoint of safety. The dilution rate of the dilution unit 7b is not particularly limited if at least the concentration of monosilane satisfies 5 ppmv or less. When the dilution rate is controlled based on a measurement result of a permeation side gas analysis unit 6e, the dilution rate may be effectively controlled without any consumption. The separated gas which is diluted by the dilution unit 7b is discharged to the outside by a blower 7c. Further, in order to reduce the concentration of monosilane in the collected gas, a mechanism (not illustrated) may be further provided which selectively detoxifies the monosilane. A detoxifying agent which selectively performs a detoxifying treatment is not particularly limited, but an oxidizing agent, an adsorbing agent, or the like may be exemplified. Further, as illustrated in FIG. 4, a hydrogen gas purification unit 7a may be provided so that hydrogen is purified and used again.

Further, in the silane gas treatment unit 8, for example, as illustrated in FIG. 2, monosilane as a toxic gas is diluted by a dilution unit 8b in accordance with the specification of the device of a detoxifying unit 8c as a detoxifying device so as to be a predetermined concentration, and is introduced into the detoxifying unit 8c, so that the monosilane is detoxified to be an allowable concentration or less and is discharged to the outside by the blower 8d. Furthermore, a silane gas purification unit 8a may be provided so that the monosilane is purified and used again.

In the exhaust gas treatment system according to the embodiment, various additional instruments illustrated in FIGS. 2 and 3 may be further provided.

For example, as illustrated in FIG. 2, a gas analysis unit 5 may be provided so as to measure the concentration of the element gas of the mixed gas of which the flow rate is controlled to be constant by the flow rate control unit 4, and particularly, the concentration of the hydrogen and the monosilane in the gas. In the gas analysis unit 5, the method thereof is not particularly limited if at least the concentration of the hydrogen and the monosilane in the mixed gas may be measured. For example, an FT-IR with a gas circulation type sample cell, an on-line type gas chromatograph, or the like may be exemplified.

Further, as illustrated in FIG. 2 or 3, in order to adjust the concentration of the monosilane in the mixed gas, a third element gas addition unit 10 may be provided before and after the gas analysis unit 5, and a third element gas may be added to the mixed gas by a predetermined amount. The third element gas to be added is not particularly limited if the gas does not abruptly react with the element gas such as the monosilane in the mixed gas, but for example, nitrogen, argon, hydrogen, helium, xenon, a hydrocarbon gas having a carbon number of 1 to 4, and the like may be exemplified. When the third element gas addition unit 10 is provided, it is desirable to provide the gas analysis unit 5 before and after the third element gas addition unit so as to measure the concentration of the hydrogen and the monosilane in the mixed gas before and after the addition of the third element gas.

Further, as illustrated in FIG. 2, in order to measure the flow rate of each gas separated by the membrane separation unit 6 and the concentration of the element thereof, a permeation side gas analysis unit 6e and a non-permeation side gas analysis unit 6f may be provided. For example, in the hydrogen gas treatment unit 7, the flow rate of the permeation side gas of the membrane separation device 6b and the concentration of the hydrogen and the monosilane in the gas are measured. Accordingly, the dilution rate of the dilution unit 7b when emitting the collected hydrogen gas into the atmosphere may be controlled based on the measurement result so that the concentration of the monosilane becomes an allowable concentration (5 ppmv or less). In the dilution unit 7b, in order to safely emit the collected hydrogen into the atmosphere, nitrogen, air, or the like may be added thereto so that the concentration of the monosilane becomes the allowable concentration or less and the concentration of the hydrogen becomes the explosion lower limit (4 vol % or less).

Furthermore, as for the permeation side gas which is discharged from the permeation side of the membrane separation device 6b, the flow rate and the concentration of the hydrogen and the monosilane thereof are measured by the permeation side gas analysis unit 6e. Further, the permeation side pressure control unit 6c is used to control the permeation side pressure of the membrane separation device 6b. The recovery rate (the hydrogen recovery rate) of the hydrogen gas may be calculated by combining the measurement result which can be obtained with the measurement result of the flow rate of the mixed gas which is supplied to the membrane separation device 6b and is not yet separated and the concentration of the hydrogen and the monosilane thereof. Here, the hydrogen recovery rate is defined by the following equation (1-1).

$$\text{Hydrogen recovery rate}(\%) = 100 \times ((A/100) \times B)/((C/100) \times D). \quad \text{Equation (1-1)}$$

Here, A indicates the concentration of the hydrogen (permeation side hydrogen concentration) (vol %) of the permeation side gas, B indicates the flow rate of the permeation side gas (permeation side total gas flow rate) (L/min), C indicates the concentration of the hydrogen (supply side hydrogen concentration) (vol %) of the mixed gas supplied to the membrane separation device, and D indicates the flow rate (supply side total gas flow rate) (L/min) of the mixed gas supplied to the membrane separation device.

The degradation state of the membrane separation device 6b may be recognized by monitoring the hydrogen recovery rate. For example, the operation may be performed while maintaining the high hydrogen recovery rate at all times by controlling the temperature of the mixed gas supplied to the membrane separation device 6b, the non-permeation side pressure of the membrane separation device 6b, the permeation side pressure thereof, or the addition amount of the third element gas with degradation in the hydrogen recovery rate. At this time, as for the decrease amount of the hydrogen recovery rate, it is desirable to control the temperature of the mixed gas supplied to the membrane separation device 6b, the permeation side pressure of the membrane separation device 6b, and the addition amount of the third element gas so as to satisfy the following equation (1-2) to equation (1-4).

$$\Delta P = C_1 \times \Delta A, \ C_1 \geq 0.5 \quad \text{Equation (1-2)}$$

Here, $\Delta P$ indicates a permeation side pressure decrease amount (kPa), and $\Delta A$ indicates a decrease rate (%) of the hydrogen recovery rate.

$$\Delta T = C_2 \times \Delta A, \ C_2 \geq 0.8 \quad \text{Equation (1-3)}$$

Here, $\Delta T$ indicates a temperature increase amount (° C.), and $\Delta A$ indicates a decrease rate (%) of the hydrogen recovery rate.

$$\Delta F = C_3 \times \Delta A, \ C_3 \geq 0.3 \quad \text{Equation (1-4)}$$

Here, $\Delta F$ indicates a decrease amount (L/min) of the third element gas addition amount, and $\Delta A$ indicates a decrease rate (%) of the hydrogen recovery rate.

Further, for example, in the silane gas treatment unit 8, the flow rate of the non-permeation side gas of the membrane separation device 6b and the concentration of the hydrogen and the monosilane in the gas are measured. Accordingly, the dilution rate of the dilution unit 8b when detoxifying the collected monosilane gas using the detoxifying unit 8c may be controlled based on the measurement result so that the concentration of the monosilane becomes the allowable concentration (for example, about 2 vol %) or less of the detoxifying device.

Furthermore, the above-described control is performed by using a calculation control unit 30 illustrated in FIG. 3. Further, the calculation control unit 30 may control the flow rate of the mixed gas using the flow rate control unit 4 based on the flow rate of the controlled mixed gas, the measurement result of the concentration of the monosilane in the mixed gas obtained by the gas analysis unit 5, and the capacity of the membrane separation device.

Further, the calculation control unit 30 may calculate the hydrogen recovery rate based on the flow rate value of the mixed gas obtained by the flow rate control unit 4, the measurement result of the concentration of the monosilane in the mixed gas obtained by the gas analysis unit 5, and the measurement result of the flow rate of the permeation side gas and the concentration of the monosilane in the permeation side gas obtained by the permeation side gas analysis unit 6e.

The calculation control unit 30 may control the temperature of the mixed gas supplied to the membrane separation device 6b, the non-permeation side pressure of the membrane separation device 6b, the permeation side pressure thereof, and the addition amount of the third element gas with respect to the decrease amount of the calculated hydrogen recovery rate.

Further, the calculation control unit 30 may determine how the operation condition of the hydrogen gas purification unit 7a is or whether the collected hydrogen gas will be used again based on the measurement result of the flow rate of the permeation side gas and the concentration of the hydrogen and the monosilane in the permeation side gas obtained by the permeation side gas analysis unit 6e. When the calculation control unit 30 determines that the collected hydrogen gas will not be used again, the calculation control unit may control the dilution rate of the dilution unit 7b of the hydrogen gas treatment unit 7 so that the concentration of the monosilane becomes the allowable concentration (5 ppmv or less).

Further, the calculation control unit 30 may determine how the operation condition of the silane gas purification unit 8a is or whether the collected monosilane is used again based on the measurement result of the flow rate of the non-permeation side gas and the concentration of the hydrogen and the monosilane in the non-permeation side gas obtained by the non-permeation side gas analysis unit 6f. When the calculation control unit 30 determines that the collected monosilane will not be used again, the calculation control unit may control the dilution rate of the dilution unit 8b of the silane gas treatment unit 8 so that the concentration of the monosilane becomes the allowable concentration (for example, about 2 vol %) or less of the detoxifying device. Further, a valve may be provided at the rear stage of the non-permeation side gas analysis unit 6f so as to switch a line directed to the detoxifying unit 8c and a line directed to the semiconductor fabrication equipment 1 for the purpose of reuse.

According to the exhaust gas treatment system, even when the flow rate and the pressure of the mixed gas discharged from the semiconductor fabrication equipment change, the operation may be stably performed without a back pressure which influences the pump emitting the mixed gas discharged from the semiconductor fabrication equipment while the pressure and the flow rate of the mixed gas supplied to the membrane separation unit are maintained to be constant.

Hereinafter, the embodiment will be described in detail based on Example, but the embodiment is not limited to the example.

EXAMPLE 1-1

FIG. 4 is a system diagram illustrating a configuration of an exhaust gas treatment system according to Example 1-1. As illustrated in FIG. 4, the exhaust gas treatment system according to the first embodiment is connected to three thin-film silicon solar cell manufacturing CVD devices which is one of the semiconductor fabrication equipments 1. The exhaust gas treatment system suctions the mixed gas discharged from the plural PE-CVD devices 12 together with nitrogen introduced from the outside by a dry pump 13a corresponding to each device, and sends the resultant gas toward the compressor 26 through the filter 14. Furthermore, a switching valve 33 is provided behind the dry pump 13a. Accordingly, when the exhaust gas of the chemical cleaning comes out, a combustion supporting gas treatment system is selected, so that such an exhaust gas is prevented from being mixed with a treatment line of a silane gas.

As the compressor 26, a compressor is selected which may be operated at the compression ratio of 4. In a state where an accumulation valve 32 is closed, each purging nitrogen of the pump flows at the flow rate of 30 NL/min, so that the pressure of a hermetic tank 15 (capacity: 5 m$^3$) increases to 0.3 MPaG. Subsequently, the accumulation valve 32 is opened so that the supply of a gas to a mass flow controller 16 starts and the respective PE-CVD devices 12 are operated so as to be late by 4 minutes. The operations of the respective PE-CVD devices 12 are performed on the condition illustrated in Table 1. The gas flow rate is controlled at 151.5 NL/min by the mass flow controller 16, the temperature is adjusted to be 40° C. by a heat exchanger 18, and then the result is supplied to a membrane separation module 20 (a polyimide hollow fiber membrane with a capacity of 2.4 L). At this time, the pressure is adjusted to be −98 kPaG by a permeation side back pressure valve 21a. Further, the pressure is adjusted to be 0.1 MPaG by a non-permeation side back pressure valve 21b. The composition and the flow rate of the exhaust gas of the compressor at this time are illustrated in Table 2. The concentration of SiH$_4$ of the separated permeation side gas is 0.019 vol %, and the hydrogen recovery rate is 90.9%, which is constant regardless of a change in exhaust gas flow rate.

Furthermore, a flowmeter 22a and an analysis device 17a illustrated in FIG. 4 are used to measure the flow rate of the mixed gas discharged from the PE-CVD device 12 and the concentration of the hydrogen and the monosilane in the mixed gas. Regarding the mixed gas of which the flow rate or the pressure is controlled at a predetermined value by the mass flow controller 16, the concentration of the hydrogen and the monosilane is measured by the analysis device 17b, and the mixed gas flows into the membrane separation module 20 while the temperature is controlled by the functions of the heat exchanger 18 and a circulation constant temperature reservoir 19. Flowmeters 22b and 22c are respectively provided at the rear stage of the permeation side and the non-permeation side of the membrane separation module 20.

In the exhaust gas treatment system illustrated in FIG. 4, the permeation side gas of the membrane separation module passes through the flowmeter 22b and an analysis device 17c, so that the flow rate of the permeation side gas and the concentration of the hydrogen and the monosilane in the permeation side gas are measured. The permeation side gas which is suctioned by the dry pump 13b is diluted by nitrogen appropriately based on the measurement result and is emitted to the atmosphere by a blower 25a. On the other hand, the non-permeation side separated gas of the membrane separation module 20 passes through the flowmeter 22c and an analysis device 17d, so that the flow rate of the non-permeation side gas and the concentration of the hydrogen and the monosilane in the non-permeation side gas are measured. The non-permeation side gas is diluted by nitrogen appropriately based on the measurement result and is combusted and detoxified by a combustion detoxifying device 23. The gas which is combusted and discharged by the combustion detoxifying device 23 is supplied to a bag filter 24 by a blower 25b so as to remove foreign matter such as particles produced by the combustion, and is emitted to the atmosphere by a blower 25c.

TABLE 1

| TIME (MINUTE) | PE-CVD1 | | | | PE-CVD2 | | | | PE-CVD3 | | | |
|---|---|---|---|---|---|---|---|---|---|---|---|---|
| | GAS FLOW RATE(NL/min) | | | SWITCHING VALVE | GAS FLOW RATE(NL/min) | | | SWITCHING VALVE | GAS FLOW RATE(NL/min) | | | SWITCHING VALVE |
| | $H_2$ | $SiH_4$ | $NF_3$ | | $H_2$ | $SiH_4$ | $NF_3$ | | $H_2$ | $SiH_4$ | $NF_3$ | |
| 1 | 50 | 5 | 0 | SEPARATION SIDE | | | | | | | | |
| 2 | 50 | 5 | 0 | SEPARATION SIDE | | | | | | | | |
| 3 | 50 | 5 | 0 | SEPARATION SIDE | | | | | | | | |
| 4 | 0 | 0 | 0 | SEPARATION SIDE | | | | | | | | |
| 5 | 50 | 5 | 0 | SEPARATION SIDE | 50 | 5 | 0 | SEPARATION SIDE | | | | |
| 6 | 50 | 5 | 0 | SEPARATION SIDE | 50 | 5 | 0 | SEPARATION SIDE | | | | |
| 7 | 50 | 5 | 0 | SEPARATION SIDE | 50 | 5 | 0 | SEPARATION SIDE | | | | |
| 8 | 0 | 0 | 0 | SEPARATION SIDE | 0 | 0 | 0 | SEPARATION SIDE | | | | |
| 9 | 50 | 5 | 0 | SEPARATION SIDE | 50 | 5 | 0 | SEPARATION SIDE | 50 | 5 | 0 | SEPARATION SIDE |
| 10 | 50 | 5 | 0 | SEPARATION SIDE | 50 | 5 | 0 | SEPARATION SIDE | 50 | 5 | 0 | SEPARATION SIDE |
| 11 | 50 | 5 | 0 | SEPARATION SIDE | 50 | 5 | 0 | SEPARATION SIDE | 50 | 5 | 0 | SEPARATION SIDE |
| 12 | 0 | 0 | 0 | SEPARATION SIDE | 0 | 0 | 0 | SEPARATION SIDE | 0 | 0 | 0 | SEPARATION SIDE |
| 13 | 50 | 5 | 0 | SEPARATION SIDE | 50 | 5 | 0 | SEPARATION SIDE | 50 | 5 | 0 | SEPARATION SIDE |
| 14 | 50 | 5 | 0 | SEPARATION SIDE | 50 | 5 | 0 | SEPARATION SIDE | 50 | 5 | 0 | SEPARATION SIDE |
| 15 | 50 | 5 | 0 | SEPARATION SIDE | 50 | 5 | 0 | SEPARATION SIDE | 50 | 5 | 0 | SEPARATION SIDE |
| 16 | 0 | 0 | 0 | SEPARATION SIDE | 0 | 0 | 0 | SEPARATION SIDE | 0 | 0 | 0 | SEPARATION SIDE |
| 17 | 50 | 5 | 0 | SEPARATION SIDE | 50 | 5 | 0 | SEPARATION SIDE | 50 | 5 | 0 | SEPARATION SIDE |
| 18 | 50 | 5 | 0 | SEPARATION SIDE | 50 | 5 | 0 | SEPARATION SIDE | 50 | 5 | 0 | SEPARATION SIDE |
| 19 | 50 | 5 | 0 | SEPARATION SIDE | 50 | 5 | 0 | SEPARATION SIDE | 50 | 5 | 0 | SEPARATION SIDE |
| 20 | 0 | 0 | 0 | SEPARATION SIDE | 0 | 0 | 0 | SEPARATION SIDE | 0 | 0 | 0 | SEPARATION SIDE |
| 21 | 0 | 0 | 0 | SEPARATION SIDE | 50 | 5 | 0 | SEPARATION SIDE | 50 | 5 | 0 | SEPARATION SIDE |
| 22 | 0 | 0 | 0 | SEPARATION SIDE | 50 | 5 | 0 | SEPARATION SIDE | 50 | 5 | 0 | SEPARATION SIDE |
| 23 | 0 | 0 | 0 | SEPARATION SIDE | 50 | 5 | 0 | SEPARATION SIDE | 50 | 5 | 0 | SEPARATION SIDE |
| 24 | 0 | 0 | 10 | COMBUSTION SUPPORTING SIDE | 0 | 0 | 0 | SEPARATION SIDE | 0 | 0 | 0 | SEPARATION SIDE |
| 25 | 0 | 0 | 10 | COMBUSTION SUPPORTING SIDE | 0 | 0 | 0 | SEPARATION SIDE | 50 | 5 | 0 | SEPARATION SIDE |
| 26 | 0 | 0 | 10 | COMBUSTION SUPPORTING SIDE | 0 | 0 | 0 | SEPARATION SIDE | 50 | 5 | 0 | SEPARATION SIDE |
| 27 | 0 | 0 | 10 | COMBUSTION SUPPORTING SIDE | 0 | 0 | 0 | SEPARATION SIDE | 50 | 5 | 0 | SEPARATION SIDE |
| 28 | 0 | 0 | 0 | COMBUSTION SUPPORTING SIDE | 0 | 0 | 10 | COMBUSTION SUPPORTING SIDE | 0 | 0 | 0 | SEPARATION SIDE |
| 29 | 0 | 0 | 0 | COMBUSTION SUPPORTING SIDE | 0 | 0 | 10 | COMBUSTION SUPPORTING SIDE | 0 | 0 | 0 | SEPARATION SIDE |
| 30 | 0 | 0 | 0 | COMBUSTION SUPPORTING SIDE | 0 | 0 | 10 | COMBUSTION SUPPORTING SIDE | 0 | 0 | 0 | SEPARATION SIDE |
| 31 | 50 | 5 | 0 | SEPARATION SIDE | 0 | 0 | 10 | COMBUSTION SUPPORTING SIDE | 0 | 0 | 0 | SEPARATION SIDE |
| 32 | 50 | 5 | 0 | SEPARATION SIDE | 0 | 0 | 0 | COMBUSTION SUPPORTING SIDE | 0 | 0 | 10 | COMBUSTION SUPPORTING SIDE |

TABLE 1-continued

| | PE-CVD1 | | | | PE-CVD2 | | | | PE-CVD3 | | | |
|---|---|---|---|---|---|---|---|---|---|---|---|---|
| | GAS FLOW RATE(NL/min) | | | SWITCHING | GAS FLOW RATE(NL/min) | | | SWITCHING | GAS FLOW RATE(NL/min) | | | SWITCHING |
| TIME (MINUTE) | $H_2$ | $SiH_4$ | $NF_3$ | VALVE | $H_2$ | $SiH_4$ | $NF_3$ | VALVE | $H_2$ | $SiH_4$ | $NF_3$ | VALVE |
| 33 | 50 | 5 | 0 | SEPARATION SIDE | 0 | 0 | 0 | COMBUSTION SUPPORTING SIDE | 0 | 0 | 10 | COMBUSTION SUPPORTING SIDE |
| 34 | 0 | 0 | 0 | SEPARATION SIDE | 0 | 0 | 0 | COMBUSTION SUPPORTING SIDE | 0 | 0 | 10 | COMBUSTION SUPPORTING SIDE |
| 35 | 50 | 5 | 0 | SEPARATION SIDE | 50 | 5 | 0 | SEPARATION SIDE | 0 | 0 | 10 | COMBUSTION SUPPORTING SIDE |
| 36 | 50 | 5 | 0 | SEPARATION SIDE | 50 | 5 | 0 | SEPARATION SIDE | 0 | 0 | 0 | COMBUSTION SUPPORTING SIDE |
| 37 | 50 | 5 | 0 | SEPARATION SIDE | 50 | 5 | 0 | SEPARATION SIDE | 0 | 0 | 0 | COMBUSTION SUPPORTING SIDE |
| 38 | 0 | 0 | 0 | SEPARATION SIDE | 0 | 0 | 0 | SEPARATION SIDE | 0 | 0 | 0 | COMBUSTION SUPPORTING SIDE |
| 39 | 50 | 5 | 0 | SEPARATION SIDE | 50 | 5 | 0 | SEPARATION SIDE | 50 | 5 | 0 | SEPARATION SIDE |
| 40 | 50 | 5 | 0 | SEPARATION SIDE | 50 | 5 | 0 | SEPARATION SIDE | 50 | 5 | 0 | SEPARATION SIDE |
| 41 | 50 | 5 | 0 | SEPARATION SIDE | 50 | 5 | 0 | SEPARATION SIDE | 50 | 5 | 0 | SEPARATION SIDE |
| 42 | 0 | 0 | 0 | SEPARATION SIDE | 0 | 0 | 0 | SEPARATION SIDE | 0 | 0 | 0 | SEPARATION SIDE |
| 43 | 50 | 5 | 0 | SEPARATION SIDE | 50 | 5 | 0 | SEPARATION SIDE | 50 | 5 | 0 | SEPARATION SIDE |
| 44 | 50 | 5 | 0 | SEPARATION SIDE | 50 | 5 | 0 | SEPARATION SIDE | 50 | 5 | 0 | SEPARATION SIDE |
| 45 | 50 | 5 | 0 | SEPARATION SIDE | 50 | 5 | 0 | SEPARATION SIDE | 50 | 5 | 0 | SEPARATION SIDE |
| 46 | 0 | 0 | 0 | SEPARATION SIDE | 0 | 0 | 0 | SEPARATION SIDE | 0 | 0 | 0 | SEPARATION SIDE |
| 47 | 50 | 5 | 0 | SEPARATION SIDE | 50 | 5 | 0 | SEPARATION SIDE | 50 | 5 | 0 | SEPARATION SIDE |
| 48 | 50 | 5 | 0 | SEPARATION SIDE | 50 | 5 | 0 | SEPARATION SIDE | 50 | 5 | 0 | SEPARATION SIDE |
| 49 | 50 | 5 | 0 | SEPARATION SIDE | 50 | 5 | 0 | SEPARATION SIDE | 50 | 5 | 0 | SEPARATION |
| 50 | 0 | 0 | 0 | SEPARATION SIDE | 0 | 0 | 0 | SEPARATION SIDE | 0 | 0 | 0 | SEPARATION SIDE |
| 51 | 0 | 0 | 0 | SEPARATION SIDE | 50 | 5 | 0 | SEPARATION SIDE | 50 | 5 | 0 | SEPARATION SIDE |
| 52 | 0 | 0 | 0 | SEPARATION SIDE | 50 | 5 | 0 | SEPARATION SIDE | 50 | 5 | 0 | SEPARATION SIDE |
| 53 | 0 | 0 | 0 | SEPARATION SIDE | 50 | 5 | 0 | SEPARATION SIDE | 50 | 5 | 0 | SEPARATION SIDE |
| 54 | 0 | 0 | 10 | COMBUSTION SUPPORTING SIDE | 0 | 0 | 0 | SEPARATION SIDE | 0 | 0 | 0 | SEPARATION SIDE |
| 55 | 0 | 0 | 10 | COMBUSTION SUPPORTING SIDE | 0 | 0 | 0 | SEPARATION SIDE | 50 | 5 | 0 | SEPARATION SIDE |
| 56 | 0 | 0 | 10 | COMBUSTION SUPPORTING SIDE | 0 | 0 | 0 | SEPARATION SIDE | 50 | 5 | 0 | SEPARATION SIDE |
| 57 | 0 | 0 | 10 | COMBUSTION SUPPORTING SIDE | 0 | 0 | 0 | SEPARATION SIDE | 50 | 5 | 0 | SEPARATION SIDE |
| 58 | 0 | 0 | 0 | COMBUSTION SUPPORTING SIDE | 0 | 0 | 10 | COMBUSTION SUPPORTING SIDE | 0 | 0 | 0 | SEPARATION SIDE |
| 59 | 0 | 0 | 0 | COMBUSTION SUPPORTING SIDE | 0 | 0 | 10 | COMBUSTION SUPPORTING SIDE | 0 | 0 | 0 | SEPARATION SIDE |
| 60 | 0 | 0 | 0 | COMBUSTION SUPPORTING SIDE | 0 | 0 | 10 | COMBUSTION SUPPORTING SIDE | 0 | 0 | 0 | SEPARATION SIDE |
| 61 | HEREINAFTER, REPEAT OF ABOVE-DESCRIBED CYCLE | | | | 0 | 0 | 10 | COMBUSTION SUPPORTING SIDE | 0 | 0 | 0 | SEPARATION SIDE |

TABLE 1-continued

| TIME (MINUTE) | PE-CVD1 | | | | PE-CVD2 | | | | PE-CVD3 | | | |
|---|---|---|---|---|---|---|---|---|---|---|---|---|
| | GAS FLOW RATE(NL/min) | | | SWITCHING VALVE | GAS FLOW RATE(NL/min) | | | SWITCHING VALVE | GAS FLOW RATE(NL/min) | | | SWITCHING VALVE |
| | $H_2$ | $SiH_4$ | $NF_3$ | | $H_2$ | $SiH_4$ | $NF_3$ | | $H_2$ | $SiH_4$ | $NF_3$ | |
| 62 | | | | | 0 | 0 | 0 | COMBUSTION SUPPORTING SIDE | 0 | 0 | 10 | COMBUSTION SUPPORTING SIDE |
| 63 | | | | | 0 | 0 | 0 | COMBUSTION SUPPORTING SIDE | 0 | 0 | 10 | COMBUSTION SUPPORTING SIDE |
| 64 | | | | | 0 | 0 | 0 | COMBUSTION SUPPORTING SIDE | 0 | 0 | 10 | COMBUSTION SUPPORTING SIDE |
| 65 | | | | | HEREINAFTER, REPEAT OF ABOVE-DESCRIBED CYCLE | | | | 0 | 0 | 10 | COMBUSTION SUPPORTING SIDE |
| 66 | | | | | | | | | 0 | 0 | 0 | COMBUSTION SUPPORTING SIDE |
| 67 | | | | | | | | | 0 | 0 | 0 | COMBUSTION SUPPORTING SIDE |
| 68 | | | | | | | | | 0 | 0 | 0 | COMBUSTION SUPPORTING SIDE |
| | | | | | | | | | HEREINAFTER, REPEAT OF ABOVE-DESCRIBED CYCLE | | | |

TABLE 2

EXHAUST GAS TOTAL FLOW RATE, COMPOSITION

| TIME (MINUTE) | TOTAL FLOW RATE (NL/min) | $SiH_4$ CONCENTRATION (vol %) | $H_2$ CONCENTRATION (vol %) |
|---|---|---|---|
| 1 | 115 | 4.3 | 43.5 |
| 2 | 85 | 5.9 | 58.8 |
| 3 | 85 | 5.9 | 58.8 |
| 4 | 30 | 0.0 | 0.0 |
| 5 | 170 | 5.9 | 58.8 |
| 6 | 170 | 5.9 | 58.8 |
| 7 | 170 | 5.9 | 58.8 |
| 8 | 60 | 0.0 | 0.0 |
| 9 | 255 | 5.9 | 58.8 |
| 10 | 255 | 5.9 | 58.8 |
| 11 | 255 | 5.9 | 58.8 |
| 12 | 90 | 0.0 | 0.0 |
| 13 | 255 | 5.9 | 58.8 |
| 14 | 255 | 5.9 | 58.8 |
| 15 | 255 | 5.9 | 58.8 |
| 16 | 90 | 0.0 | 0.0 |
| 17 | 255 | 5.9 | 58.8 |
| 18 | 255 | 5.9 | 58.8 |
| 19 | 255 | 5.9 | 58.8 |
| 20 | 90 | 0.0 | 0.0 |
| 21 | 200 | 5.0 | 50.0 |
| 22 | 200 | 5.0 | 50.0 |
| 23 | 200 | 5.0 | 50.0 |
| 24 | 60 | 0.0 | 0.0 |
| 25 | 115 | 4.3 | 43.5 |
| 26 | 115 | 4.3 | 43.5 |
| 27 | 115 | 4.3 | 43.5 |
| 28 | 30 | 0.0 | 0.0 |
| 29 | 30 | 0.0 | 0.0 |
| 30 | 30 | 0.0 | 0.0 |
| 31 | 115 | 4.3 | 43.5 |
| 32 | 85 | 5.9 | 58.8 |
| 33 | 85 | 5.9 | 58.8 |
| 34 | 30 | 0.0 | 0.0 |
| 35 | 170 | 5.9 | 58.8 |
| 36 | 170 | 5.9 | 58.8 |
| 37 | 170 | 5.9 | 58.8 |
| 38 | 60 | 0.0 | 0.0 |
| 39 | 255 | 5.9 | 58.8 |
| 40 | 255 | 5.9 | 58.8 |
| 41 | 255 | 5.9 | 58.8 |
| 42 | 90 | 0.0 | 0.0 |
| 43 | 255 | 5.9 | 58.8 |
| 44 | 255 | 5.9 | 58.8 |
| 45 | 255 | 5.9 | 58.8 |
| 46 | 90 | 0.0 | 0.0 |
| 47 | 255 | 5.9 | 50.0 |
| 48 | 255 | 5.9 | 50.0 |
| 49 | 255 | 5.9 | 50.0 |
| 50 | 90 | 0.0 | 0.0 |
| 51 | 200 | 5.0 | 50.0 |
| 52 | 200 | 5.0 | 50.0 |
| 53 | 200 | 5.0 | 50.0 |
| 54 | 60 | 0.0 | 0.0 |
| 55 | 115 | 4.3 | 43.5 |
| 56 | 115 | 4.3 | 43.5 |
| 57 | 115 | 4.3 | 43.5 |
| 58 | 30 | 0.0 | 0.0 |
| 59 | 30 | 0.0 | 0.0 |
| 60 | 30 | 0.0 | 0.0 |

EXAMPLE 1-2

The same operation is performed as in Example 1-1 except that the non-permeation side back pressure valve 21b is opened by using the membrane separation module 20 having a membrane separation capacity of 4.8 L so that the non-permeation side pressure becomes a normal pressure, the permeation side pressure is adjusted to −70 kPa, and the temperature of the supply gas is set to 80° C. As a result, the concentration of $SiH_4$ of the separated permeation side gas is 0.052 vol %, and the hydrogen recovery rate is 63.3%, which is constant regardless of a change in exhaust gas flow rate.

EXAMPLE 1-3

Figure 5:
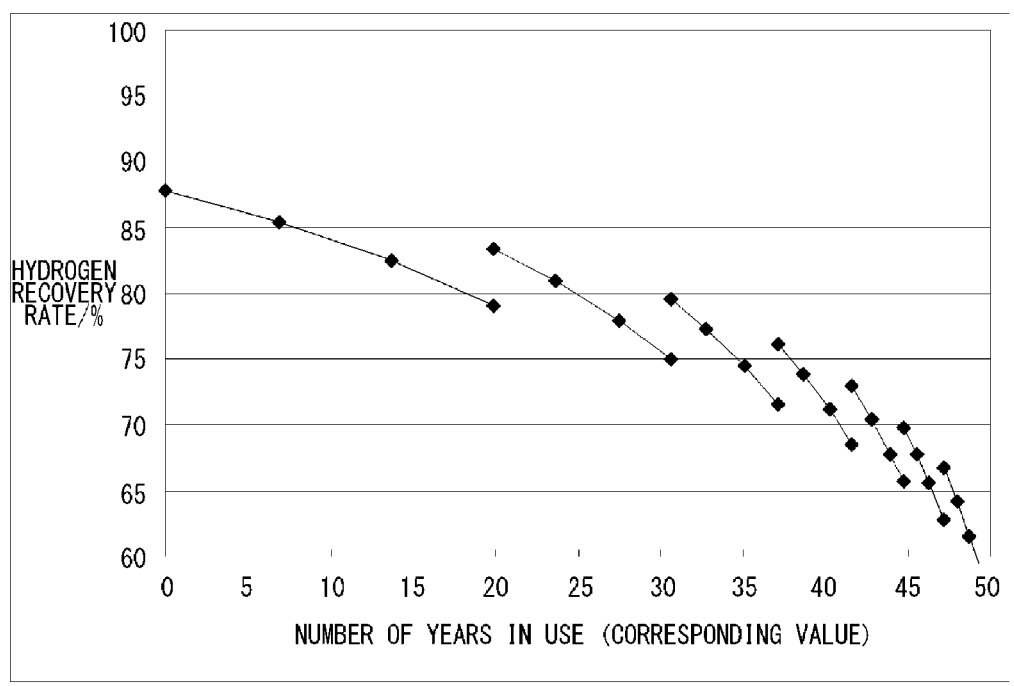
FIG. 5 is a diagram illustrating a monitored result of a change in hydrogen recovery rate with respect to the number of years in use (corresponding value) when the exhaust gas treatment system is operated so as to satisfy the equation (1-2) ($C_1=0.5$) in a state where the condition of Example 1-2 is set as an initial condition except that the pressure is adjusted to 50 kPaG by a non-permeation side back pressure valve.

FIG. 5 is a diagram illustrating a monitored result of a change in hydrogen recovery rate with respect to the number of years in use (corresponding value) when the exhaust gas treatment system is operated so as to satisfy the equation (1-2) ($C_1$=0.5) in a state where the condition of Example 1-2 is set as an initial condition except that the pressure is adjusted to 50 kPaG by a non-permeation side back pressure valve 21*b*. Furthermore, the number of years in use (corresponding value) is a value which is obtained by converting the operation time of the acceleration test into the number of real years. The accelerated degradation test was performed so that the total flow rate of the supplied mixed gas is set to 50 times that of the normal test and the supplied monosilane gas concentration and the supplied nitrogen gas concentration are constant. From this result, it is found that the exhaust gas treatment system may be operated for a long period of time while maintaining the hydrogen recovery rate by operating the exhaust gas treatment system so as to satisfy the equation (1-2).

EXAMPLE 1-4

Figure 6:
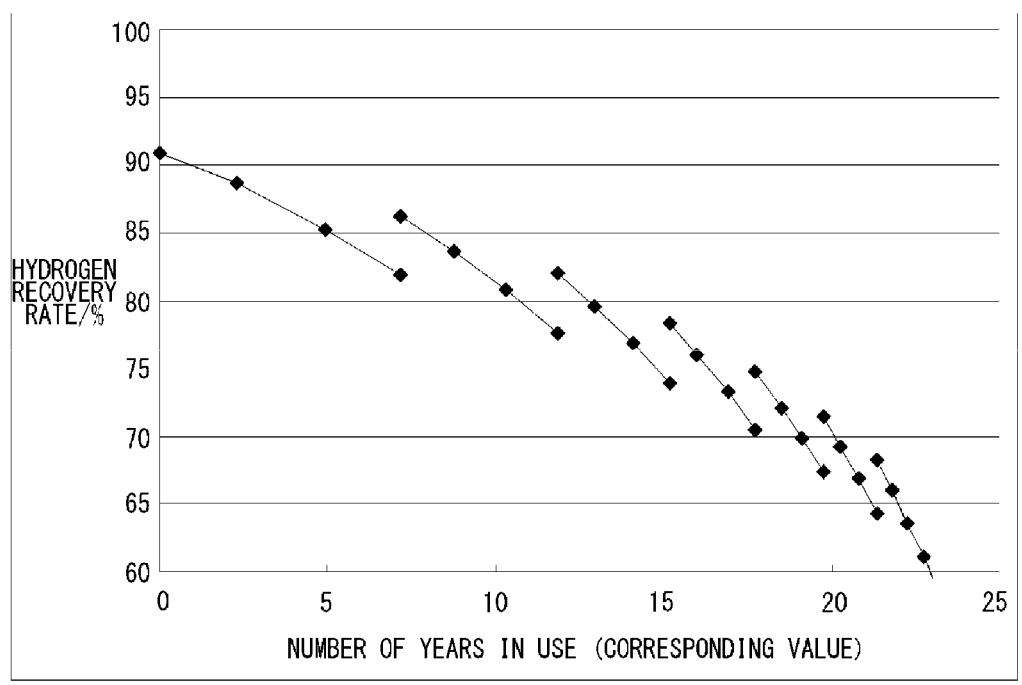
FIG. 6 is a diagram illustrating a monitored result of a change in hydrogen recovery rate with respect to the number of years in use (corresponding value) when the exhaust gas treatment system is operated so as to satisfy the equation (1-3) ($C_2=1.0$) in a state where the condition of Example 1-1 is set as an initial condition.

FIG. 6 is a diagram illustrating a monitored result of a change in hydrogen recovery rate with respect to the number of years in use (corresponding value) when the exhaust gas treatment system is operated so as to satisfy the equation (1-3) ($C_2$=1.0) in a state where the condition of Example 1-1 is set as an initial condition. From this result, it is found that the exhaust gas treatment system may be operated for a long period of time while maintaining the hydrogen recovery rate by operating the exhaust gas treatment system so as to satisfy the equation (1-3).

EXAMPLE 1-5

Figure 7:
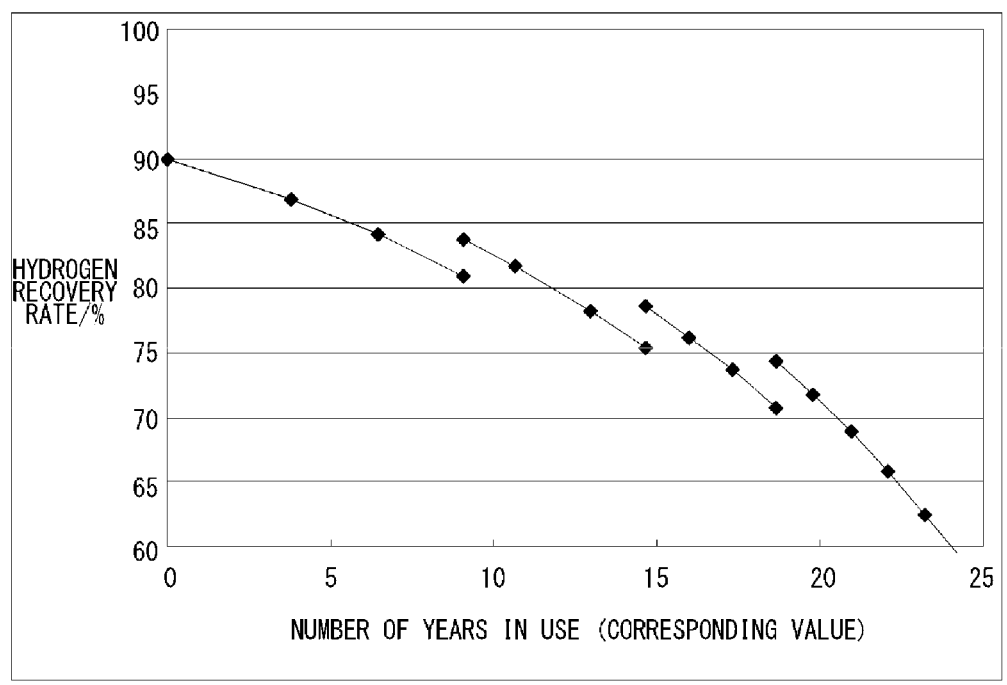
FIG. 7 is a diagram illustrating a monitored result of a change in hydrogen recovery rate with respect to the number of years in use (corresponding value) when the exhaust gas treatment system is operated so as to satisfy the equation (1-4) ($C_3=1.0$) in a state where an initial condition is set as in Example 1-1 except that nitrogen of 30 NL/min is added in a third element gas addition unit using a membrane separation module having a membrane separation capacity of 3.0 L.

FIG. 7 is a diagram illustrating a monitored result of a change in hydrogen recovery rate with respect to the number of years in use (corresponding value) when the exhaust gas treatment system is operated so as to satisfy the equation (1-4) ($C_3$=1.0) in a state where an initial condition is set as in Example 1-1 except that nitrogen of 30 NL/min is added in a third element gas addition unit 10 using a membrane separation module having a membrane separation capacity of 3.0 L. From this result, it is found that the exhaust gas treatment system may be operated for a long period of time while maintaining the hydrogen recovery rate by operating the exhaust gas treatment system so as to satisfy the equation (1-4).

COMPARATIVE EXAMPLE 1-1

Figure 8:
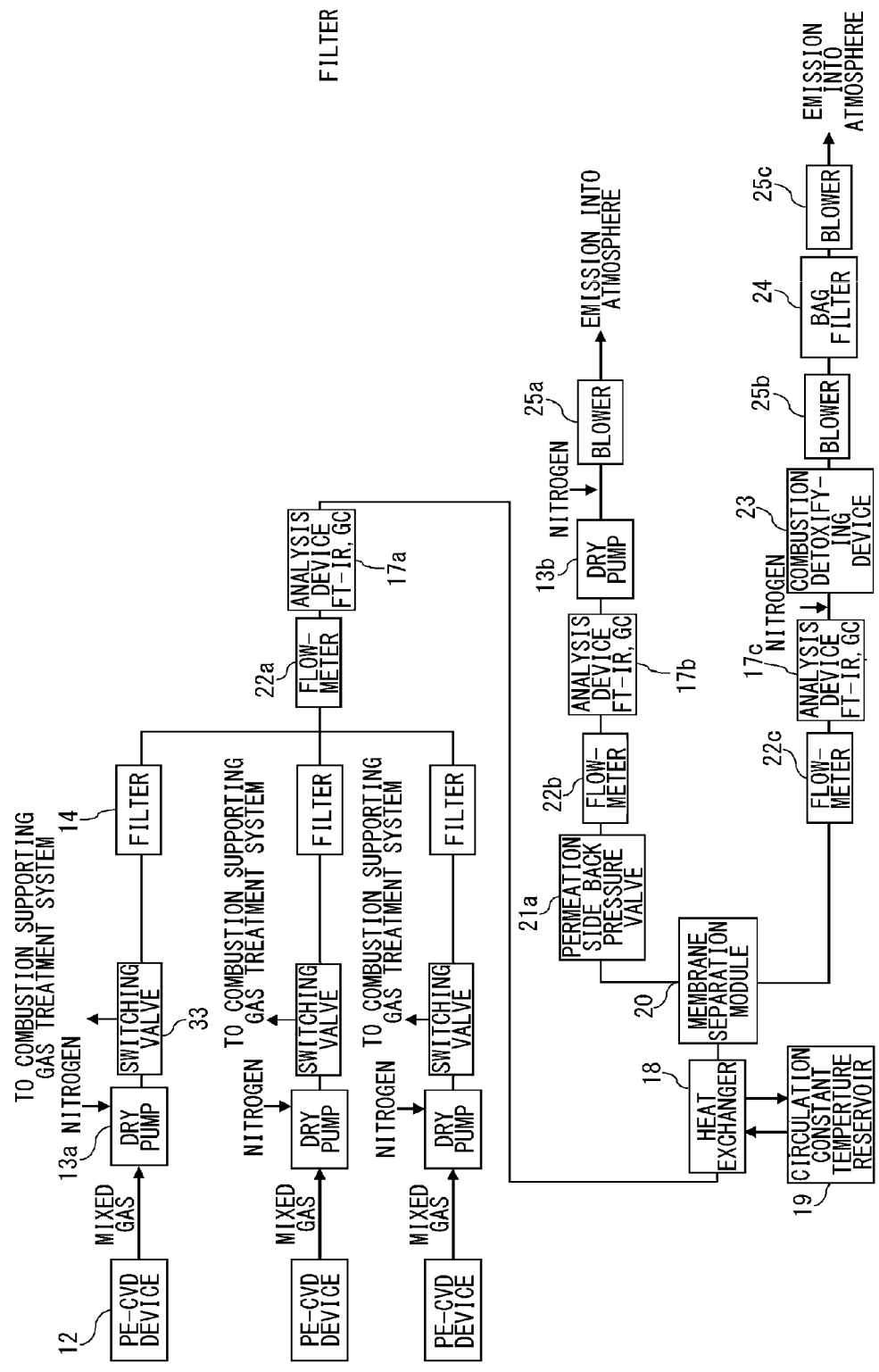
FIG. 8 is a system diagram illustrating a configuration of an exhaust gas treatment system according to Comparative example 1-1.

FIG. 8 is a system diagram illustrating a configuration of an exhaust gas treatment system according to Comparative example 1-1. The exhaust gas treatment system according to Comparative example 1-1 illustrated in FIG. 8 is not provided with the compressor, the hermetic tank, the accumulation valve, and the mass flow controller. The CVD device is connected to the exhaust gas treatment system, the operation of the exhaust gas treatment system is performed on the same condition as that of Example 1-1, and a changing exhaust gas is directly circulated to the membrane separation device. As a result, the concentration of $SiH_4$ of the separated permeation side gas and the hydrogen recovery rate change as illustrated in Table 3 in response to a change in exhaust gas flow rate. Further, the concentration of $SiH_4$ of the permeation side gas increases to 0.044 vol % at maximum, and the dilution rate for the emission to the atmosphere needs to be 2.3 times that of Example 1-1.

TABLE 3

| | COMPARATIVE EXAMPLE 1-1 | | | COMPARATIVE EXAMPLE 1-2 | | |
|---|---|---|---|---|---|---|
| TIME (MINUTE) | PERMEATION SIDE GAS FLOW RATE (NL/min) | PERMEATION SIDE $SiH_4$ CONCENTRATION (vol %) | HYDROGEN RECOVERY RATE (%) | PERMEATION SIDE GAS FLOW RATE (NL/min) | PERMEATION SIDE $SiH_4$ CONCENTRATION (vol %) | HYDROGEN RECOVERY RATE (%) |
| 1 | 57.1 | 0.023 | 95.6 | 41.1 | 0.013 | 74.0 |
| 2 | 58.3 | 0.044 | 99.7 | 48.6 | 0.019 | 90.3 |
| 3 | 58.3 | 0.044 | 99.7 | 48.6 | 0.019 | 90.3 |
| 4 | 12.6 | 0.000 | 0.0 | 6.3 | 0.000 | 0.0 |
| 5 | 97.1 | 0.019 | 90.3 | 63.2 | 0.012 | 60.4 |
| 6 | 97.1 | 0.019 | 90.3 | 63.2 | 0.012 | 60.4 |
| 7 | 97.1 | 0.019 | 90.3 | 63.2 | 0.012 | 60.4 |
| 8 | 12.6 | 0.000 | 0.0 | 6.3 | 0.000 | 0.0 |
| 9 | 116.7 | 0.014 | 73.8 | 67.7 | 0.010 | 43.4 |
| 10 | 116.7 | 0.014 | 73.8 | 67.7 | 0.010 | 43.4 |
| 11 | 116.7 | 0.014 | 73.8 | 67.7 | 0.010 | 43.4 |
| 12 | 12.6 | 0.000 | 0.0 | 6.3 | 0.000 | 0.0 |
| 13 | 116.7 | 0.014 | 73.8 | 67.7 | 0.010 | 43.4 |
| 14 | 116.7 | 0.014 | 73.8 | 67.7 | 0.010 | 43.4 |
| 15 | 116.7 | 0.014 | 73.8 | 67.7 | 0.010 | 43.4 |
| 16 | 12.6 | 0.000 | 0.0 | 6.3 | 0.000 | 0.0 |
| 17 | 116.7 | 0.014 | 73.8 | 67.7 | 0.010 | 43.4 |
| 18 | 116.7 | 0.014 | 73.8 | 67.7 | 0.010 | 43.4 |
| 19 | 116.7 | 0.014 | 73.8 | 67.7 | 0.010 | 43.4 |
| 20 | 12.6 | 0.000 | 0.0 | 6.3 | 0.000 | 0.0 |
| 21 | 89.3 | 0.015 | 81.6 | 55.0 | 0.011 | 51.7 |
| 22 | 89.3 | 0.015 | 81.6 | 55.0 | 0.011 | 51.7 |
| 23 | 89.3 | 0.015 | 81.6 | 55.0 | 0.011 | 51.7 |
| 24 | 12.6 | 0.000 | 0.0 | 6.3 | 0.000 | 0.0 |
| 25 | 57.1 | 0.023 | 95.6 | 41.1 | 0.013 | 74.0 |

TABLE 3-continued

| | COMPARATIVE EXAMPLE 1-1 | | | COMPARATIVE EXAMPLE 1-2 | | |
|---|---|---|---|---|---|---|
| TIME (MINUTE) | PERMEATION SIDE GAS FLOW RATE (NL/min) | PERMEATION SIDE $SiH_4$ CONCENTRATION (vol %) | HYDROGEN RECOVERY RATE (%) | PERMEATION SIDE GAS FLOW RATE (NL/min) | PERMEATION SIDE $SiH_4$ CONCENTRATION (vol %) | HYDROGEN RECOVERY RATE (%) |
| 26 | 57.1 | 0.023 | 95.6 | 41.1 | 0.013 | 74.0 |
| 27 | 57.1 | 0.023 | 95.6 | 41.1 | 0.013 | 74.0 |
| 28 | 12.6 | 0.000 | 0.0 | 6.3 | 0.000 | 0.0 |
| 29 | 12.6 | 0.000 | 0.0 | 6.3 | 0.000 | 0.0 |
| 30 | 12.6 | 0.000 | 0.0 | 6.3 | 0.000 | 0.0 |
| 31 | 57.1 | 0.023 | 95.6 | 41.1 | 0.013 | 74.0 |
| 32 | 58.3 | 0.044 | 99.7 | 48.6 | 0.019 | 90.3 |
| 33 | 58.3 | 0.044 | 99.7 | 48.6 | 0.019 | 90.3 |
| 34 | 12.6 | 0.000 | 0.0 | 6.3 | 0.000 | 0.0 |
| 35 | 97.1 | 0.019 | 90.3 | 63.2 | 0.012 | 60.4 |
| 36 | 97.1 | 0.019 | 90.3 | 63.2 | 0.012 | 60.4 |
| 37 | 97.1 | 0.019 | 90.3 | 63.2 | 0.012 | 60.4 |
| 38 | 12.6 | 0.000 | 0.0 | 6.3 | 0.000 | 0.0 |
| 39 | 116.7 | 0.014 | 73.8 | 67.7 | 0.010 | 43.4 |
| 40 | 116.7 | 0.014 | 73.8 | 67.7 | 0.010 | 43.4 |
| 41 | 116.7 | 0.014 | 73.8 | 67.7 | 0.010 | 43.4 |
| 42 | 12.6 | 0.000 | 0.0 | 6.3 | 0.000 | 0.0 |
| 43 | 116.7 | 0.014 | 73.8 | 67.7 | 0.010 | 43.4 |
| 44 | 116.7 | 0.014 | 73.8 | 67.7 | 0.010 | 43.4 |
| 45 | 116.7 | 0.014 | 73.8 | 67.7 | 0.010 | 43.4 |
| 46 | 12.6 | 0.000 | 0.0 | 6.3 | 0.000 | 0.0 |
| 47 | 116.7 | 0.014 | 73.8 | 67.7 | 0.010 | 43.4 |
| 48 | 116.7 | 0.014 | 73.8 | 67.7 | 0.010 | 43.4 |
| 49 | 116.7 | 0.014 | 73.8 | 67.7 | 0.010 | 43.4 |
| 50 | 12.6 | 0.000 | 0.0 | 6.3 | 0.000 | 0.0 |
| 51 | 89.3 | 0.015 | 81.6 | 55.0 | 0.011 | 51.7 |
| 52 | 89.3 | 0.015 | 81.6 | 55.0 | 0.011 | 51.7 |
| 53 | 89.3 | 0.015 | 81.6 | 55.0 | 0.011 | 51.7 |
| 54 | 12.6 | 0.000 | 0.0 | 6.3 | 0.000 | 0.0 |
| 55 | 57.1 | 0.023 | 95.6 | 41.1 | 0.013 | 74.0 |
| 56 | 57.1 | 0.023 | 95.6 | 41.1 | 0.013 | 74.0 |
| 57 | 57.1 | 0.023 | 95.6 | 41.1 | 0.013 | 74.0 |
| 58 | 12.6 | 0.000 | 0.0 | 6.3 | 0.000 | 0.0 |
| 59 | 12.6 | 0.000 | 0.0 | 6.3 | 0.000 | 0.0 |
| 60 | 12.6 | 0.000 | 0.0 | 6.3 | 0.000 | 0.0 |

COMPARATIVE EXAMPLE 1-2

The operation is performed with the same configuration and the same condition as those of Comparative example 1-1 except that the membrane separation capacity of the exhaust gas treatment system is set to 1.2 L. As a result, the concentration of $SiH_4$ of the permeation side gas may be decreased as illustrated in Table 3, but the hydrogen recovery rate decreases.

COMPARATIVE EXAMPLE 1-3

Figure 9:
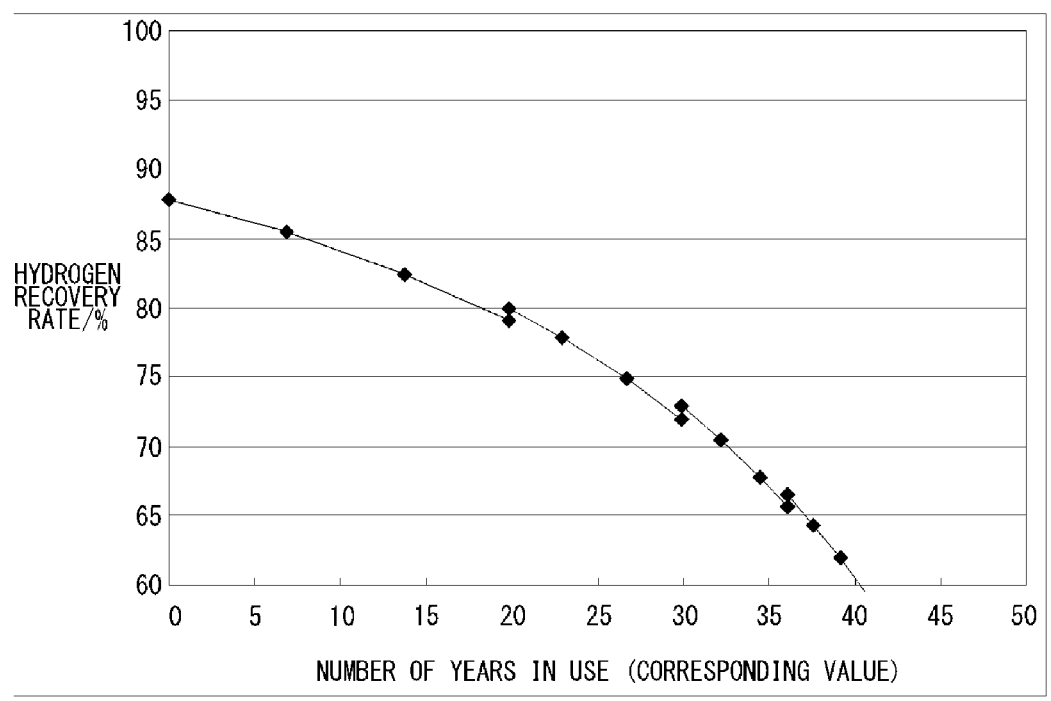
FIG. 9 is a diagram illustrating a monitored result of a change in hydrogen recovery rate with respect to the number of years in use (corresponding value) when the exhaust gas treatment system is operated so as not to satisfy the equation (1-2) ($C_1=0.1$) in a state where the condition of Example 1-1 is set as an initial condition.

FIG. 9 is a diagram illustrating a monitored result of a change in hydrogen recovery rate with respect to the number of years in use (corresponding value) when the exhaust gas treatment system is operated so as not to satisfy the equation (1-2) ($C_1$=0.1) in a state where the condition of Example 1-1 is set as an initial condition. From this result, it is found that the hydrogen recovery rate decreases in a short period of time when the exhaust gas treatment system is operated so as not to satisfy the equation (1-2).

COMPARATIVE EXAMPLE 1-4

Figure 10:
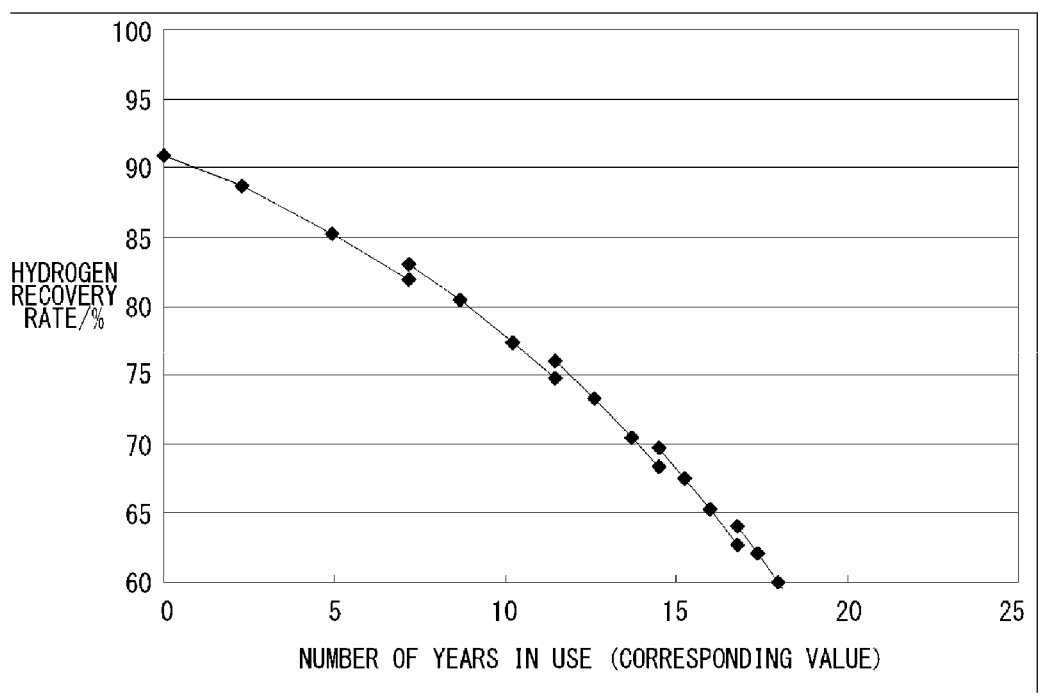
FIG. 10 is a diagram illustrating a monitored result of a change in hydrogen recovery rate with respect to the number of years in use (corresponding value) when the exhaust gas treatment system is operated so as not to satisfy the equation (1-3) ($C_2=0.25$) in a state where the condition of Example 1-2 is set as an initial condition.

FIG. 10 is a diagram illustrating a monitored result of a change in hydrogen recovery rate with respect to the number of years in use (corresponding value) when the exhaust gas treatment system is operated so as not to satisfy the equation (1-3) ($C_2$=0.25) in a state where the condition of Example 1-2 is set as an initial condition. From this result, it is found that the hydrogen recovery rate decreases in a short period of time when the exhaust gas treatment system is operated so as not to satisfy the equation (1-3).

COMPARATIVE EXAMPLE 1-5

Figure 11:
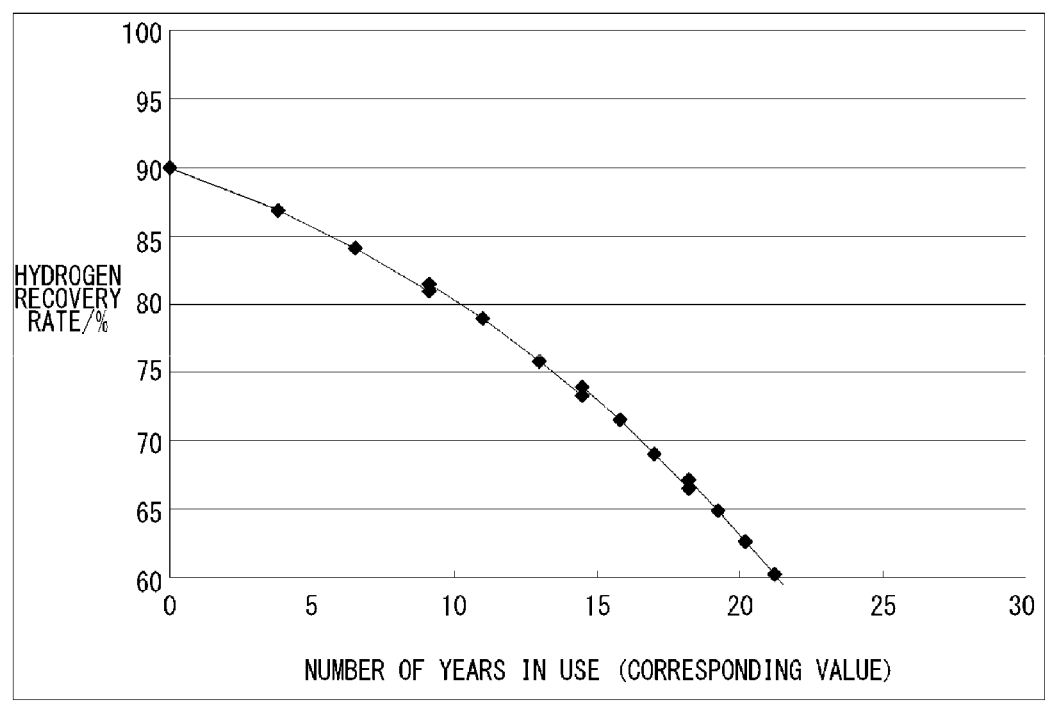
FIG. 11 is a diagram illustrating a monitored result in a change in hydrogen recovery rate with respect to the number of years in use (corresponding value) when the exhaust gas treatment system is operated so as not to satisfy the equation (1-4) ($C_3=0.2$) in a state where an initial condition is set as in Example 1-1 except that a membrane separation module having a membrane separation capacity of 3.0 L is used.

FIG. 11 is a diagram illustrating a monitored result of a change in hydrogen recovery rate with respect to the number of years in use (corresponding value) when the exhaust gas treatment system is operated so as not to satisfy the equation (1-4) ($C_3$=0.2) in a state where the initial condition is set as in Example 1-1 except that nitrogen of 30 NL/min is added by the third element gas addition unit 10 using the membrane separation module having a membrane separation capacity of 3.0 L. From this result, it is found that the hydrogen recovery rate decreases in a short period of time when the exhaust gas treatment system is operated so as not to satisfy the equation (1-4).

(Second Embodiment)

Figure 12:
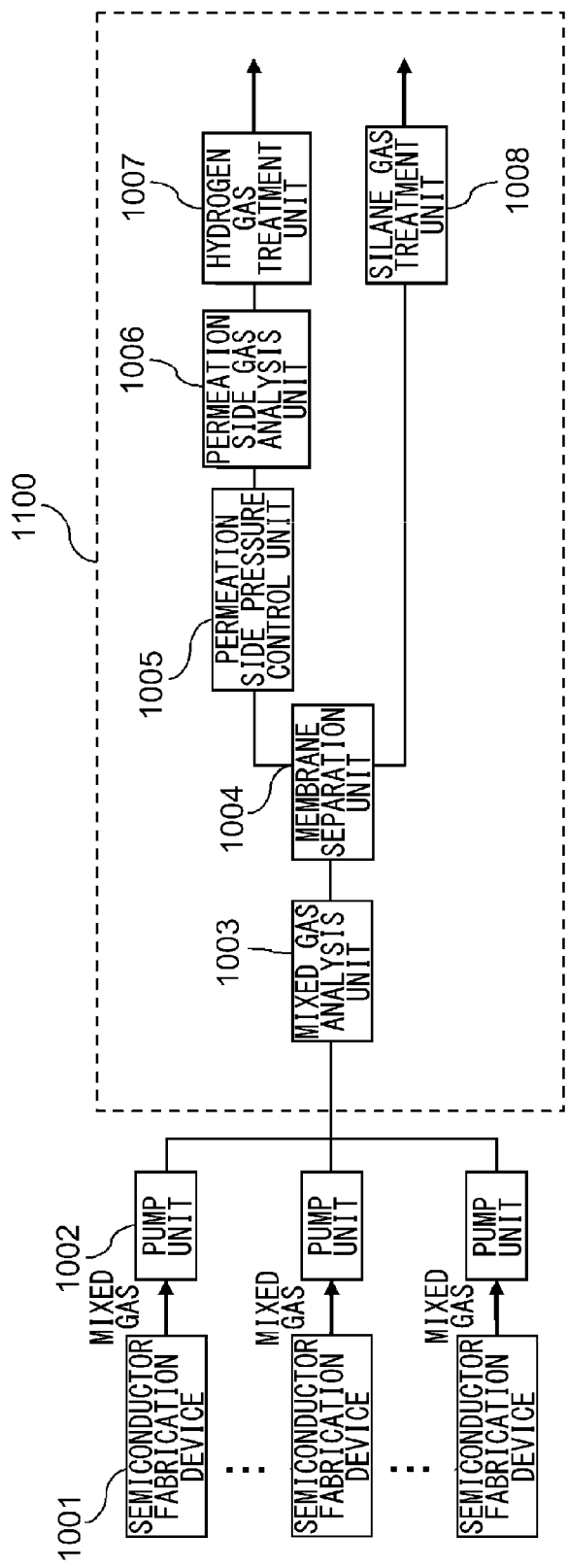
FIG. 12 is a system diagram illustrating a schematic example of an exhaust gas treatment system of a second embodiment.
Figure 13:
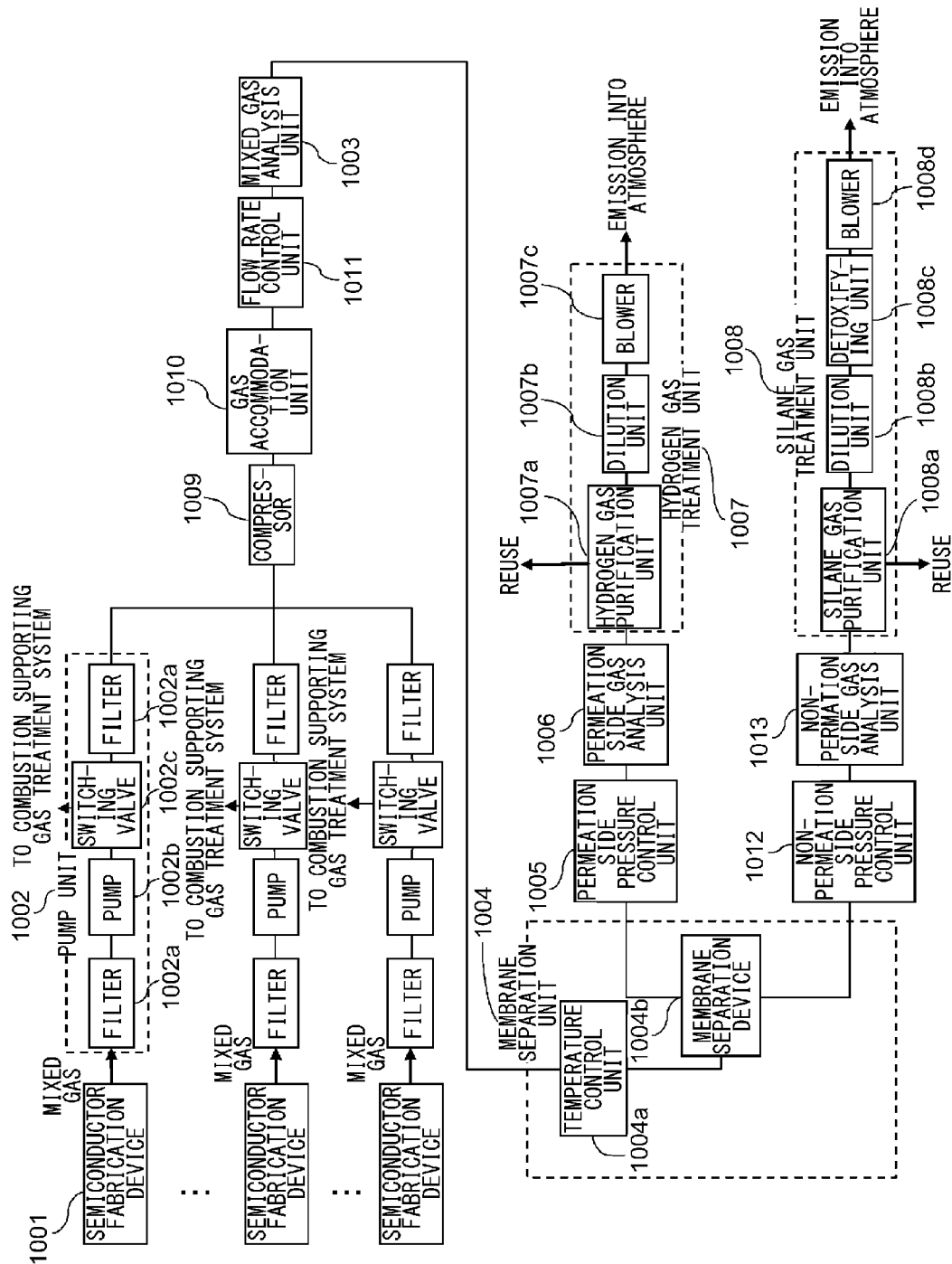
FIG. 13 is a system diagram more specifically illustrating a configuration of the exhaust gas treatment system according to the second embodiment.
Figure 14:
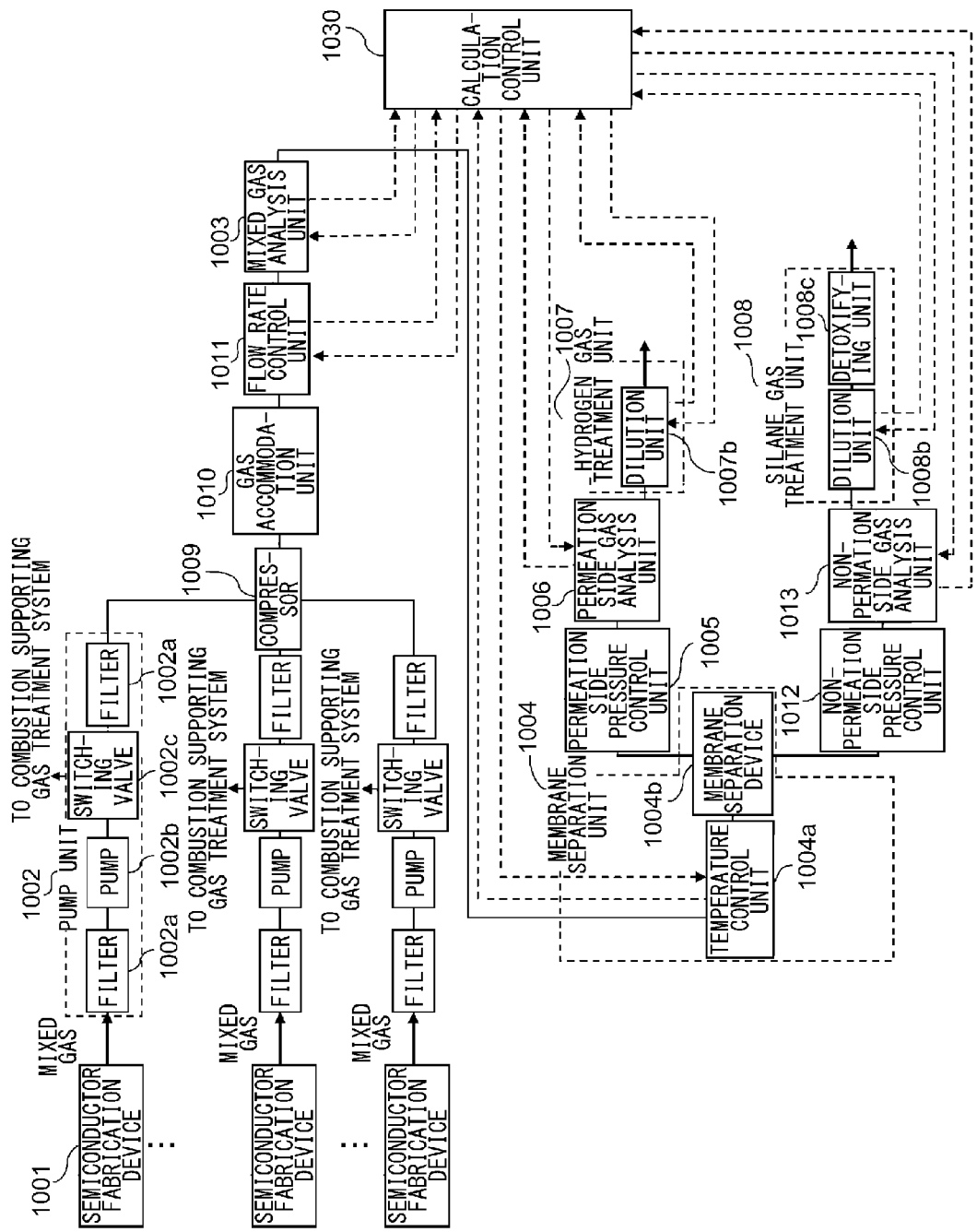
FIG. 14 is a system diagram illustrating an example of data processing of the respective components of the exhaust gas treatment system according to the second embodiment.

FIGS. 12 and 13 are system diagrams illustrating a schematic example of an exhaust gas treatment system according to the embodiment. FIG. 14 is a system diagram illustrating an example of data processing of the respective components of the exhaust gas treatment system according to the second embodiment. As illustrated in FIG. 12, an exhaust gas treatment system 1100 according to the embodiment includes a mixed gas analysis unit 1003 which measures a flow rate and a concentration of hydrogen and monosilane of a mixed gas containing at least the hydrogen and the monosilane discharged from a semiconductor fabrication equipment 1001 through a pump 1002, a membrane separation unit 1004 which separates the monosilane and hydrogen from the mixed gas, a permeation side pressure control unit 1005 which controls a permeation side pressure of a membrane separation unit 1004, a permeation side gas analysis unit 1006 which measures a flow rate and a concentration of the hydrogen and the monosilane of the permeation side gas separated by the membrane separation unit 1004, a hydrogen gas treatment unit 1007 which treats the hydrogen separated by the membrane separation unit 1004, and a silane gas treatment unit 1008 which treats the monosilane separated by the membrane separation unit 1004.

The semiconductor fabrication equipment 1001 is not particularly limited, but a plasma CVD device or the like which forms a film by thin-film silicon used in a solar cell may be exemplified.

The composition of the mixed gas discharged from the semiconductor fabrication equipment 1001 is not particularly limited, but for example, contained are monosilane which needs to be detoxified, hydrogen which does not need to be detoxified, nitrogen, argon, and a small amount of impurities. As the small amount of impurities, high-order silane including plural Si such as disilane or trisilane, $PH_3$, and $B_2H_6$ (which are respectively 0.001 to 1%) may be exemplified.

The pump unit 1002 suctions the mixed gas discharged from the semiconductor fabrication equipment 1001, and sends the mixed gas to the mixed gas analysis unit 1003 of the rear stage. The type of pump to be used is not particularly limited, but a dry pump is used in the semiconductor fabrication equipment in many cases. The dry pump may introduce a purging gas for the purpose of maintaining air-tightness, preventing unnecessary deposited material, preventing the corrosion inside the pump, and improving the emission performance. The purging gas is not particularly limited, but an inert gas such as nitrogen or argon is used in many cases. Further, even the introduction amount of the purging gas is not particularly limited, but in general, the introduction amount is 10 to 50 NL/min for each pump.

Further, as illustrated in FIG. 13, a filter 1002a may be provided at the front stage and/or the rear stage of a pump 1002b. In particular, when a comparatively large amount of fine particles such as high-order silane exist in the exhaust gas, it is desirable to provide the filter 1002a. The filter 1002a is a fine particle capturing filter which selectively removes fine particles such as high-order silane contained in the mixed gas. The filter to be used is not particularly limited, but a vortex filter or the like may be used.

Further, in the semiconductor fabrication equipment 1001, chemical cleaning may be performed so as to remove a deposited material produced inside a chamber due to the film forming. In the chemical cleaning, it is general to perform a plasma treatment under the introduction of a gas such as $NF_3$ or $F_2$ so as to remove a silicon thin film deposited in the chamber. However, since such a gas has a combustion supporting property, there is a need to prevent the gas from contacting a combustible gas such as hydrogen or monosilane, and hence it is desirable to install a switching valve 1002c in rear of the pump 1002b as in a case of FIG. 13. Accordingly, when the exhaust gas of the chemical cleaning comes out, a combustion supporting gas treatment system is selected, so that such an exhaust gas is prevented from being mixed with a treatment line of a silane gas. Furthermore, in the switching valve 1002c, such a mechanism may be built in the pump.

The mixed gas analysis unit 1003 and the permeation side gas analysis unit 1006 are one of the hydrogen recovery rate acquisition units, and are provided so as to measure at least the flow rates of the mixed gas and the permeation side gas separated by the membrane separation unit and the concentration of the hydrogen and the monosilane of the permeation side gas. In the gas analysis units, the method is not particularly limited if the flow rate of the gas and the concentration of the hydrogen and the monosilane may be measured. For example, a general dry type or wet type flowmeter may be used for the flow rate. Further, in the measurement of the concentration of the hydrogen and the monosilane, an FT-IR with a gas circulation type sample cell, an on-line type gas chromatograph, or the like may be used.

From the measurement result, the recovery rate (the hydrogen recovery rate) of the hydrogen gas may be calculated according to Equation (2-1).

$$\text{Hydrogen recovery rate}(\%) = 100 \times ((A/100) \times B))/((C/100) \times D) \qquad \text{Equation (2-1)}$$

Here, A indicates the concentration of the hydrogen (permeation side hydrogen concentration) (vol %) of the permeation side gas, B indicates the flow rate of the permeation side gas (permeation side total gas flow rate) (L/min), C indicates the concentration of the hydrogen (supply side hydrogen concentration) (vol %) of the mixed gas supplied to the membrane separation device, and D indicates the flow rate (supply side total gas flow rate) (L/min) of the mixed gas supplied to the membrane separation device.

As illustrated in FIG. 13, the membrane separation unit 1004 includes a temperature control unit 1004a which controls a temperature of the mixed gas supplied to a membrane separation device 1004b and the membrane separation device 1004b.

The temperature control unit 1004a is not particularly limited if a function of cooling or heating the mixed gas is provided, but an electric heater, various heat exchangers, or the like may be exemplified.

The membrane separation device 1004b is a membrane through which hydrogen selectively permeates. There is no particular limitation if metal elements, for example, palladium, nickel, and the like reacting with monosilane are not contained as a main element, and various semipermeable membranes may be exemplified. The semipermeable membrane includes, for example, a dense layer through which hydrogen selectively permeates and a porous base material which supports the dense layer. As the shape of the semipermeable membrane, a flat membrane, a spiral membrane, and a hollow fiber membrane may be exemplified. Among these, the hollow fiber membrane is more desirable.

As the material used in the dense layer, polyimide, polysiloxane, polysilazane, acrylonitrile, polyester, cellulose polymer, polysulfone, polyalkylene glycol, polyethylene, polybutadiene, polystyrene, polyvinylhalide, polyvinylidene halide, polycarbonate, and block copolymers having several repeating units of these may be exemplified.

As the material used in the base material, an inorganic material such as glass, ceramic, and sintered metal and a porous organic material may be exemplified. As the porous organic material, polyether, polyacrylonitrile, polyether, poly (arylene oxide), polyetherketone, polysulfide, polyethylene, polypropylene, polybutene, polyvinyl, and the like may be exemplified.

Next, the permeation side pressure control unit 1005 and a non-permeation side pressure control unit 1012 are used to respectively control the permeation side pressure and the non-permeation side pressure of the membrane separation device 1004*b*. When the pressure of the mixed gas supplied to the membrane separation device 1004*b* is low so as to be about the atmospheric pressure, a pressure control device such as a back pressure valve and a dry pump causing the permeation side of the membrane separation device 1004*b* to be a vacuum of the atmospheric pressure or less are provided in the permeation side pressure control unit 1005 so as to ensure a sufficient differential pressure with respect to a supply pressure and to control the permeation side pressure at a constant value. When the pressure of the mixed gas supplied to the membrane separation device 1004*b* is sufficiently high (a pressure increasing unit is provided in the flow rate control unit), the permeation side pressure control unit 1005 and the non-permeation side pressure control unit 1012 are respectively provided with a device such as a back pressure valve which maintains a constant pressure, and the non-permeation side pressure and the permeation side pressure of the membrane separation device 1004*b* are controlled at a constant value.

The flow rate, the pressure, and the temperature of the mixed gas supplied to the membrane separation device 1004*b*, the concentration of the monosilane gas, and the non-permeation side pressure and the permeation side pressure of the membrane separation device 1004*b* are not particularly limited. For example, as the flow rate, the flow rate is 5 NL/min to 500 NL/min with respect to the capacity of 1 L of the membrane separation device, and is desirably 10 NL/min to 100 NL/min. As the pressure, −90 kPaG to 1.0 MPaG is desirable. As the temperature, about −20° C. to 100° C. is desirable. As the concentration of the monosilane gas, 30 vol % or less, desirably 20 vol % or less, more desirably, 10 vol % or less is desirable. As the non-permeation side pressure of the membrane separation device 1004*b*, −90 kPaG to 0.85 MPaG is desirable. As the permeation side pressure, −100 kPaG to 0.9 MPaG is desirable.

Here, the capacity of the membrane separation device indicates the volume of the portion in which the separation membrane is sufficiently charged inside the membrane separation device.

In fact, the membrane separation conditions are closely concerned with each other. For example, in a case of the membrane separation capacity of 1 L, the supply flow rate to the membrane separation device is desirably 20 NL/min to 50 NL/min, the concentration of the monosilane gas is desirably 10 vol % or less, the pressure is desirably the atmospheric pressure or more, the temperature is desirably 10° C. to 40° C., the permeation side pressure of the membrane separation device is desirably −100 kPaG to −60 kPaG.

The respective gases separated by the membrane separation device 1004*b* are sent to the hydrogen gas treatment unit 1007 and the silane gas treatment unit 1008. In the hydrogen gas treatment unit 1007, the simply collected hydrogen is used for a combustion treatment or fuel. For example, as illustrated in FIG. 13, the separated gas may be diluted by a dilution unit 1007*b* by nitrogen, air, or the like so that the concentration of the monosilane in the collected gas becomes the allowable concentration or less (5 ppmv or less) and may be discharged to the outside. Further, at the dilution time, it is desirable to dilute the hydrogen so that the concentration of the hydrogen becomes an explosion lower limit or less (4 vol % or less) from the viewpoint of safety. The dilution rate of the dilution unit 1007*b* is not particularly limited if at least the concentration of monosilane satisfies 5 ppmv or less. When the dilution rate is controlled based on a measurement result of a permeation side gas analysis unit 1006, the dilution rate may be effectively controlled without any consumption. The separated gas which is diluted by the dilution unit 1007*b* is discharged to the outside by a blower 1007*c*. Further, in order to reduce the concentration of monosilane in the collected gas, a mechanism (not illustrated) may be further provided which selectively detoxifies the monosilane. A detoxifying agent which selectively performs a detoxifying treatment is not particularly limited, but an oxidizing agent, an adsorbing agent, or the like may be exemplified. Further, a hydrogen gas purification unit 1007*a* may be provided so that the hydrogen is purified and used again.

Further, in the silane gas treatment unit 1008, for example, monosilane as a toxic gas is diluted by a dilution unit 1008*b* in accordance with the specification of the device of a detoxifying unit 1008*c* as a detoxifying device so as to be a predetermined concentration, and is introduced into the detoxifying unit 1008*c*, so that the monosilane is detoxified to be an allowable concentration or less and is discharged to the outside by the blower 1008*d*. Furthermore, a silane gas purification unit 1008*a* may be provided so that the monosilane is purified and used again.

Further, in the exhaust gas treatment system according to the embodiment, a non-permeation side gas analysis unit 1013 is provided so as to measure the flow rate of the non-permeation side monosilane rich gas separated by the membrane separation device 1004*b*, the concentration of the monosilane, and the like, which may be reflected to the operation condition of the silane gas treatment unit 1008 of the rear stage.

For example, when the collected monosilane is detoxified and emitted by the silane gas treatment unit 1008, there is a need to dilute the collected monosilane to become a predetermined concentration in accordance with the specification of the detoxifying device. However, when there is data of the non-permeation side gas analysis unit at this time, it is possible to prevent the monosilane from being uselessly diluted too much or prevent a problem occurring in the detoxifying device due to the insufficient dilution.

Further, when the silane gas treatment unit 1008 is provided with the silane gas purification unit 1008*a* and the monosilane gas is purified and used again, the non-permeation side gas analysis unit 1013 may be used to analyze a small amount of impurities in the collected monosilane by a gas chromatograph or the like other than the flow rate and the concentration of the monosilane. With such a configuration, when the condition of the optimal purification treatment is selected or the amount of impurities is too large, the purification treatment is not performed and the detoxifying treatment may be selected. At this time, it is desirable to provide a valve at the rear stage of the gas analysis unit so as to switch the detoxifying unit and the reuse line.

Further, when the operation condition of the semiconductor fabrication equipment, and particularly, the flow rate or the pressure largely changes or when the exhaust gases of plural semiconductor fabrication equipments having different operation conditions are collectively treated, as illustrated in FIG. 13, it is desirable to provide a compressor 1009, a gas accommodation unit 1010, and a flow rate control unit 1011 so as to control the flow rate of the mixed gas supplied to the membrane separation unit 1004 at a constant value.

The compressor 1009 is not particularly limited, but a diaphragm type compressor, a centrifugal compressor, an axial flow compressor, a reciprocating compressor, a twin screw compressor, a single screw compressor, a scroll compressor, a rotary compressor, and the like may be exemplified. Among these, the diaphragm type compressor is more desirable.

The operation condition of the compressor 1009 is not particularly limited, but it is desirable to perform the operation so that the temperature of the compressed mixed gas becomes equal to or lower than 200° C. which is a decomposition temperature of monosilane. That is, when it is supposed that the mixed gas discharged from the pump unit 1002 is compressed from normal pressure, it is desirable to operate the compressor so that the compression ratio becomes equal to or lower than 4.4.

The compressor configuration used in the compressor 1009 is not particularly limited, but in order to stably operate the compressor even when the flow rate of the mixed gas supplied to the compressor changes, it is desirable to have a configuration in which inverters are provided in parallel or a spillback type configuration in which the mixed gas once compressed by the compressor is returned to the suction side of the compressor again.

The gas accommodation unit 1010 is used to collect the mixed gas in a tank or the like having a sufficient capacity when the flow rate or the pressure of the mixed gas discharged from the semiconductor fabrication equipment 1001 through the pump unit 1002 is not stable or the exhaust gases from the plural semiconductor fabrication equipments 1001 is collectively treated. Accordingly, a change in flow rate and pressure of the mixed gas discharged from the respective semiconductor fabrication equipments 1001 is averaged, and the mixed gas having a constant flow rate and a constant pressure at all times is circulated to the membrane separation unit 1004. Further, a function of removing fine particles contained in the mixed gas may be provided by devising a structure.

The size of the tank used in the gas accommodation unit 1010 is not particularly limited. However, in a case of one semiconductor fabrication equipment, it is desirable that the size of the tank is the maximum flow rate of the equipment. Then, in a case where plural semiconductor fabrication equipments are collectively treated, it is desirable that the size of the tank is equal to or more than the sum of the maximum flow rates of the gases supplied to the respective semiconductor fabrication equipments.

The pressure inside the tank used in the gas accommodation unit 1010 is not particularly limited, but it is desirable that the pressure is 1 MPaG at maximum.

Further, when the operation of the equipment starts, it is desirable that the exhaust gas is supplied from the compressor 1009 to the gas accommodation unit 1010 and is accumulated in the gas accommodation unit 1010 while the outlet valve of the gas accommodation unit 1010 is closed. Accordingly, even when the flow rate of the exhaust gas of the semiconductor fabrication equipment largely changes, it is possible to maintain a pressure sufficient for maintaining the supply flow rate to the separation device to be constant and to increase the amount of a gas which may be accommodated in the gas accommodation unit 1010. Accordingly, it is possible to decrease the volume of the gas accommodation unit. Further, when a sufficient pressure is accumulated, the non-permeation side pressure of the membrane separation device may be set to be high, which is advantageous in operation due to a sufficient differential pressure with respect to the permeation side pressure.

The flow rate control unit 1011 is used to control the flow rate of the mixed gas at a constant value. The control method is not particularly limited, but it is desirable that the control method is not influenced by a change in pressure of the mixed gas supplied to the flow rate control unit 1011, for example, a mass flow controller or the like may be exemplified.

In the embodiment, the degradation state of the membrane separation device 1004b may be recognized by monitoring the hydrogen recovery rate calculated by the hydrogen recovery rate acquisition unit. Accordingly, the operation may be performed while maintaining the high hydrogen recovery rate at all times by controlling the permeation side pressure of the membrane separation device 1004b or the temperature of the mixed gas supplied to the membrane separation device 1004b according to the following equation (2-2) and equation (2-3) with the degradation in the hydrogen recovery rate.

Furthermore, as the control method, a control of satisfying only the equation (2-2) or the equation (2-3) and a control of satisfying both the equation (2-2) and the equation (2-3) may be adopted. Further, when the operation is performed in accordance with the control, the hydrogen recovery rate may be 60% or more and the concentration of the monosilane of the permeation side gas may be 1.0% or less.

$$\Delta P = C_1 \times \Delta A, \ C_1 \geq 0.5 \quad \text{Equation (2-2)}$$

Here, $\Delta A$ indicates a decrease rate (%) of the hydrogen recovery rate, and $\Delta P$ indicates a pressure decrease amount (kPa) from the permeation side pressure of the membrane separation device 4b.

$$\Delta T = C_2 \times \Delta A, \ C_2 \geq 0.8 \quad \text{Equation (2-3)}$$

Here, $\Delta A$ indicates a decrease rate (%) of the hydrogen recovery rate, and $\Delta T$ indicates a temperature increase amount (° C.) of the mixed gas.

Furthermore, the above-described control is performed by using a calculation control unit 1030 illustrated in FIG. 14. Further, the calculation control unit 1030 may control the flow rate of the mixed gas using the flow rate control unit 1011 based on the flow rate of the controlled mixed gas, the measurement result of the concentration of the hydrogen and the monosilane in the mixed gas obtained by the mixed gas analysis unit 1003 and the capacity of the membrane separation device.

Further, the calculation control unit 1030 may calculate the hydrogen recovery rate based on the flow rate value of the mixed gas obtained by the flow rate control unit 1011, the measurement result of the concentration of the hydrogen and the monosilane in the mixed gas obtained by the mixed gas analysis unit 1003, and the measurement result of the flow rate of the permeation side gas and the concentration of the hydrogen and the monosilane in the permeation side gas obtained by the permeation side gas analysis unit 1006.

The calculation control unit 1030 may control the temperature of the mixed gas supplied to the membrane separation device 104b or the non-permeation side pressure and the permeation side pressure of the membrane separation device 104b with respect to the decrease amount of the calculated hydrogen recovery rate.

Further, the calculation control unit 1030 may determine how the operation condition of the hydrogen gas purification unit is or whether the collected hydrogen gas will be used again based on the measurement result of the flow rate of the permeation side gas and the concentration of the hydrogen and the monosilane in the permeation side gas obtained by the permeation side gas analysis unit 1006. When the calculation control unit 1030 determines that the collected hydrogen gas will not be used again, the calculation control unit may control the dilution rate of the dilution unit 1007b of the hydrogen gas treatment unit 1007 so that the concentration of the monosilane becomes the allowable concentration (5 ppmv or less).

Further, the calculation control unit 1030 may determine how the operation condition of the monosilane purification unit is or whether the collected monosilane will be used again based on the measurement result of the flow rate of the non-permeation side gas and the concentration of the hydrogen and the monosilane in the non-permeation side gas obtained by the non-permeation side gas analysis unit 1013. When the calculation control unit 1030 determines that the collected monosilane will not be used again, the calculation control unit may control the dilution rate of the dilution unit 1008b of the silane gas treatment unit 1008 so that the concentration of the monosilane becomes the allowable concentration (for example, about 2 vol %) or less of the detoxifying device.

According to the exhaust gas treatment system of the second embodiment, the mixed gas containing at least the hydrogen and the monosilane is separated by the membrane separation device 1004b into the monosilane which needs to be detoxified and the hydrogen which does not need to be detoxified. Since the hydrogen and the monosilane which are separated from the mixed gas are respectively treated by the hydrogen gas treatment unit 1007 and the silane gas treatment unit 1008, the treatment instrument may be decreased in size, and further the exhaust gas treatment system may be made to be compact.

Further, it is possible to efficiently treat the exhaust gas which is discharged from plural semiconductor fabrication equipments, for example, plural plasma CVD devices which form a film of thin-film silicon used in the solar cell. Further, the degradation in the performance of separating the mixed gas with the degradation in the membrane separation device may be suppressed by selecting an appropriate operation condition, and the high separation performance may be maintained for a long period of time.

Hereinafter, the embodiment will be described in detail based on Example, but the embodiment is not limited to the example.

Figure 15:
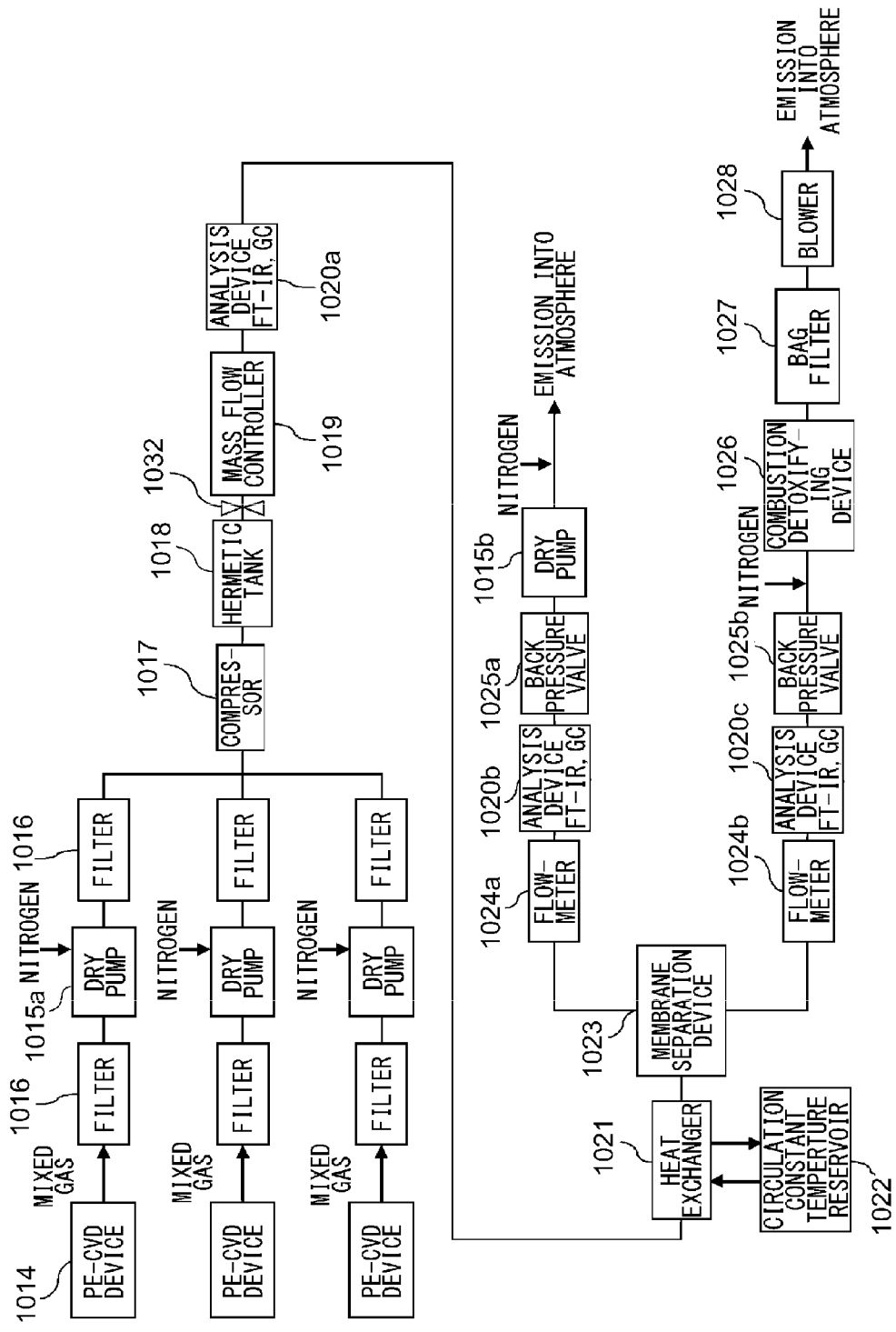
FIG. 15 is a schematic diagram of a separation system used in Example 2.

FIG. 15 is a system diagram illustrating a configuration of an exhaust gas treatment system according to Example 2. As illustrated in FIG. 15, the exhaust gas treatment system according to the second embodiment is connected to three thin-film silicon solar cell manufacturing CVD devices which is one of the semiconductor fabrication equipments 1001. The exhaust gas treatment system 1100 suctions the mixed gas discharged from the plural PE-CVD devices 1014 together with nitrogen introduced from the outside by a dry pump 1015a corresponding to each device, and sends the resultant gas toward the compressor 1017 through the filter 1016. Furthermore, a switching valve (not illustrated) may be provided behind the dry pump 1015a. Accordingly, when the exhaust gas of the chemical cleaning comes out, a combustion supporting gas treatment system is selected, so that such an exhaust gas is prevented from being mixed with a treatment line of a silane gas.

As the compressor 1017, a compressor is selected which may be operated at the compression ratio of 4. In a state where an accumulation valve 1032 is closed, the purging nitrogen of the dry pump 1015a flows at the flow rate of 30 NL/min, so that the pressure of the hermetic tank 1018 (capacity: 5 m$^3$) increases to 0.3 MPaG. Subsequently, the accumulation valve 1032 is opened so that the supply of the gas to a mass flow controller 1019 starts and the respective PE-CVD devices 1014 are operated so as to be late by 4 minutes. The gas flow rate is controlled by the mass flow controller 1019, the temperature is adjusted to a predetermined temperature by a heat exchanger 1021, and then the result is supplied to a membrane separation device 1023 (polyimide hollow fiber membrane). At this time, the permeation side pressure is adjusted to be a predetermined pressure by a permeation side back pressure valve 1025a. Further, the pressure is adjusted to be a normal pressure by the non-permeation side back pressure valve 1025b. Further, after the operation of the PE-CVD device starts, the amount of the purging nitrogen of the dry pump 1015a is adjusted to be a predetermined flow rate.

An analysis device 1020a is used to measure the concentration of the hydrogen and the monosilane in the mixed gas, and includes an FT-IR device with a gas cell and an on-line gas chromatograph (GC) device. As for the mixed gas of which the flow rate or the pressure is controlled to be a predetermined value by the mass flow controller 1019, the concentration of the hydrogen and the monosilane is measured by the analysis device 1020a. Subsequently, the temperature of the mixed gas is controlled by the functions of the heat exchanger 1021 and a circulation constant temperature reservoir 1022, and the mixed gas flows into the membrane separation device 1023. Flowmeters 1024a and 1024b are respectively provided at the rear stage of the permeation side and the non-permeation side of the membrane separation device 1023.

In the exhaust gas treatment system illustrated in FIG. 15, the permeation side separated gas of the membrane separation device 1023 passes through the flowmeter 1024a and the analysis device 1020b, so that the flow rate and the concentration of the hydrogen and the monosilane are measured. The permeation side separated gas is diluted by nitrogen appropriately based on the measurement result, and is emitted into the atmosphere by the dry pump 1015b. On the other hand, the non-permeation side separated gas of the membrane separation device 1023 passes through the flowmeter 1024b and the analysis device 1020c, so that the flow rate and the concentration of the monosilane are detected, and the non-permeation side separated gas is combusted and detoxified by the combustion detoxifying device 1026. As for the gas which is combusted and discharged by the combustion detoxifying device 1026, foreign matter such as particles produced by the combustion are removed by a bag filter 1027, and the gas is emitted into the atmosphere by the blower 1028.

The exhaust gas treatment system with a configuration illustrated in FIG. 15 is connected to the thin-film silicon solar cell CVD device, and a change over time in hydrogen gas recovery rate is monitored while the operation is continued with several patterns of the flow rate and the concentration of the monosilane. Regarding a change in hydrogen gas recovery rate, a change in hydrogen recovery rate is measured by changing the temperature of the temperature control unit and the permeation side pressure of the membrane separation device. The result is illustrated in FIGS. 16 to 19.

Figure 16:
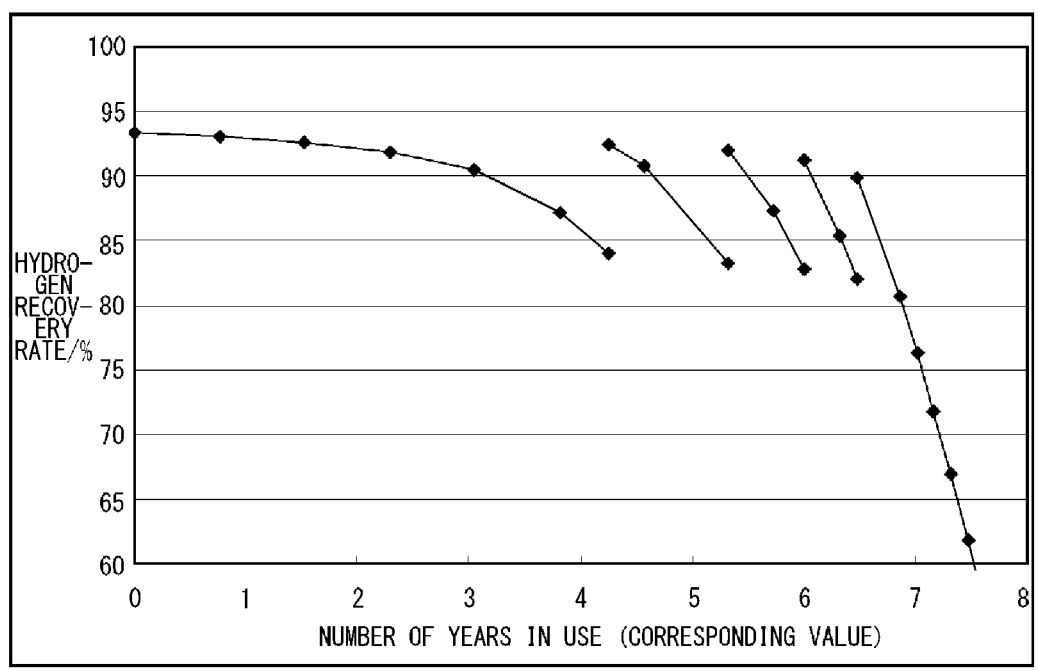
FIG. 16 is a graph illustrating a change in hydrogen recovery rate when the operation is performed with the adjustment of a pressure ($C_1=1.0$) on the condition that purging nitrogen of a pump is not introduced.
Figure 17:
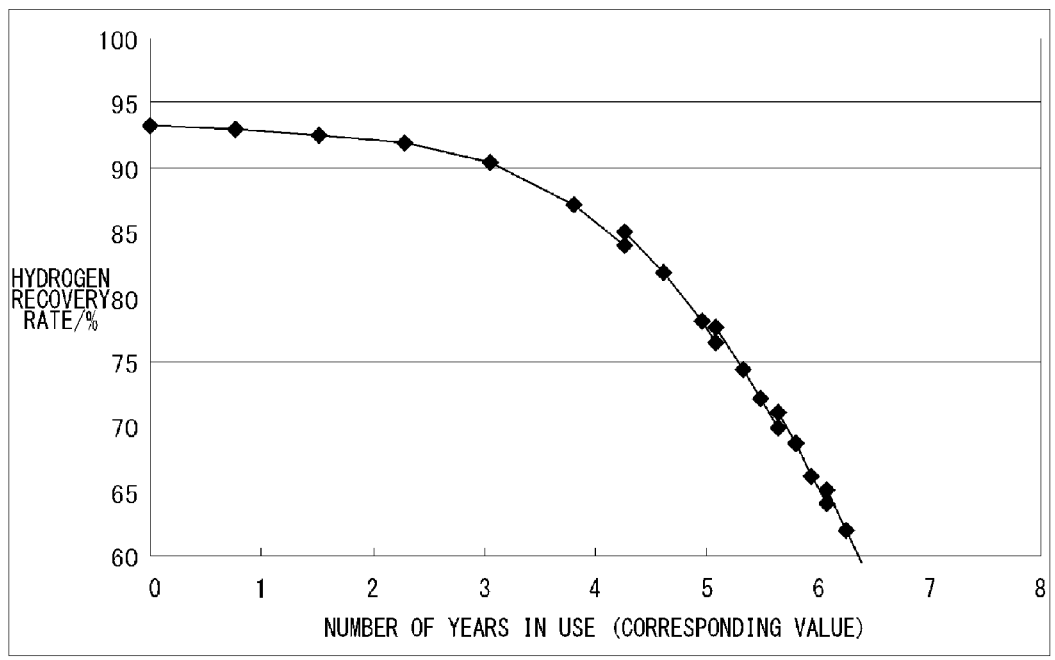
FIG. 17 is a graph illustrating a change in hydrogen recovery rate when the operation is performed with the adjustment of a pressure ($C_1=0.1$) on the condition that the purging nitrogen of the pump is not introduced.
Figure 18:
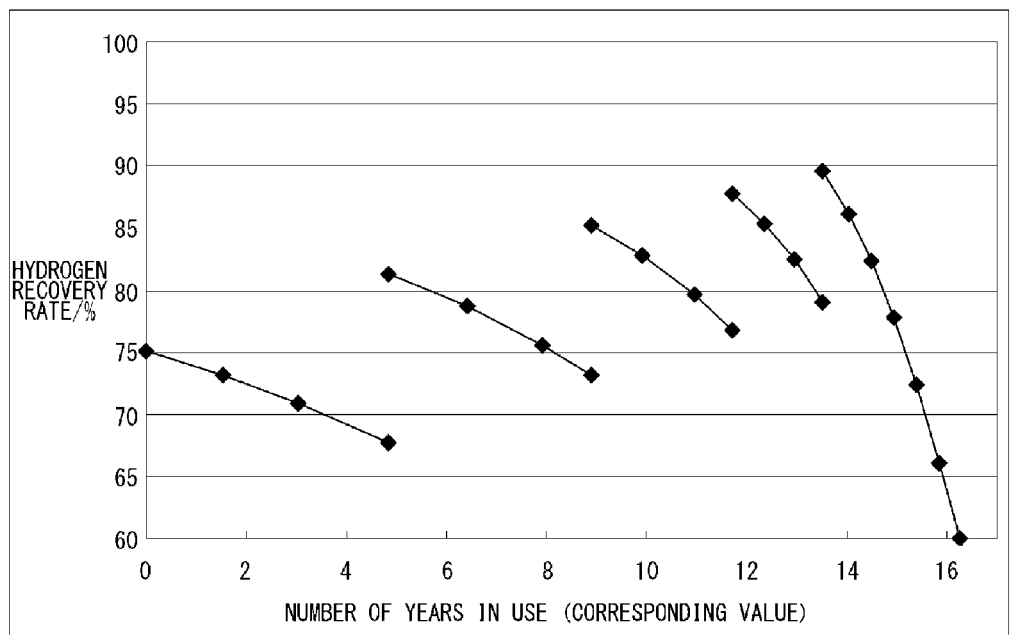
FIG. 18 is a graph illustrating a change in hydrogen recovery rate when the operation is performed with the adjustment of a pressure ($C_1$=1.0) on the condition that the purging nitrogen of the pump is introduced by 10 NL/min.
Figure 19:
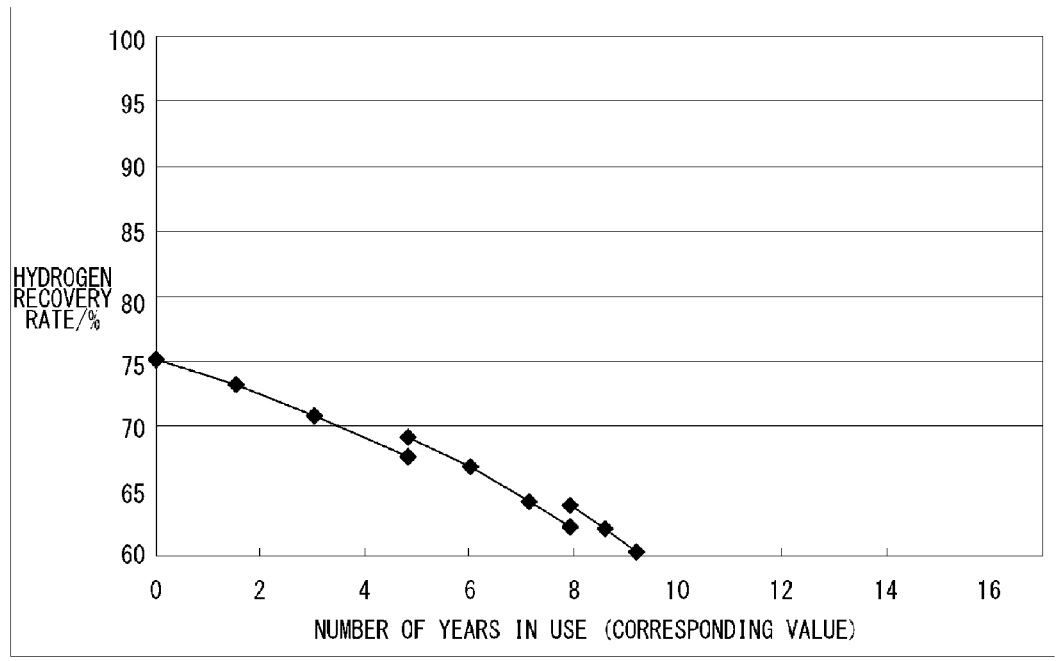
FIG. 19 is a graph illustrating a change in hydrogen recovery rate when the operation is performed with the adjustment of a pressure ($C_1$=0.1) on the condition that the purging nitrogen of the pump is introduced by 10 NL/min.
Figure 20:
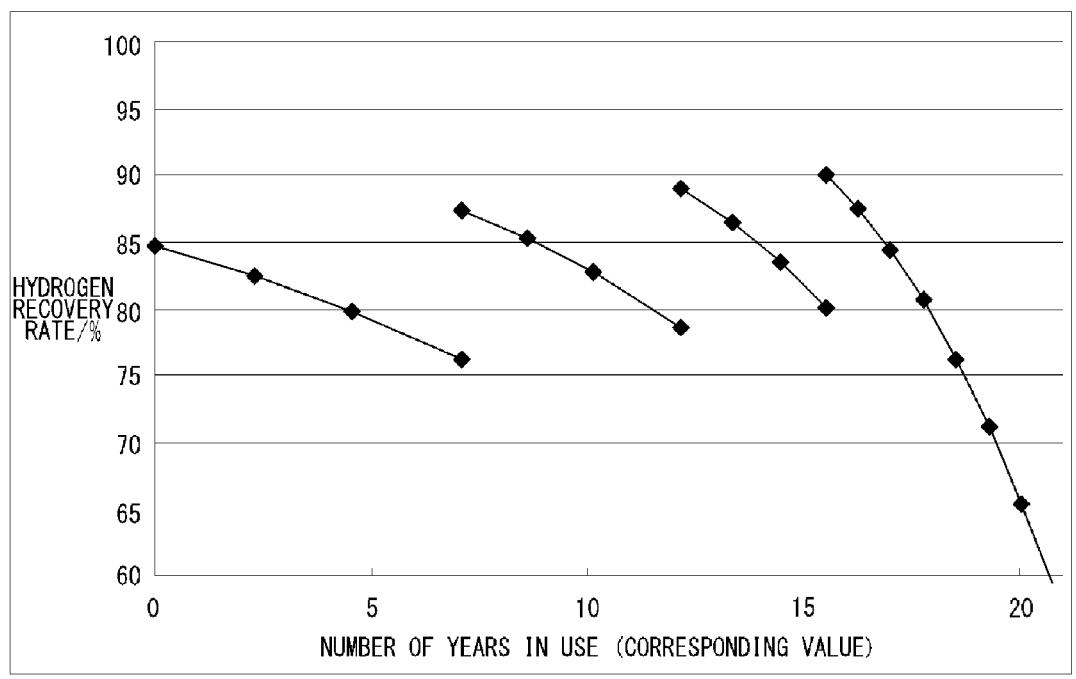
FIG. 20 is a graph illustrating a change in hydrogen recovery rate when the operation is performed with the adjustment of a pressure ($C_1$=1.0) on the condition that the purging nitrogen of the pump is introduced by 10 NL/min.
Figure 21:
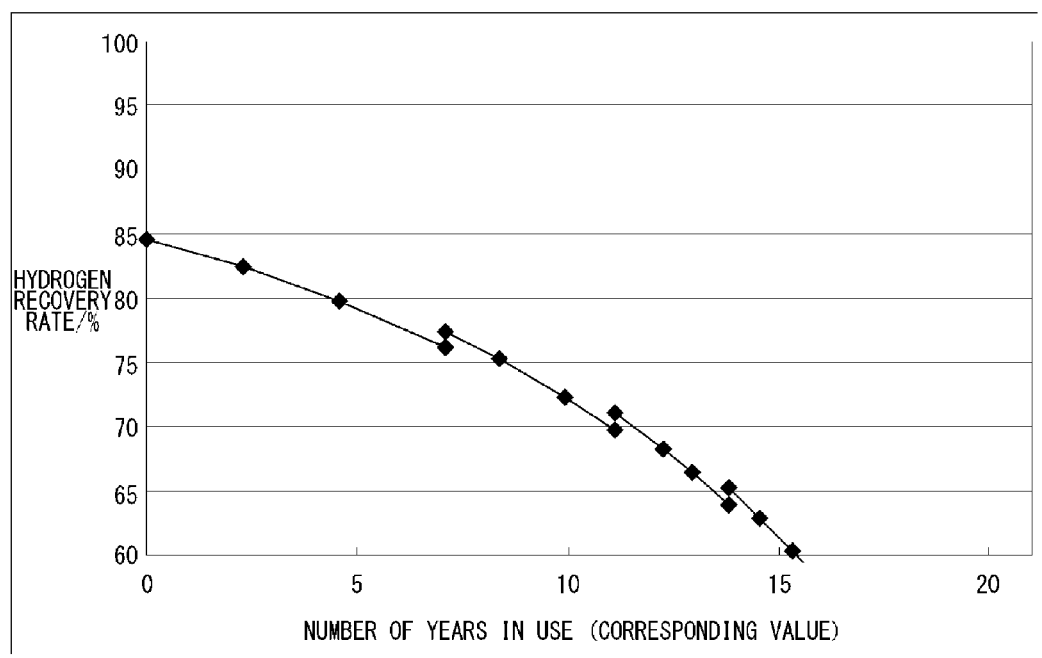
FIG. 21 is a graph illustrating a change in hydrogen recovery rate when the operation is performed with the adjustment of a pressure ($C_1$=0.1) on the condition that the purging nitrogen of the pump is introduced by 10 NL/min.

FIGS. 16 to 21 are graphs illustrating a change in hydrogen recovery rate when the operation is performed with the adjustment of the pressure. FIGS. 16 and 17 are graphs illustrating a change in hydrogen recovery rate when the operation is performed with the adjustment of the pressure on the condition that the purging nitrogen of the pump is not introduced. FIGS. 18 to 21 are graphs illustrating a change in hydrogen recovery rate when the operation is performed with the adjustment of the pressure on the condition that the purging nitrogen of the pump is introduced by 10 mL/min. For comparison, FIGS. 16, 18, and 20 illustrate the operation result when the equation (2-2) is satisfied ($C_1$=1.0), and FIGS. 17, 19, and 21 illustrate the operation result when the equation (2-2) is not satisfied ($C_1$=0.1). The initial condition of the test is illustrated in Table 4. The operation result illustrated in FIGS. 16 and 17 is obtained when the operation is performed with the respective conditions of a pressure change test (1) illustrated in Table 4. The operation result illustrated in FIGS. 18 and 19 is obtained when the operation is performed with the respective conditions of a pressure change test (2) illustrated in Table 4. The operation result illustrated in FIGS. 20 and 21 is obtained when the operation is performed with the respective conditions of a pressure change test (3) illustrated in Table 4.

TABLE 4

| INITIAL CONDITION | SUPPLY SIDE GAS TOTAL FLOW RATE | SUPPLY SIDE MONOSILANE CONCENTRATION | PUMP NITROGEN ADDITION AMOUNT | PERMEATION SIDE PRESSURE | TEMPERATURE | SEPARATION DEVICE CAPACITY |
|---|---|---|---|---|---|---|
| PRESSURE CHANGE TEST (1) | 20 NL/min | 10 vol % | 0 NL/min | −60 kPa | 100° C. | 0.72 L |
| PRESSURE CHANGE TEST (2) | 30 NL/min | 6.7 vol % | 10 NL/min | −60 kPa | 100° C. | 1.5 L |
| PRESSURE CHANGE TEST (3) | 30 NL/min | 6.7 vol % | 10 NL/min | −70 kPa | 40° C. | 2.0 L |
| TEMPERATURE CHANGE TEST (1) | 20 NL/min | 10 vol % | 0 NL/min | −100 kPa | −20° C. | 1.2 L |
| TEMPERATURE CHANGE TEST (2) | 30 NL/min | 6.7 vol % | 10 NL/min | −100 kPa | −20° C. | 2.4 L |
| TEMPERATURE CHANGE TEST (3) | 30 NL/min | 6.7 vol % | 10 NL/min | −90 kPa | 30° C. | 1.8 L |

Table 5 to Table 7 illustrate a total result of a change in hydrogen recovery rate with respect to the number of years in use (corresponding value). The result of Table 5 is illustrated in FIG. 16 ($C_1=1.0$) and FIG. 17 ($C_1=0.1$). The result of Table 6 is illustrated in FIG. 18 ($C_1=1.0$) and FIG. 19 ($C_1=0.1$). The result of Table 7 is illustrated in FIG. 20 ($C_1=1.0$) and FIG. 21 ($C_1=0.1$). Furthermore, the number of years in use (corresponding value) is a value which is obtained by converting the operation time of the acceleration test into the number of real years. The accelerated degradation test was performed so that the total flow rate of the supplied mixed gas is set to 50 times that of the normal test and the supplied monosilane gas concentration and the supplied nitrogen gas concentration are constant. The method of the accelerated degradation test is further written in Table 5 to Table 7. In the exhaust gas treatment system according to Example 2, whenever the hydrogen gas recovery rate decreases by about 10%, it is controlled that the permeation side pressure decreases by about 10 kPa in a case of $C_1=1.0$ and decreases by about 1 kPa in a case of $C_1=0.1$. From this result, it is found that the exhaust gas treatment system may be operated for a long period of time while maintaining a high hydrogen recovery rate when the exhaust gas treatment system is operated so as to satisfy the equation (2-2). Furthermore, desirably, the value of $C_1$ may be 0.5 or more.

TABLE 5

| TEST CONDITION | NUMBER OF YEARS IN USE (CORRESPONDING VALUE) [YEAR] | SUPPLY SIDE GAS TOTAL FLOW RATE [NL/min] | SUPPLY SIDE MONO-SILANE CONCENTRATION [vol %] | PUMP NITROGEN ADDITION AMOUNT [NL/min] | PERMEATION SIDE PRESSURE [kPa] | TEMPERATURE [° C.] | PERMEATION SIDE MONO-SILANE CONCENTRATION [vol %] | HYDROGEN RECOVERY RATE [%] | REMARK |
|---|---|---|---|---|---|---|---|---|---|
| $C_1 = 1.0$ | 0 | 20 | 10 | 0 | −60 | 100 | 0.204 | 93.3 | INITIAL |
| | 1000 | 10 | 0 | −60 | 100 | | | | ACCELERATED DEGRADATION TEST |
| | 4.3 | 20 | 10 | 0 | −60 | 100 | 0.068 | 83.9 | |
| | 4.3 | 20 | 10 | 0 | −70 | 100 | 0.080 | 92.5 | PRESSURE REDUCTION |
| | | 1000 | 10 | 0 | −70 | 100 | | | ACCELERATED DEGRADATION TEST |
| | 5.3 | 20 | 10 | 0 | −70 | 100 | 0.052 | 83.3 | |
| | 5.3 | 20 | 10 | 0 | −80 | 100 | 0.058 | 92.0 | PRESSURE REDUCTION |
| | | 1000 | 10 | 0 | −80 | 100 | | | ACCELERATED DEGRADATION TEST |
| | 6.0 | 20 | 10 | 0 | −80 | 100 | 0.042 | 82.8 | |
| | 6.0 | 20 | 10 | 0 | −90 | 100 | 0.046 | 91.2 | PRESSURE REDUCTION |
| | | 1000 | 10 | 0 | −90 | 100 | | | ACCELERATED DEGRADATION TEST |
| | 6.5 | 20 | 10 | 0 | −90 | 100 | 0.035 | 82.1 | |
| | 6.5 | 20 | 10 | 0 | −100 | 100 | 0.037 | 89.9 | PRESSURE REDUCTION |
| | | 1000 | 10 | 0 | −100 | 100 | | | ACCELERATED DEGRADATION TEST |
| | 7.5 | 20 | 10 | 0 | −100 | 100 | 0.023 | 61.8 | END |

TABLE 5-continued

| TEST CONDITION | NUMBER OF YEARS IN USE (CORRESPONDING VALUE) [YEAR] | SUPPLY SIDE GAS TOTAL FLOW RATE [NL/min] | SUPPLY SIDE MONO-SILANE CONCENTRATION [vol %] | PUMP NITROGEN ADDITION AMOUNT [NL/min] | PERMEATION SIDE PRESSURE [kPa] | TEMPERATURE [° C.] | PERMEATION SIDE MONO-SILANE CONCENTRATION [vol %] | HYDROGEN RECOVERY RATE [%] | REMARK |
|---|---|---|---|---|---|---|---|---|---|
| $C_1 = 0.1$ | 0 | 20 | 10 | 0 | −60 | 100 | 0.204 | 93.3 | INITIAL ACCELERATED DEGRADATION TEST |
|  |  | 1000 | 10 | 0 | −60 | 100 |  |  |  |
|  | 4.3 | 20 | 10 | 0 | −60 | 100 | 0.068 | 84.0 |  |
|  | 4.3 | 20 | 10 | 0 | −61 | 100 | 0.069 | 85.0 | PRESSURE REDUCTION ACCELERATED DEGRADATION TEST |
|  |  | 1000 | 10 | 0 | −61 | 100 |  |  |  |
|  | 5.1 | 20 | 10 | 0 | −61 | 100 | 0.054 | 76.5 |  |
|  | 5.1 | 20 | 10 | 0 | −62 | 100 | 0.054 | 77.7 | PRESSURE REDUCTION ACCELERATED DEGRADATION TEST |
|  |  | 1000 | 10 | 0 | −62 | 100 |  |  |  |
|  | 5.6 | 20 | 10 | 0 | −62 | 100 | 0.047 | 70.0 |  |
|  | 5.6 | 20 | 10 | 0 | −63 | 100 | 0.047 | 71.1 | PRESSURE REDUCTION ACCELERATED DEGRADATION TEST |
|  |  | 1000 | 10 | 0 | −63 | 100 |  |  |  |
|  | 6.1 | 20 | 10 | 0 | −63 | 100 | 0.420 | 64.0 |  |
|  | 6.1 | 20 | 10 | 0 | −64 | 100 | 0.420 | 65.1 | PRESSURE REDUCTION ACCELERATED DEGRADATION TEST |
|  |  | 1000 | 10 | 0 | −64 | 100 |  |  |  |
|  | 6.4 | 20 | 10 | 0 | −64 | 100 | 0.038 | 59.1 | END |

TABLE 6

| TEST CONDITION | NUMBER OF YEARS IN USE (CORRESPONDING VALUE) [YEAR] | SUPPLY SIDE GAS TOTAL FLOW RATE [NL/min] | SUPPLY SIDE MONO-SILANE CONCENTRATION [vol %] | PUMP NITROGEN ADDITION AMOUNT [NL/min] | PERMEATION SIDE PRESSURE [kPa] | TEMPERATURE [° C.] | PERMEATION SIDE MONO-SILANE CONCENTRATION [vol %] | HYDROGEN RECOVERY RATE [%] | REMARK |
|---|---|---|---|---|---|---|---|---|---|
| $C_1 = 1.0$ | 0 | 30 | 6.7 | 10 | −60 | 100 | 0.131 | 75.2 | INITIAL ACCELERATED DEGRADATION TEST |
|  |  | 1500 | 6.7 | 500 | −60 | 100 |  |  |  |
|  | 4.8 | 30 | 6.7 | 10 | −60 | 100 | 0.103 | 67.7 |  |
|  | 4.8 | 30 | 6.7 | 10 | −70 | 100 | 0.098 | 81.3 | PRESSURE REDUCTION ACCELERATED DEGRADATION TEST |
|  |  | 1500 | 6.7 | 500 | −70 | 100 |  |  |  |
|  | 8.9 | 30 | 6.7 | 10 | −70 | 100 | 0.072 | 73.2 |  |
|  | 8.9 | 30 | 6.7 | 10 | −80 | 100 | 0.069 | 85.2 | PRESSURE REDUCTION ACCELERATED DEGRADATION TEST |
|  |  | 1500 | 6.7 | 500 | −80 | 100 |  |  |  |
|  | 11.7 | 30 | 6.7 | 10 | −80 | 100 | 0.051 | 76.7 |  |
|  | 11.7 | 30 | 6.7 | 10 | −90 | 100 | 0.049 | 87.8 | PRESSURE REDUCTION ACCELERATED DEGRADATION TEST |
|  |  | 1500 | 6.7 | 500 | −90 | 100 |  |  |  |
|  | 13.5 | 30 | 6.7 | 10 | −90 | 100 | 0.037 | 79.1 |  |
|  | 13.5 | 30 | 6.7 | 10 | −100 | 100 | 0.036 | 89.5 | PRESSURE REDUCTION ACCELERATED DEGRADATION TEST |
|  |  | 1500 | 6.7 | 500 | −100 | 100 |  |  |  |
|  | 16.2 | 30 | 6.7 | 10 | −100 | 100 | 0.022 | 60.0 | END |

TABLE 6-continued

| TEST CONDI-TION | NUMBER OF YEARS IN USE (CORRE-SPONDING VALUE) [YEAR] | SUPPLY SIDE GAS TOTAL FLOW RATE [NL/min] | SUPPLY SIDE MONO-SILANE CONCEN-TRATION [vol %] | PUMP NITROGEN ADDITION AMOUNT [NL/min] | PERME-ATION SIDE PRES-SURE [kPa] | TEMPER-ATURE [° C.] | PERME-ATION SIDE MONO-SILANE CONCEN-TRATION [vol %] | HYDROGEN RECOVERY RATE [%] | REMARK |
|---|---|---|---|---|---|---|---|---|---|
| $C_1 = 0.1$ | 0 | 30 | 6.7 | 10 | −60 | 100 | 0.131 | 75.2 | INITIAL |
|  |  | 1500 | 6.7 | 500 | −60 | 100 |  |  | ACCELERATED DEGRADATION TEST |
|  | 4.8 | 30 | 6.7 | 10 | −60 | 100 | 0.103 | 67.7 |  |
|  | 4.8 | 30 | 6.7 | 10 | −61 | 100 | 0.102 | 69.2 | PRESSURE REDUCTION |
|  |  | 1500 | 6.7 | 500 | −61 | 100 |  |  | ACCELERATED DEGRADATION TEST |
|  | 7.9 | 30 | 6.7 | 10 | −61 | 100 | 0.084 | 62.2 |  |
|  | 7.9 | 30 | 6.7 | 10 | −62 | 100 | 0.083 | 63.9 | PRESSURE REDUCTION |
|  |  | 1500 | 6.7 | 500 | −62 | 100 |  |  | ACCELERATED DEGRADATION TEST |
|  | 9.2 | 30 | 6.7 | 10 | −62 | 100 | 0.076 | 60.3 | END |

TABLE 7

| TEST CONDI-TION | NUMBER OF YEARS IN USE (CORRE-SPONDING VALUE) [YEAR] | SUPPLY SIDE GAS TOTAL FLOW RATE [NL/min] | SUPPLY SIDE MONO-SILANE CONCEN-TRATION [vol %] | PUMP NITROGEN ADDITION AMOUNT [NL/min] | PERME-ATION SIDE PRES-SURE [kPa] | TEMPER-ATURE [° C.] | PERME-ATION SIDE MONO-SILANE CONCEN-TRATION [vol %] | HYDROGEN RECOVERY RATE [%] | REMARK |
|---|---|---|---|---|---|---|---|---|---|
| $C_1 = 1.0$ | 0 | 30 | 6.7 | 10 | −70 | 40 | 0.054 | 84.6 | INITIAL |
|  |  | 1500 | 6.7 | 500 | −70 | 40 |  |  | ACCELERATED DEGRADATION TEST |
|  | 7.1 | 30 | 6.7 | 10 | −70 | 40 | 0.040 | 76.2 |  |
|  | 7.1 | 30 | 6.7 | 10 | −80 | 40 | 0.039 | 87.3 | PRESSURE REDUCTION |
|  |  | 1500 | 6.7 | 500 | −80 | 40 |  |  | ACCELERATED DEGRADATION TEST |
|  | 12.2 | 30 | 6.7 | 10 | −80 | 40 | 0.029 | 78.6 |  |
|  | 12.2 | 30 | 6.7 | 10 | −90 | 40 | 0.028 | 89.0 | PRESSURE REDUCTION |
|  |  | 1500 | 6.7 | 500 | −90 | 40 |  |  | ACCELERATED DEGRADATION TEST |
|  | 15.5 | 30 | 6.7 | 10 | −90 | 40 | 0.022 | 80.1 |  |
|  | 15.5 | 30 | 6.7 | 10 | −100 | 40 | 0.021 | 90.1 | PRESSURE REDUCTION |
|  |  | 1500 | 6.7 | 500 | −100 | 40 |  |  | ACCELERATED DEGRADATION TEST |
|  | 20.7 | 30 | 6.7 | 10 | −100 | 40 | 0.013 | 59.9 | END |
| $C_1 = 1.0$ | 0 | 30 | 6.7 | 10 | −70 | 40 | 0.054 | 84.6 | INITIAL |
|  |  | 1500 | 6.7 | 500 | −70 | 40 |  |  | ACCELERATED DEGRADATION TEST |
|  | 7.1 | 30 | 6.7 | 10 | −70 | 40 | 0.040 | 76.2 |  |
|  | 7.1 | 30 | 6.7 | 10 | −71 | 40 | 0.040 | 77.4 | PRESSURE REDUCTION |
|  |  | 1500 | 6.7 | 500 | −71 | 40 |  |  | ACCELERATED DEGRADATION TEST |
|  | 11.1 | 30 | 6.7 | 10 | −71 | 40 | 0.033 | 69.7 |  |
|  | 11.1 | 30 | 6.7 | 10 | −72 | 40 | 0.032 | 71.0 | PRESSURE REDUCTION |
|  |  | 1500 | 6.7 | 500 | −72 | 40 |  |  | ACCELERATED DEGRADATION TEST |
|  | 13.8 | 30 | 6.7 | 10 | −72 | 40 | 0.028 | 63.9 |  |
|  | 13.8 | 30 | 6.7 | 10 | −73 | 40 | 0.028 | 65.3 | PRESSURE REDUCTION |

TABLE 7-continued

| TEST CONDITION | NUMBER OF YEARS IN USE (CORRESPONDING VALUE) [YEAR] | SUPPLY SIDE GAS TOTAL FLOW RATE [NL/min] | SUPPLY SIDE MONO-SILANE CONCENTRATION [vol %] | PUMP NITROGEN ADDITION AMOUNT [NL/min] | PERMEATION SIDE PRESSURE [kPa] | TEMPERATURE [° C.] | PERMEATION SIDE MONO-SILANE CONCENTRATION [vol %] | HYDROGEN RECOVERY RATE [%] | REMARK |
|---|---|---|---|---|---|---|---|---|---|
| | | 1500 | 6.7 | 500 | −73 | 40 | | | ACCELERATED DEGRADATION TEST |
| | 15.3 | 30 | 6.7 | 10 | −73 | 40 | 0.024 | 60.3 | END |

Figure 22:
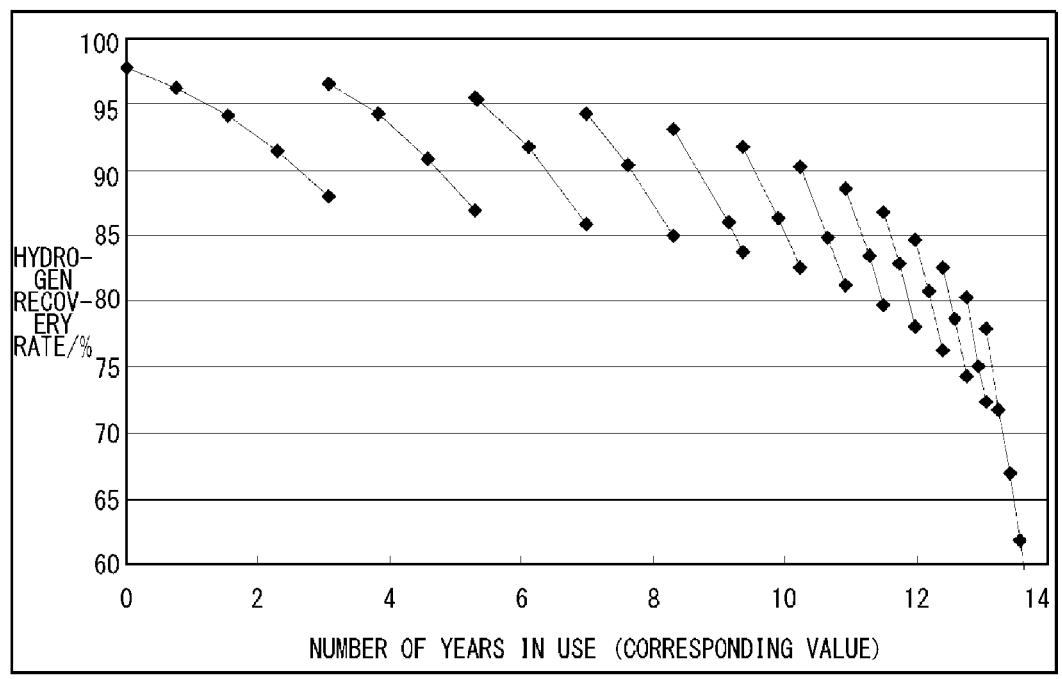
FIG. 22 is a graph illustrating a change in hydrogen recovery rate when the operation is performed with the adjustment of a temperature ($C_2$=1.0) on the condition that the purging nitrogen of the pump is not introduced.
Figure 23:
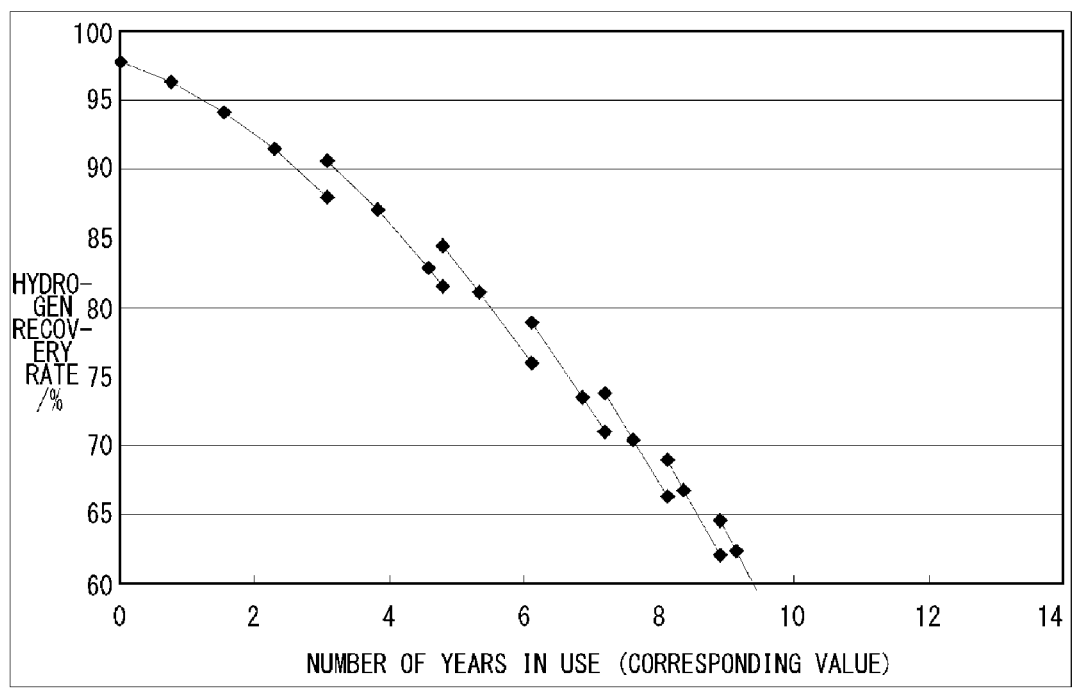
FIG. 23 is a graph illustrating a change in hydrogen recovery rate when the operation is performed with the adjustment of a temperature ($C_2$=0.25) on the condition that the purging nitrogen of the pump is not introduced.
Figure 24:
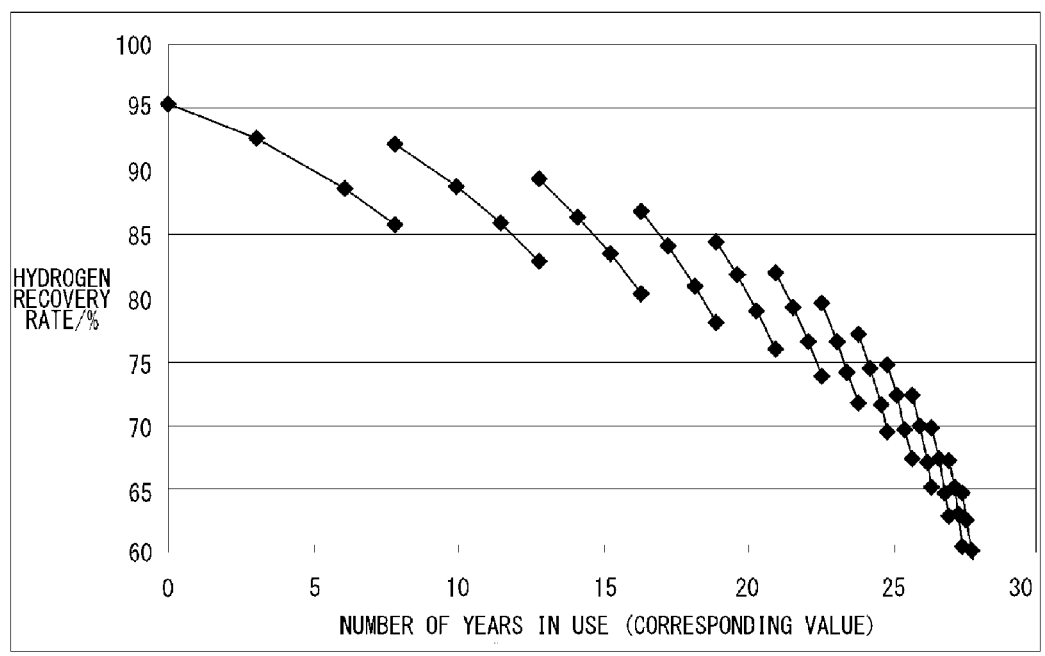
FIG. 24 is a graph illustrating a change in hydrogen recovery rate when the operation is performed with the adjustment of a temperature ($C_2$=1.0) on the condition that the purging nitrogen of the pump is introduced by 10 NL/min.
Figure 25:
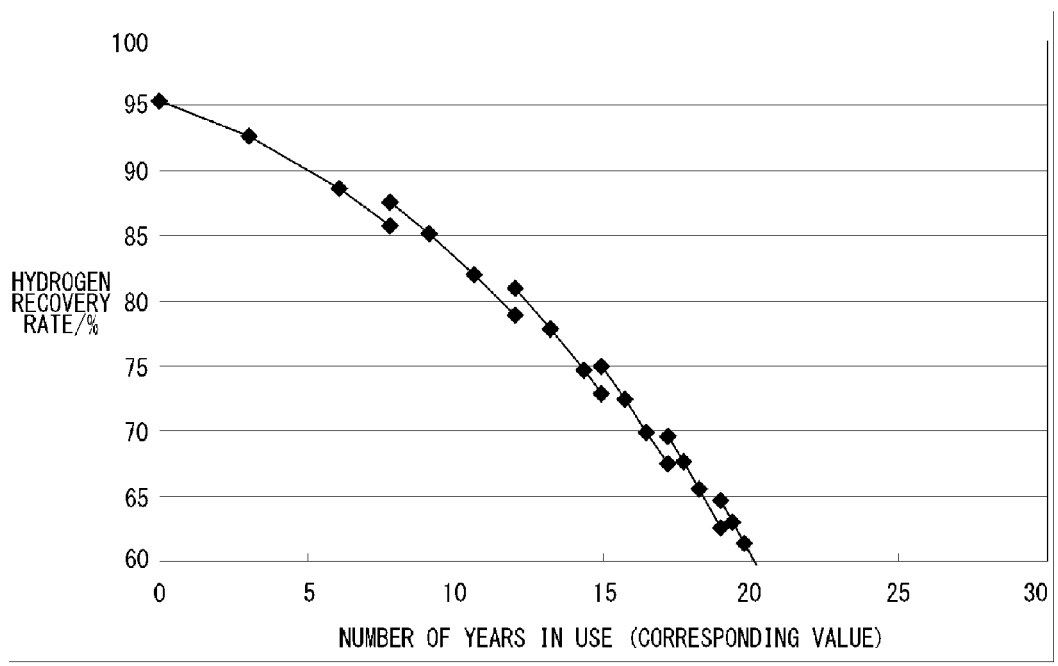
FIG. 25 is a graph illustrating a change in hydrogen recovery rate when the operation is performed with the adjustment of a temperature ($C_2$=0.25) on the condition that the purging nitrogen of the pump is introduced by 10 NL/min.
Figure 26:
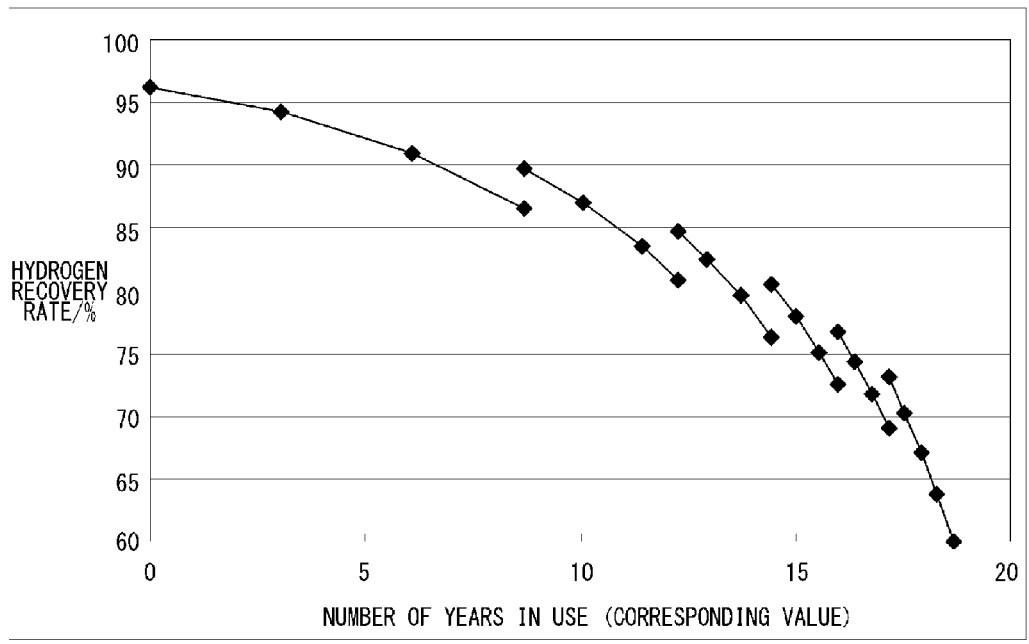
FIG. 26 is a graph illustrating a change in hydrogen recovery rate when the operation is performed with the adjustment of a temperature ($C_2$=1.0) on the condition that the purging nitrogen of the pump is introduced by 10 NL/min.
Figure 27:
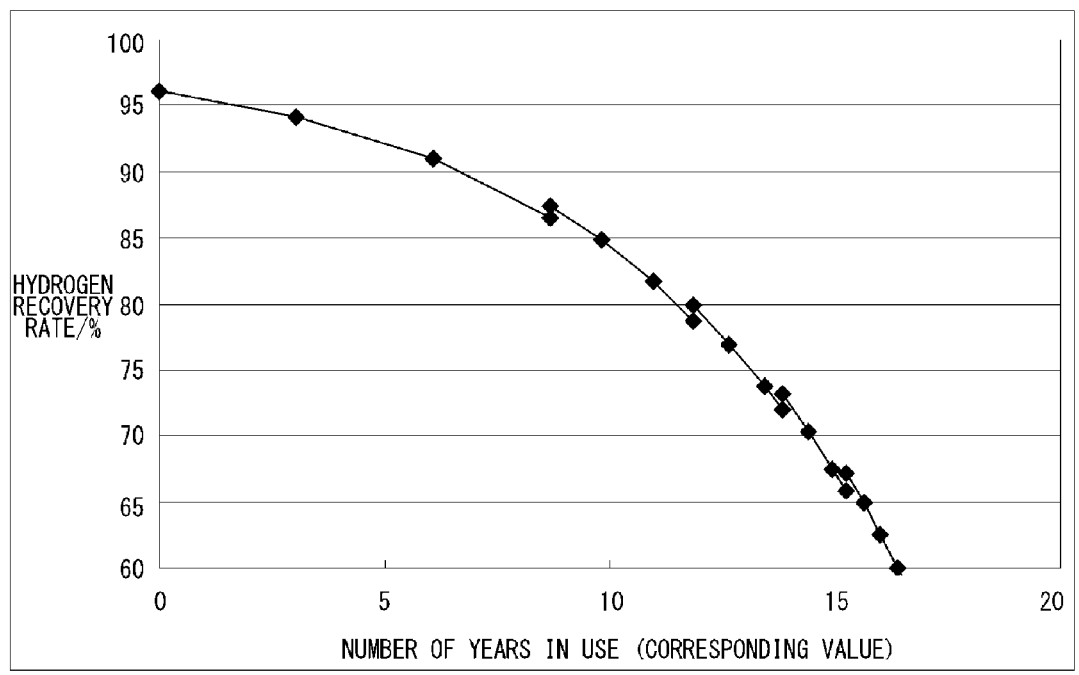
FIG. 27 is a graph illustrating a change in hydrogen recovery rate when the operation is performed with the adjustment of a temperature ($C_2$=0.25) on the condition that the purging nitrogen of the pump is introduced by 10 NL/min.

FIGS. 22 to 27 are graphs illustrating a change in hydrogen recovery rate when the operation is performed with the adjustment of the temperature. FIGS. 22 and 23 are graphs illustrating a change in hydrogen recovery rate when the operation is performed with the adjustment of the pressure on the condition that the purging nitrogen of the pump is not introduced. FIGS. 24 to 27 are graphs illustrating a change in hydrogen recovery rate when the operation is performed with the adjustment of the pressure on the condition that the purging nitrogen of the pump is introduced by 10 NL/min. For comparison, FIGS. 22, 24, and 26 illustrate the operation result when the equation (2-3) is satisfied ($C_2=1.0$), and FIGS. 23, 25, and 27 illustrate the operation result when the equation (2-3) is not satisfied ($C_2=0.25$). The initial condition of the test is illustrated in Table 4. The operation result illustrated in FIGS. 22 and 23 is obtained when the operation is performed with the respective conditions of a temperature change test (1) illustrated in Table 4. The operation result illustrated in FIGS. 24 and 25 is obtained when the operation is performed with the respective conditions of a temperature change test (2) illustrated in Table 4. The operation result illustrated in FIGS. 26 and 27 is obtained when the operation is performed with the respective conditions of a temperature change test (3) illustrated in Table 4.

Table 8 to Table 10 illustrate the total result of a change in hydrogen recovery rate with respect to the number of years in use (corresponding value). The result of Table 8 is illustrated in FIG. 22 ($C_2=1.0$) and FIG. 23 ($C_2=0.25$). The result of Table 9 is illustrated in FIG. 24 ($C_2=1.0$) and FIG. 25 ($C_2=0.25$). The result of Table 10 is illustrated in FIG. 26 ($C_2=1.0$) and FIG. 27 ($C_2=0.25$). Furthermore, the number of years in use (corresponding value) is a value which is obtained by converting the operation time of the acceleration test into the number of real years. The accelerated degradation test was performed so that the total flow rate of the supplied mixed gas is set to 50 times that of the normal test and the supplied monosilane gas concentration and the supplied nitrogen gas concentration are constant. The method of the accelerated degradation test is further written in Table 8 to Table 10. In the exhaust gas treatment system according to Example 2, whenever the hydrogen gas recovery rate decreases by about 10%, it is controlled that the operation temperature (the temperature of the mixed gas) increases by about 10° C. in a case of $C_2=1.0$ and increases by about 2.5° C. in a case of $C_2=0.25$. From this result, it is found that the exhaust gas treatment system may be operated for a long period of time while maintaining a high hydrogen recovery rate when the exhaust gas treatment system is operated so as to satisfy the equation (2-3). Furthermore, desirably, the value of $C_2$ may be 0.8 or more.

TABLE 8

| TEST CONDITION | NUMBER OF YEARS IN USE (CORRESPONDING VALUE) [YEAR] | SUPPLY SIDE GAS TOTAL FLOW RATE [NL/min] | SUPPLY SIDE MONO-SILANE CONCENTRATION [vol %] | PUMP NITROGEN ADDITION AMOUNT [NL/min] | PERMEATION SIDE PRESSURE [kPa] | TEMPERATURE [° C.] | PERMEATION SIDE MONO-SILANE CONCENTRATION [vol %] | HYDROGEN RECOVERY RATE [%] | REMARK |
|---|---|---|---|---|---|---|---|---|---|
| $C_2 = 1.0$ | 0 | 20 | 10 | 0 | −100 | −20 | 0.015 | 97.7 | INITIAL |
| | | 1000 | 10 | 0 | −100 | −20 | | | ACCELERATED DEGRADATION TEST |
| | 3.1 | 20 | 10 | 0 | −100 | −20 | 0.009 | 87.9 | |
| | 3.1 | 20 | 10 | 0 | −100 | −10 | 0.016 | 96.6 | PRESSURE REDUCTION |
| | | 1000 | 10 | 0 | −100 | −10 | | | ACCELERATED DEGRADATION TEST |
| | 5.3 | 20 | 10 | 0 | −100 | −10 | 0.011 | 86.9 | |
| | 5.3 | 20 | 10 | 0 | −100 | 0 | 0.017 | 95.5 | PRESSURE REDUCTION |
| | | 1000 | 10 | 0 | −100 | 0 | | | ACCELERATED DEGRADATION TEST |
| | 7.0 | 20 | 10 | 0 | −100 | 0 | 0.012 | 85.9 | |
| | 7.0 | 20 | 10 | 0 | −100 | 10 | 0.018 | 94.3 | PRESSURE REDUCTION |
| | | 1000 | 10 | 0 | −100 | 10 | | | ACCELERATED DEGRADATION TEST |

TABLE 8-continued

| TEST CONDITION | NUMBER OF YEARS IN USE (CORRESPONDING VALUE) [YEAR] | SUPPLY SIDE GAS TOTAL FLOW RATE [NL/min] | SUPPLY SIDE MONO-SILANE CONCENTRATION [vol %] | PUMP NITROGEN ADDITION AMOUNT [NL/min] | PERMEATION SIDE PRESSURE [kPa] | TEMPERATURE [° C.] | PERMEATION SIDE MONO-SILANE CONCENTRATION [vol %] | HYDROGEN RECOVERY RATE [%] | REMARK |
|---|---|---|---|---|---|---|---|---|---|
| | 8.3 | 20 | 10 | 0 | −100 | 10 | 0.013 | 84.9 | |
| | 8.3 | 20 | 10 | 0 | −100 | 20 | 0.020 | 93.1 | PRESSURE REDUCTION |
| | | 1000 | 10 | 0 | −100 | 20 | | | ACCELERATED DEGRADATION TEST |
| | 9.4 | 20 | 10 | 0 | −100 | 20 | 0.015 | 83.8 | |
| | 9.4 | 20 | 10 | 0 | −100 | 30 | 0.201 | 91.7 | PRESSURE REDUCTION |
| | | 1000 | 10 | 0 | −100 | 30 | | | ACCELERATED DEGRADATION TEST |
| | 10.2 | 20 | 10 | 0 | −100 | 30 | 0.016 | 82.5 | |
| | 10.2 | 20 | 10 | 0 | −100 | 40 | 0.022 | 90.2 | PRESSURE REDUCTION |
| | | 1000 | 10 | 0 | −100 | 40 | | | ACCELERATED DEGRADATION TEST |
| | 10.9 | 20 | 10 | 0 | −100 | 40 | 0.018 | 81.2 | |
| | 10.9 | 20 | 10 | 0 | −100 | 50 | 0.023 | 88.5 | PRESSURE REDUCTION |
| | | 1000 | 10 | 0 | −100 | 50 | | | ACCELERATED DEGRADATION TEST |
| | 11.5 | 20 | 10 | 0 | −100 | 50 | 0.019 | 79.7 | |
| | 11.5 | 20 | 10 | 0 | −100 | 60 | 0.024 | 86.7 | PRESSURE REDUCTION |
| | | 1000 | 10 | 0 | −100 | 60 | | | ACCELERATED DEGRADATION TEST |
| | 12.0 | 20 | 10 | 0 | −100 | 60 | 0.020 | 78.0 | |
| | 12.0 | 20 | 10 | 0 | −100 | 70 | 0.025 | 84.7 | PRESSURE REDUCTION |
| | | 1000 | 10 | 0 | −100 | 70 | | | ACCELERATED DEGRADATION TEST |
| | 12.4 | 20 | 10 | 0 | −100 | 70 | 0.022 | 76.2 | |
| | 12.4 | 20 | 10 | 0 | −100 | 80 | 0.026 | 82.6 | PRESSURE REDUCTION |
| | | 1000 | 10 | 0 | −100 | 80 | | | ACCELERATED DEGRADATION TEST |
| | 12.8 | 20 | 10 | 0 | −100 | 80 | 0.023 | 74.3 | |
| | 12.8 | 20 | 10 | 0 | −100 | 90 | 0.027 | 80.3 | PRESSURE REDUCTION |
| | | 1000 | 10 | 0 | −100 | 90 | | | ACCELERATED DEGRADATION TEST |
| | 13.1 | 20 | 10 | 0 | −100 | 90 | 0.024 | 72.3 | |
| | 13.1 | 20 | 10 | 0 | −100 | 100 | 0.028 | 77.9 | PRESSURE REDUCTION |
| | | 1000 | 10 | 0 | −100 | 100 | | | ACCELERATED DEGRADATION TEST |
| | 13.6 | 20 | 10 | 0 | −100 | 100 | 0.023 | 81.8 | END |
| $C_2 = 0.25$ | 0 | 20 | 10 | 0 | −100 | −20 | 0.015 | 97.7 | INITIAL |
| | | 1000 | 10 | 0 | −100 | −20 | | | ACCELERATED DEGRADATION TEST |
| | 3.1 | 20 | 10 | 0 | −100 | −20 | 0.009 | 87.9 | |
| | 3.1 | 20 | 10 | 0 | −100 | −17.5 | 0.011 | 90.6 | PRESSURE REDUCTION |
| | | 1000 | 10 | 0 | −100 | −17.5 | | | ACCELERATED DEGRADATION TEST |
| | 4.8 | 20 | 10 | 0 | −100 | −17.5 | 0.008 | 81.5 | |
| | 4.8 | 20 | 10 | 0 | −100 | −15 | 0.009 | 84.4 | PRESSURE REDUCTION |
| | | 1000 | 10 | 0 | −100 | −15 | | | ACCELERATED DEGRADATION TEST |

TABLE 8-continued

| TEST CONDITION | NUMBER OF YEARS IN USE (CORRESPONDING VALUE) [YEAR] | SUPPLY SIDE GAS TOTAL FLOW RATE [NL/min] | SUPPLY SIDE MONO-SILANE CONCENTRATION [vol %] | PUMP NITROGEN ADDITION AMOUNT [NL/min] | PERMEATION SIDE PRESSURE [kPa] | TEMPERATURE [°C.] | PERMEATION SIDE MONO-SILANE CONCENTRATION [vol %] | HYDROGEN RECOVERY RATE [%] | REMARK |
|---|---|---|---|---|---|---|---|---|---|
| | 6.1 | 20 | 10 | 0 | −100 | −15 | 0.008 | 75.9 | |
| | 6.1 | 20 | 10 | 0 | −100 | −12.5 | 0.009 | 78.8 | PRESSURE REDUCTION ACCELERATED DEGRADATION TEST |
| | | 1000 | 10 | 0 | −100 | −12.5 | | | |
| | 7.2 | 20 | 10 | 0 | −100 | −12.5 | 0.008 | 70.9 | |
| | 7.2 | 20 | 10 | 0 | −100 | −10 | 0.008 | 73.7 | PRESSURE REDUCTION ACCELERATED DEGRADATION TEST |
| | | 1000 | 10 | 0 | −100 | −10 | | | |
| | 8.1 | 20 | 10 | 0 | −100 | −10 | 0.008 | 66.3 | |
| | 8.1 | 20 | 10 | 0 | −100 | −7.5 | 0.008 | 68.9 | PRESSURE REDUCTION ACCELERATED DEGRADATION TEST |
| | | 1000 | 10 | 0 | −100 | −7.5 | | | |
| | 8.9 | 20 | 10 | 0 | −100 | −7.5 | 0.007 | 62.1 | |
| | 8.9 | 20 | 10 | 0 | −100 | −5 | 0.008 | 64.5 | PRESSURE REDUCTION ACCELERATED DEGRADATION TEST |
| | | 1000 | 10 | 0 | −100 | −5 | | | |
| | 9.9 | 20 | 10 | 0 | −100 | −5 | 0.007 | 55.1 | END |

TABLE 9

| TEST CONDITION | NUMBER OF YEARS IN USE (CORRESPONDING VALUE) [YEAR] | SUPPLY SIDE GAS TOTAL FLOW RATE [NL/min] | SUPPLY SIDE MONO-SILANE CONCENTRATION [vol %] | PUMP NITROGEN ADDITION AMOUNT [NL/min] | PERMEATION SIDE PRESSURE [kPa] | TEMPERATURE [°C.] | PERMEATION SIDE MONO-SILANE CONCENTRATION vol % | HYDROGEN RECOVERY RATE [%] | REMARK |
|---|---|---|---|---|---|---|---|---|---|
| $C_2 = 1.0$ | 0 | 30 | 6.7 | 10 | −100 | −20 | 0.011 | 95.4 | INITIAL ACCELERATED DEGRADATION TEST |
| | | 1500 | 6.7 | 500 | −100 | −20 | | | |
| | 7.8 | 30 | 6.7 | 10 | −100 | −20 | 0.008 | 85.8 | |
| | 7.8 | 30 | 6.7 | 10 | −100 | −10 | 0.011 | 92.1 | PRESSURE REDUCTION ACCELERATED DEGRADATION TEST |
| | | 1500 | 6.7 | 500 | −100 | −10 | | | |
| | 12.8 | 30 | 6.7 | 10 | −100 | −10 | 0.009 | 82.9 | |
| | 12.8 | 30 | 6.7 | 10 | −100 | 0 | 0.012 | 89.4 | PRESSURE REDUCTION ACCELERATED DEGRADATION TEST |
| | | 1500 | 6.7 | 500 | −100 | 0 | | | |
| | 16.3 | 30 | 6.7 | 10 | −100 | 0 | 0.010 | 80.4 | |
| | 16.3 | 30 | 6.7 | 10 | −100 | 10 | 0.013 | 86.9 | PRESSURE REDUCTION ACCELERATED DEGRADATION TEST |
| | | 1500 | 6.7 | 500 | −100 | 10 | | | |
| | 18.9 | 30 | 6.7 | 10 | −100 | 10 | 0.011 | 78.1 | |
| | 18.9 | 30 | 6.7 | 10 | −100 | 20 | 0.014 | 84.5 | PRESSURE REDUCTION ACCELERATED DEGRADATION TEST |
| | | 1500 | 6.7 | 500 | −100 | 20 | | | |
| | 20.9 | 30 | 6.7 | 10 | −100 | 20 | 0.012 | 76.0 | |
| | 20.9 | 30 | 6.7 | 10 | −100 | 30 | 0.015 | 82.1 | PRESSURE REDUCTION ACCELERATED DEGRADATION TEST |
| | | 1500 | 6.7 | 500 | −100 | 30 | | | |

TABLE 9-continued

| TEST CONDITION | NUMBER OF YEARS IN USE (CORRESPONDING VALUE) [YEAR] | SUPPLY SIDE GAS TOTAL FLOW RATE [NL/min] | SUPPLY SIDE MONO-SILANE CONCEN-TRATION [vol %] | PUMP NITROGEN ADDITION AMOUNT [NL/min] | PERME-ATION SIDE PRES-SURE [kPa] | TEMPER-ATURE [° C.] | PERME-ATION SIDE MONO-SILANE CONCEN-TRATION vol % | HYDROGEN RECOVERY RATE [%] | REMARK |
|---|---|---|---|---|---|---|---|---|---|
| | 22.5 | 30 | 6.7 | 10 | −100 | 30 | 0.013 | 73.9 | |
| | 22.5 | 30 | 5.7 | 10 | −100 | 40 | 0.017 | 79.7 | PRESSURE REDUCTION |
| | | 1500 | 6.7 | 500 | −100 | 40 | | | ACCELERATED DEGRADATION TEST |
| | 23.8 | 30 | 6.7 | 10 | −100 | 40 | 0.015 | 71.7 | |
| | 23.8 | 30 | 6.7 | 10 | −100 | 50 | 0.018 | 77.3 | PRESSURE REDUCTION |
| | | 1500 | 6.7 | 500 | −100 | 50 | | | ACCELERATED DEGRADATION TEST |
| | 24.8 | 30 | 6.7 | 10 | −100 | 50 | 0.016 | 69.5 | |
| | 24.8 | 30 | 6.7 | 10 | −100 | 60 | 0.019 | 74.8 | PRESSURE REDUCTION |
| | | 1500 | 6.7 | 500 | −100 | 60 | | | ACCELERATED DEGRADATION TEST |
| | 25.6 | 30 | 6.7 | 10 | −100 | 60 | 0.017 | 67.3 | |
| | 25.6 | 30 | 6.7 | 10 | −100 | 70 | 0.020 | 72.3 | PRESSURE REDUCTION |
| | | 1500 | 6.7 | 500 | −100 | 70 | | | ACCELERATED DEGRADATION TEST |
| | 26.3 | 30 | 6.7 | 10 | −100 | 70 | 0.018 | 65.1 | |
| | 26.3 | 30 | 6.7 | 10 | −100 | 80 | 0.021 | 69.8 | PRESSURE REDUCTION |
| | | 1500 | 6.7 | 500 | −100 | 80 | | | ACCELERATED DEGRADATION TEST |
| | 26.9 | 30 | 6.7 | 10 | −100 | 80 | 0.019 | 62.8 | |
| | 26.9 | 30 | 6.7 | 10 | −100 | 90 | 0.022 | 67.2 | PRESSURE REDUCTION |
| | | 1500 | 6.7 | 500 | −100 | 90 | | | ACCELERATED DEGRADATION TEST |
| | 27.47 | 30 | 6.7 | 10 | −100 | 90 | 0.021 | 60.5 | |
| | 27.4 | 30 | 6.7 | 10 | −100 | 100 | 0.023 | 64.7 | PRESSURE REDUCTION |
| | | 1500 | 6.7 | 500 | −100 | 100 | | | ACCELERATED DEGRADATION TEST |
| | 27.8 | 30 | 6.7 | 10 | −100 | 100 | 0.022 | 57.7 | END |
| $C_2 = 0.25$ | 0 | 30 | 6.7 | 10 | −100 | −20 | 0.011 | 95.4 | INITIAL |
| | | 1500 | 6.7 | 500 | −100 | −20 | | | ACCELERATED DEGRADATION TEST |
| | 7.8 | 30 | 6.7 | 10 | −100 | −20 | 0.008 | 85.8 | |
| | 7.8 | 30 | 6.7 | 10 | −100 | −17.5 | 0.009 | 87.6 | PRESSURE REDUCTION |
| | | 1500 | 6.7 | 500 | −100 | −17.5 | | | ACCELERATED DEGRADATION TEST |
| | 12.0 | 30 | 6.7 | 10 | −100 | −17.5 | 0.007 | 78.9 | |
| | 12.0 | 30 | 6.7 | 10 | −100 | −15 | 0.008 | 80.9 | PRESSURE REDUCTION |
| | | 1500 | 6.7 | 500 | −100 | −15 | | | ACCELERATED DEGRADATION TEST |
| | 14.9 | 30 | 6.7 | 10 | −100 | −15 | 0.007 | 72.8 | |
| | 14.9 | 30 | 6.7 | 10 | −100 | −12.5 | 0.008 | 74.9 | PRESSURE REDUCTION |
| | | 1500 | 6.7 | 500 | −100 | −12.5 | | | ACCELERATED DEGRADATION TEST |
| | 17.2 | 30 | 6.7 | 10 | −100 | −12.5 | 0.007 | 67.5 | |
| | 17.2 | 30 | 6.7 | 10 | −100 | −10 | 0.007 | 69.6 | PRESSURE REDUCTION |
| | | 1500 | 6.7 | 500 | −100 | −10 | | | ACCELERATED DEGRADATION TEST |

TABLE 9-continued

| TEST CONDITION | NUMBER OF YEARS IN USE (CORRESPONDING VALUE) [YEAR] | SUPPLY SIDE GAS TOTAL FLOW RATE [NL/min] | SUPPLY SIDE MONO-SILANE CONCENTRATION [vol %] | PUMP NITROGEN ADDITION AMOUNT [NL/min] | PERMEATION SIDE PRESSURE [kPa] | TEMPERATURE [° C.] | PERMEATION SIDE MONO-SILANE CONCENTRATION vol % | HYDROGEN RECOVERY RATE [%] | REMARK |
|---|---|---|---|---|---|---|---|---|---|
| | 19.0 | 30 | 6.7 | 10 | −100 | −10 | 0.007 | 62.6 | |
| | 19.0 | 30 | 6.7 | 10 | −100 | −7.5 | 0.007 | 64.6 | PRESSURE REDUCTION ACCELERATED DEGRADATION TEST |
| | | 1500 | 6.7 | 500 | −100 | −7.5 | | | |
| | 20.1 | 30 | 6.7 | 10 | −100 | −7.5 | 0.007 | 59.7 | END |

TABLE 10

| TEST CONDITION | NUMBER OF YEARS IN USE (CORRESPONDING VALUE) [YEAR] | SUPPLY SIDE GAS TOTAL FLOW RATE [NL/min] | SUPPLY SIDE MONO-SILANE CONCENTRATION [vol %] | PUMP NITROGEN ADDITION AMOUNT [NL/min] | PERMEATION SIDE PRESSURE [kPa] | TEMPERATURE [° C.] | PERMEATION SIDE MONO-SILANE CONCENTRATION [vol %] | HYDROGEN RECOVERY RATE [%] | REMARK |
|---|---|---|---|---|---|---|---|---|---|
| $C_2 = 1.0$ | 0 | 30 | 6.7 | 10 | −90 | 30 | 0.039 | 96.2 | INITIAL |
| | | 1500 | 6.7 | 500 | −90 | 30 | | | ACCELERATED DEGRADATION TEST |
| | 8.7 | 30 | 6.7 | 10 | −90 | 30 | 0.023 | 86.6 | |
| | 8.7 | 30 | 6.7 | 10 | −90 | 40 | 0.029 | 89.8 | PRESSURE REDUCTION ACCELERATED DEGRADATION TEST |
| | | 1500 | 6.7 | 500 | −90 | 40 | | | |
| | 12.3 | 30 | 6.7 | 10 | −90 | 40 | 0.022 | 80.8 | |
| | 12.3 | 30 | 6.7 | 10 | −90 | 50 | 0.027 | 84.8 | PRESSURE REDUCTION ACCELERATED DEGRADATION TEST |
| | | 1500 | 6.7 | 500 | −90 | 50 | | | |
| | 14.5 | 30 | 6.7 | 10 | −90 | 50 | 0.022 | 76.3 | |
| | 14.5 | 30 | 6.7 | 10 | −90 | 60 | 0.027 | 80.5 | PRESSURE REDUCTION ACCELERATED DEGRADATION TEST |
| | | 1500 | 6.7 | 500 | −90 | 60 | | | |
| | 16.0 | 30 | 6.7 | 10 | −90 | 60 | 0.023 | 72.5 | |
| | 16.0 | 30 | 6.7 | 10 | −90 | 70 | 0.028 | 76.7 | PRESSURE REDUCTION ACCELERATED DEGRADATION TEST |
| | | 1500 | 6.7 | 500 | −90 | 70 | | | |
| | 17.2 | 30 | 6.7 | 10 | −90 | 70 | 0.024 | 69.0 | |
| | 17.2 | 30 | 6.7 | 10 | −90 | 80 | 0.028 | 73.2 | PRESSURE REDUCTION ACCELERATED DEGRADATION TEST |
| | | 1500 | 6.7 | 500 | −90 | 80 | | | |
| | 18.7 | 30 | 6.7 | 10 | −90 | 80 | 0.023 | 59.9 | END |
| $C_2 = 0.25$ | 0 | 30 | 6.7 | 10 | −90 | 30 | 0.039 | 96.2 | INITIAL |
| | | 1500 | 6.7 | 500 | −90 | 30 | | | ACCELERATED DEGRADATION TEST |
| | 8.7 | 30 | 6.7 | 10 | −90 | 30 | 0.023 | 86.6 | |
| | 8.7 | 30 | 6.7 | 10 | −90 | 32.5 | 0.024 | 87.5 | PRESSURE REDUCTION ACCELERATED DEGRADATION TEST |
| | | 1500 | 6.7 | 500 | −90 | 32.5 | | | |
| | 11.9 | 30 | 6.7 | 10 | −90 | 32.5 | 0.019 | 78.7 | |
| | 11.9 | 30 | 6.7 | 10 | −90 | 35 | 0.020 | 79.9 | PRESSURE REDUCTION ACCELERATED DEGRADATION TEST |
| | | 1500 | 6.7 | 500 | −90 | 35 | | | |

TABLE 10-continued

| TEST CONDITION | NUMBER OF YEARS IN USE (CORRE- SPONDING VALUE) [YEAR] | SUPPLY SIDE GAS TOTAL FLOW RATE [NL/min] | SUPPLY SIDE MONO- SILANE CONCEN- TRATION [vol %] | PUMP NITROGEN ADDITION AMOUNT [NL/min] | PERME- ATION SIDE PRES- SURE [kPa] | TEMPER- ATURE [° C.] | PERME- ATION SIDE MONO- SILANE CONCEN- TRATION [vol %] | HYDROGEN RECOVERY RATE [%] | REMARK |
|---|---|---|---|---|---|---|---|---|---|
| | 13.8 | 30 | 6.7 | 10 | −90 | 35 | 0.017 | 71.9 | |
| | 13.8 | 30 | 6.7 | 10 | −90 | 37.5 | 0.018 | 73.2 | PRESSURE REDUCTION ACCELERATED DEGRADATION TEST |
| | | 1500 | 6.7 | 500 | −90 | 37.5 | | | |
| | 15.2 | 30 | 6.7 | 10 | −90 | 37.5 | 0.016 | 65.9 | |
| | 15.2 | 30 | 6.7 | 10 | −90 | 40 | 0.017 | 67.3 | PRESSURE REDUCTION ACCELERATED DEGRADATION TEST |
| | | 1500 | 6.7 | 500 | −90 | 40 | | | |
| | 16.4 | 30 | 6.7 | 10 | −90 | 40 | 0.016 | 60.0 | END |

(Third Embodiment)

Figure 28:
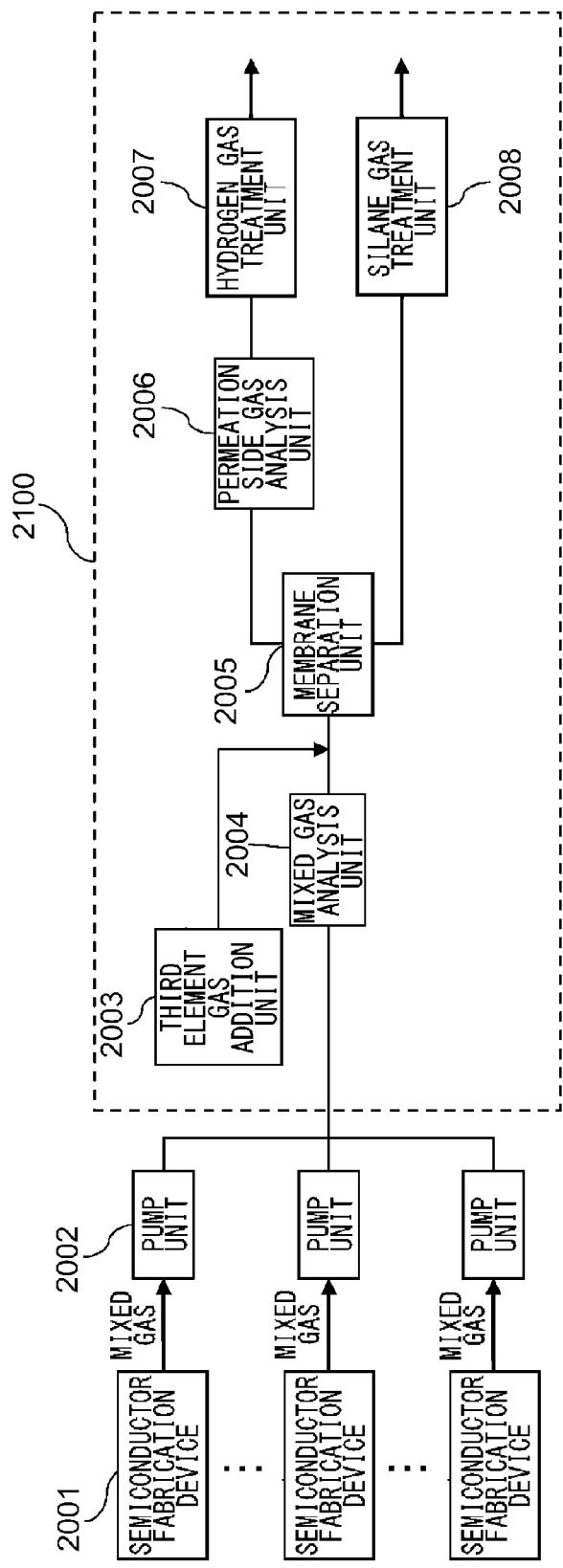
FIG. 28 is a schematic diagram illustrating a configuration of an exhaust gas treatment system according to a third embodiment.
Figure 29:
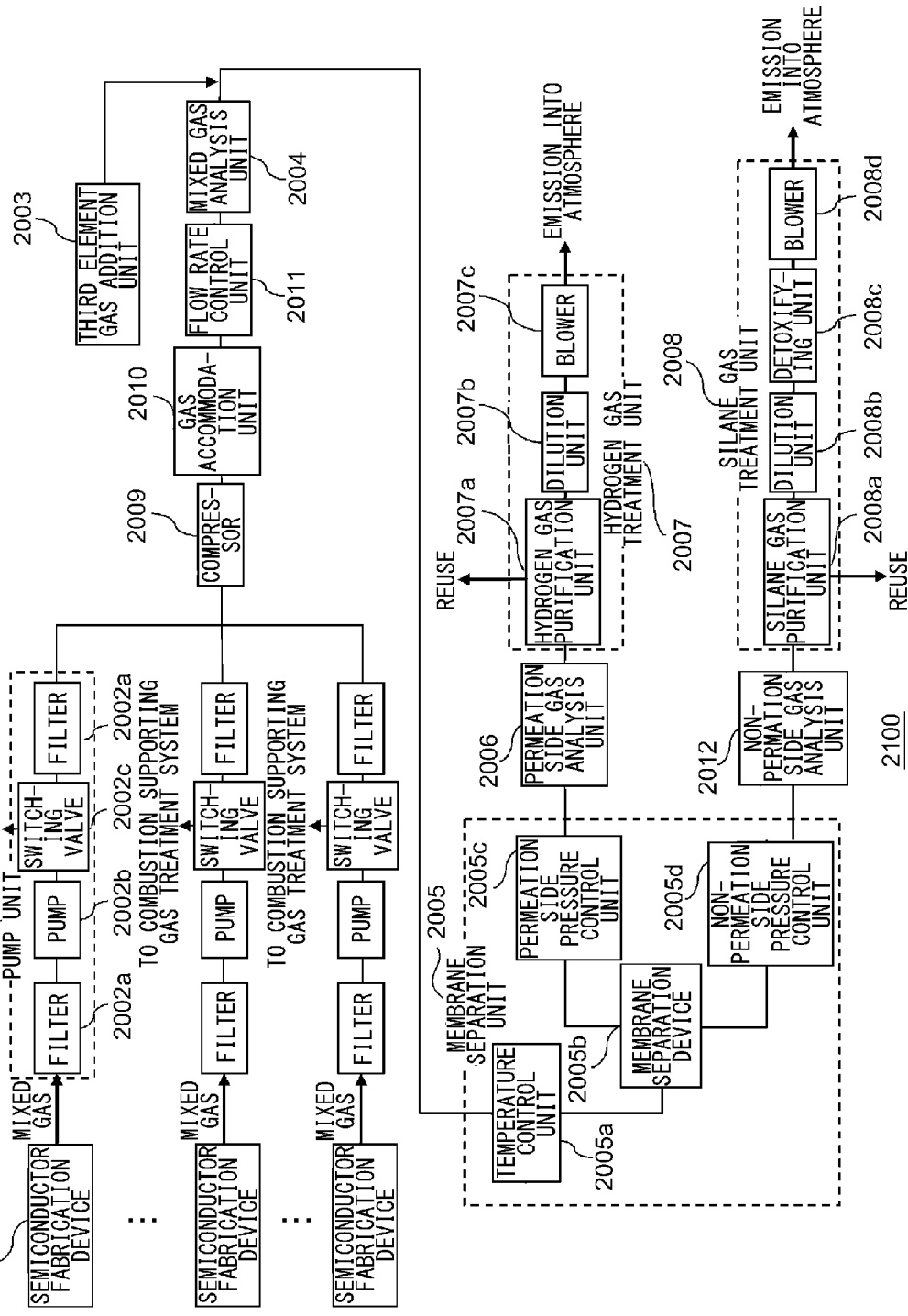
FIG. 29 is a system diagram more specifically illustrating the configuration of the exhaust gas treatment system according to the third embodiment.
Figure 30:
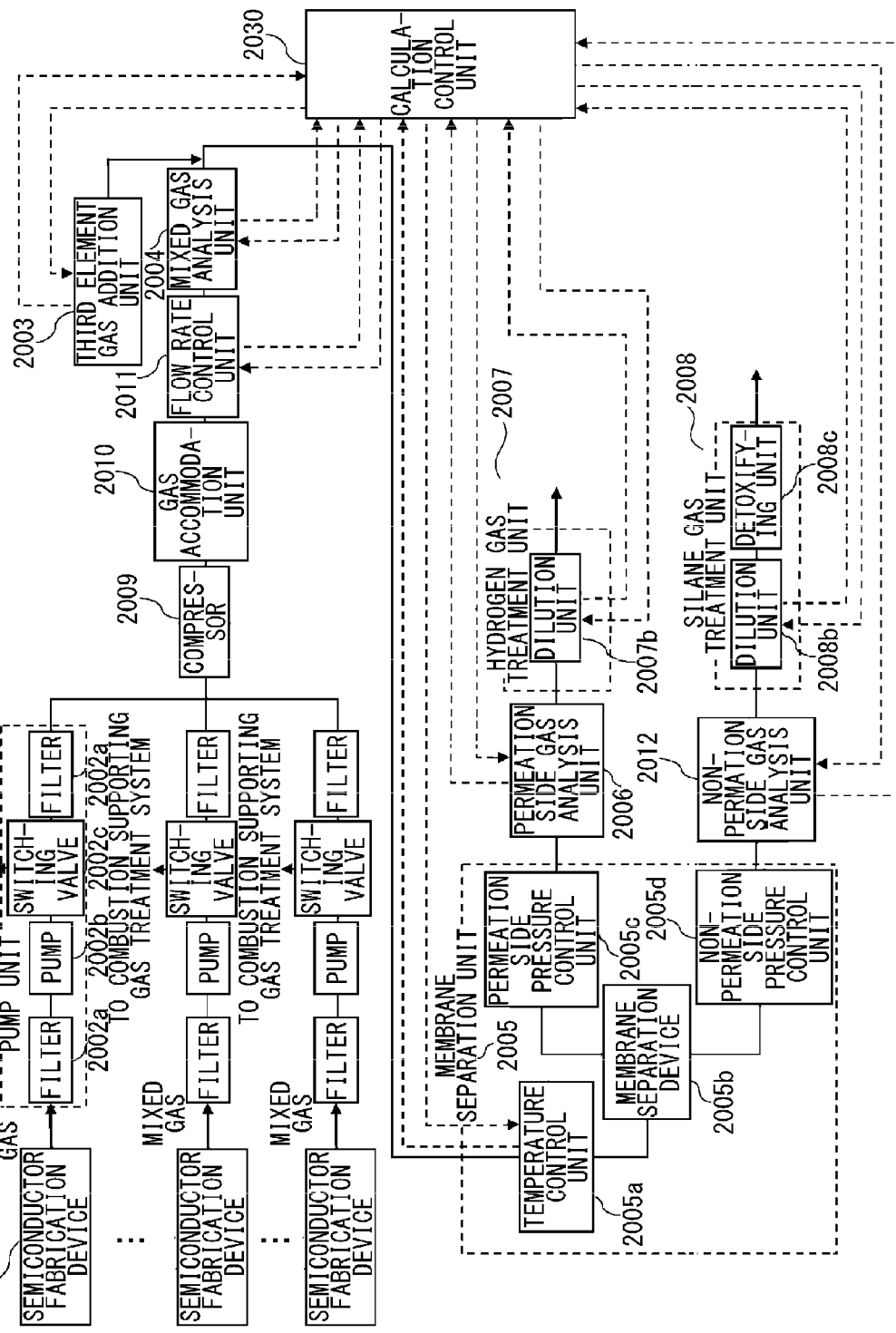
FIG. 30 is a system diagram illustrating an example of data processing of the respective components of the exhaust gas treatment system according to the third embodiment.
Figure 31:
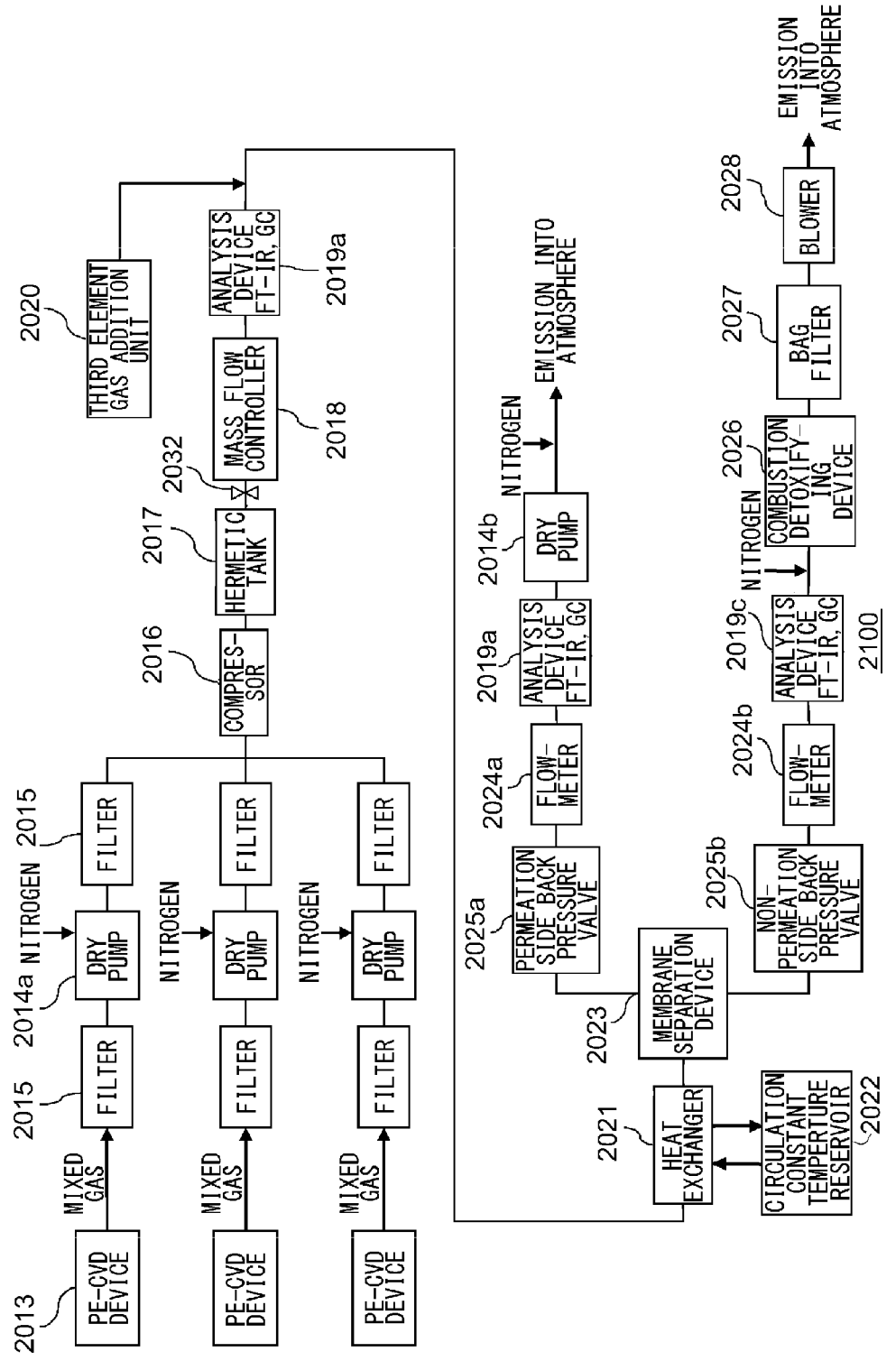
FIG. 31 is a schematic diagram illustrating an exhaust gas treatment system used in Example 3.

FIG. 28 is a schematic diagram illustrating a configuration of an exhaust gas treatment system according to a third embodiment. FIG. 29 is a system diagram more specifically illustrating a configuration of the exhaust gas treatment system according to the embodiment. FIG. 30 is a system diagram illustrating an example of data processing of the respective components of the exhaust gas treatment system according to the embodiment. As illustrated in FIG. 31, an exhaust gas treatment system. 2100 according to the third embodiment includes at least a third element gas addition unit 2003 which controls an addition amount of a third element gas added to a mixed gas containing at least hydrogen and monosilane discharged from a semiconductor fabrication equipment 2001 through the pump unit 2002, a mixed gas analysis unit 2004 which measures the total flow rate of the mixed gas and the concentration of the hydrogen and the monosilane in the mixed gas, a membrane separation unit 2005 which separates the monosilane and the hydrogen from the mixed gas, a permeation side gas analysis unit 2006 which measures the flow rate of the gas separated by the membrane separation unit 2005 and the concentration of the hydrogen and the monosilane, a hydrogen gas treatment unit 2007 which treats the hydrogen separated by the membrane separation unit 2005, and a silane gas treatment unit 2008 which treats the monosilane separated by the membrane separation device.

The semiconductor fabrication equipment 2001 is not particularly limited, but a plasma CVD device or the like which forms a film by thin-film silicon used in a solar cell may be exemplified.

The composition of the mixed gas discharged from the semiconductor fabrication equipment 2001 is not particularly limited, but for example, contained are monosilane which need to be detoxified, hydrogen which does not need to be detoxified, nitrogen, and a small amount of impurities. As the small amount of impurities, high-order silane including plural Si such as disilane or trisilane, $PH_3$, $B_2H_6$ (which are respectively 0.001 to 1%), and nitrogen may be exemplified.

The pump unit 2002 suctions the mixed gas discharged from the semiconductor fabrication equipment 2001, and sends the mixed gas to the mixed gas analysis unit 2004 of the rear stage. The type of pump to be used is not particularly limited, but a dry pump is used in the semiconductor fabrication equipment in many cases. The dry pump may introduce a purging gas for the purpose of maintaining air-tightness, preventing unnecessary deposited material, preventing the corrosion inside the pump, and improving the emission performance. The purging gas is not particularly limited, but an inert gas such as nitrogen or argon is used in many cases. Further, even the introduction amount of the purging gas is not particularly limited, but in general, the introduction amount is 10 to 50 NL/min for each pump.

Further, as illustrated in FIG. 29, a filter 2002a may be provided at the front stage and/or the rear stage of a pump 2002b. In particular, when a comparatively large amount of fine particles such as high-order silane exist in the exhaust gas, it is desirable to provide the filter 2002a. The filter 2002a is a fine particle capturing filter which selectively removes fine particles such as high-order silane contained in the mixed gas. The filter to be used is not particularly limited, but a vortex filter or the like may be used.

Further, in the semiconductor fabrication equipment 2001, chemical cleaning may be performed so as to remove a deposited material produced inside a chamber due to the film forming. In the chemical cleaning, it is general to perform a plasma treatment under the introduction of a gas such as $NF_3$ or $F_2$ so as to remove a silicon thin film deposited in the chamber. However, since such a gas has a combustion supporting property, there is a need to prevent the gas from contacting a combustible gas such as hydrogen or monosilane, and hence it is desirable to provide a switching valve 2002c in rear of the pump 2002b as in a case of FIG. 29. Accordingly, when the exhaust gas of the chemical cleaning comes out, a combustion supporting gas treatment system is selected, so that such an exhaust gas is prevented from being mixed with a treatment line of a silane gas. Furthermore, in the switching valve, such a mechanism may be built in the pump.

The third element gas addition unit 2003 is provided so as to adjust the concentration of the monosilane in the mixed gas by adding a predetermined amount of a third element gas to the mixed gas. The third element gas to be added is not particularly limited if the gas does not abruptly react with the element gas such as the monosilane in the mixed gas, but for example, nitrogen, argon, hydrogen, helium, xenon, a hydrocarbon gas having a carbon number of 1 to 4, and the like may be exemplified.

The mixed gas analysis unit 2004 and the permeation side gas analysis unit 2006 are one of the hydrogen recovery rate acquisition units, and are provided so as to measure at least the flow rates of the mixed gas and the permeation side gas separated by the membrane separation unit and the concentration of the hydrogen and the monosilane. In the gas analysis units, the method is not particularly limited if the flow rate of the gas and the concentration of the hydrogen and the monosilane may be measured. For example, a general dry type or wet type flowmeter may be used for the flow rate. Further, in the measurement of the concentration of the hydrogen and the monosilane, an FT-IR with a gas circulation type sample cell, an on-line type gas chromatograph, or the like may be used.

From the measurement result, the recovery rate (the hydrogen recovery rate) of the hydrogen gas may be calculated according to Equation (3-4).

$$\text{Hydrogen recovery rate}(\%)=100\times(A/100\times B))/(C/100\times D) \quad \text{Equation (3-4)}$$

Here, A indicates the concentration of the hydrogen (permeation side hydrogen concentration) (vol %) of the permeation side gas, B indicates the flow rate of the permeation side gas (permeation side total gas flow rate) (L/min), C indicates the concentration of the hydrogen (supply side hydrogen concentration) (vol %) of the mixed gas supplied to the membrane separation device, and D indicates the flow rate (supply side total gas flow rate) (L/min) of the mixed gas supplied to the membrane separation device.

As illustrated in FIG. 29, the membrane separation unit 2005 includes a temperature control unit 2005$a$ which controls the temperature of the mixed gas supplied to a membrane separation device 2005$b$, the membrane separation device 2005$b$, a permeation side pressure control unit 2005$c$ and/or a non-permeation side pressure control unit 5$d$.

The temperature control unit 2005$a$ is not particularly limited if a function of cooling or heating the mixed gas is provided, but an electric heater, various heat exchangers, or the like may be exemplified. The membrane separation device 2005$b$ is a membrane through which hydrogen selectively permeate. There is no particular limitation if metal elements, for example, palladium, nickel, and the like reacting with monosilane are not contained as a main element, and various semipermeable membranes may be exemplified. The semipermeable membrane includes, for example, a dense layer through which hydrogen selectively permeates and a porous base material which supports the dense layer. As the shape of the semipermeable membrane, a flat membrane, a spiral membrane, and a hollow fiber membrane may be exemplified. Among these, the hollow fiber membrane is more desirable.

As the material used in the dense layer, polyimide, polysiloxane, polysilazane, acrylonitrile, polyester, cellulose polymer, polysulfone, polyalkylene glycol, polyethylene, polybutadiene, polystyrene, polyvinylhalide, polyvinylidene halide, polycarbonate, and block copolymers having several repeating units of these may be exemplified.

As the material used in the base material, an inorganic material such as glass, ceramic, and sintered metal and a porous organic material may be exemplified. As the porous organic material, polyether, polyacrylonitrile, polyether, poly (arylene oxide), polyetherketone, polysulfide, polyethylene, polypropylene, polybutene, polyvinyl, and the like may be exemplified.

Next, a permeation side pressure control unit 2005$c$ and a non-permeation side pressure control unit 2005$d$ are used to respectively control the permeation side pressure and the non-permeation side pressure of the membrane separation device 2005$b$. When the pressure of the mixed gas supplied to the membrane separation device 5$b$ is low so as to be about the atmospheric pressure, a pressure control device such as a back pressure valve and a dry pump causing the permeation side of the membrane separation device to be a vacuum of the atmospheric pressure or less are provided in the permeation side pressure control unit 2005$c$ so as to ensure a sufficient differential pressure with respect to a supply pressure and to control the permeation side pressure at a constant value. When the pressure of the mixed gas supplied to the membrane separation device 2005$b$ is sufficiently high (a pressure increasing unit is provided in the flow rate control unit), the permeation side pressure control unit and the non-permeation side pressure control unit are respectively provided with a device such as a back pressure valve which maintains a constant pressure, and the non-permeation side pressure and the permeation side pressure of the membrane separation device are controlled at a constant value.

The flow rate, the pressure, and the temperature of the mixed gas supplied to the membrane separation device 2005$b$, the concentration of the monosilane gas, the addition amount of the third element gas, and the non-permeation side pressure and the permeation side pressure of the membrane separation device 2005$b$ are not particularly limited. For example, as the flow rate, the flow rate is 5 NL/min to 500 NL/min with respect to the capacity of 1 L of the membrane separation device, and is desirably 10 NL/min to 100 NL/min. As the pressure, −90 kPaG to 1.0 MPaG is desirable. As the temperature, about −20° C. to 100° C. is desirable. As the concentration of the monosilane gas, 30 vol % or less, desirably 20 vol % or less, more desirably, 10 vol % or less is desirable. As the addition amount of the third element gas, 1 to 100 NL/min is desirable, and desirably, 1 to 50 NL/min is desirable. As the non-permeation side pressure of the membrane separation device 5$b$, −90 kPaG to 0.85 MPaG is desirable. As the permeation side pressure, −100 kPaG to 0.9 MPaG is desirable. Here, the capacity of the membrane separation device indicates the volume of the portion in which the separation membrane is sufficiently charged inside the membrane separation device.

In fact, the membrane separation conditions are closely concerned with each other. For example, in a case of the membrane separation capacity of 1 L, the supply flow rate to the membrane separation device is desirably 20 NL/min to 50 NL/min, the concentration of the monosilane gas is desirably 10 vol % or less, the pressure is desirably the atmospheric pressure or more, the temperature is desirably 10° C. to 40° C., the addition amount of the third element gas is desirably 1 to 10 NL/min, and the permeation side pressure of the membrane separation device is desirably −100 kPaG to −60 kPaG.

The respective gases separated by the membrane separation device 2005$b$ are sent to the hydrogen gas treatment unit 2007 and the silane gas treatment unit 2008. In the hydrogen gas treatment unit 2007, the simply collected hydrogen is used for fuel. For example, as illustrated in FIG. 29, the separated gas may be diluted by nitrogen, air, or the like in a dilution unit 2007$b$ so that the concentration of the monosilane in the collected gas becomes the allowable concentration or less (5 ppmv or less), and may be emitted to the outside. Further, at the dilution time, it is desirable to dilute the hydrogen so that the concentration of the hydrogen becomes an explosion lower limit or less (4 vol % or less) from the viewpoint of safety. The dilution rate of the dilution unit 2007$b$ is not particularly limited if at least the concentration of the monosilane satisfies 5 ppmv or less. When the dilution rate is controlled based on a measurement result of the permeation side gas analysis unit, the dilution rate may be effectively controlled without any consumption. The separated gas which is diluted by the dilution unit 2007$b$ is discharged to the outside by a blower 2007$c$. Further, in order to reduce the concentration of the monosilane in the collected gas, a mechanism (not illustrated) may be further provided which selectively detoxifies the monosilane. A detoxifying agent which selectively performs a detoxifying treatment is not particularly limited, but an oxidizing agent, an adsorbing agent, or the like may be exemplified. Further, a hydrogen gas purification unit 2007a may be provided so that the hydrogen is purified and used again.

Further, in the silane gas treatment unit 2008, for example, monosilane as a toxic gas is diluted by a dilution unit 2008b in accordance with the specification of the device of a detoxifying unit 2008c as a detoxifying device so as to be a predetermined concentration, and is introduced into the detoxifying unit 2008c, so that the monosilane is detoxified to be an allowable concentration or less and is discharged to the outside by the blower 2008d. Furthermore, a silane gas purification unit 2008a may be provided so that the monosilane is purified and used again.

Further, in the exhaust gas treatment system 2100 according to the embodiment, a non-permeation side gas analysis unit 2012 is provided so as to measure the flow rate of the non-permeation side monosilane rich gas separated by the membrane separation device 2005b, the concentration of the monosilane, and the like, which may be reflected to the operation condition of the silane gas treatment unit 2008 of the rear stage.

For example, when the collected monosilane is detoxified and emitted by the silane gas treatment unit 2008, there is a need to dilute the collected monosilane to become a predetermined concentration in accordance with the specification of the detoxifying device. However, when there is data of the non-permeation side gas analysis unit at this time, it is possible to prevent the monosilane from being uselessly diluted too much or prevent a problem occurring in the detoxifying device due to the insufficient dilution.

Further, when the silane gas treatment unit 2008 is provided with the silane gas purification unit 2008a and the monosilane gas is purified and used again, the non-permeation side gas analysis unit 2012 may be used to analyze a small amount of impurities in the collected monosilane by a gas chromatograph or the like other than the flow rate and the concentration of the monosilane. When the condition of the optimal purification treatment is selected or the amount of impurities is too large, the purification treatment is not performed and the detoxifying treatment may be selected. At this time, it is desirable to provide a valve at the rear stage of the gas analysis unit so as to switch the detoxifying unit and the reuse line.

Further, when the operation condition of the semiconductor fabrication equipment, and particularly, the flow rate or the pressure largely changes or when the exhaust gases of plural semiconductor fabrication equipments having different operation conditions are collectively treated, as illustrated in FIG. 29, it is desirable to provide a compressor 2009, a gas accommodation unit 2010, and a flow rate control unit 2011 so as to control the flow rate of the mixed gas supplied to the membrane separation unit 2005 at a constant value.

The compressor 2009 is not particularly limited, but a diaphragm type compressor, a centrifugal compressor, an axial flow compressor, a reciprocating compressor, a twin screw compressor, a single screw compressor, a scroll compressor, a rotary compressor, and the like may be exemplified. Among these, the diaphragm type compressor is more desirable.

The operation condition of the compressor 2009 is not particularly limited, but it is desirable to perform the operation so that the temperature of the compressed mixed gas becomes equal to or lower than 200° C. which is a decomposition temperature of monosilane. That is, when it is supposed that the mixed gas discharged from the pump unit 2002 is compressed from normal pressure, it is desirable to operate the compressor so that the compression ratio becomes equal to or lower than 4.4.

The compressor configuration used in the compressor 2009 is not particularly limited, but in order to stably operate the compressor even when the flow rate of the mixed gas supplied to the compressor changes, it is desirable to have a configuration in which inverters are provided in parallel or a spillback type configuration in which the mixed gas once compressed by the compressor is returned to the suction side of the compressor again.

The gas accommodation unit 2010 is used to collect the mixed gas in a tank or the like having a sufficient capacity when the flow rate or the pressure of the mixed gas discharged from the semiconductor fabrication equipment 2001 through the pump unit 2002 is not stable or the exhaust gases from the plural semiconductor fabrication equipments 2001 is collectively treated. Accordingly, a change in flow rate and pressure of the mixed gas discharged from the respective semiconductor fabrication equipments 2001 is averaged, and the mixed gas having a constant flow rate and a constant pressure at all times is circulated to the membrane separation unit 2005. Further, a function of removing fine particles contained in the mixed gas may be provided by devising a structure.

The size of the tank used in the gas accommodation unit 2010 is not particularly limited. However, in a case of one semiconductor fabrication equipment, it is desirable that the size of the tank is the maximum flow rate of the equipment. Then, in a case where plural semiconductor fabrication equipments are collectively treated, it is desirable that the size of the tank is equal to or more than the sum of the maximum flow rates of the gases supplied to the respective semiconductor fabrication equipments.

The pressure inside the tank used in the gas accommodation unit 2010 is not particularly limited, but it is desirable that the pressure is 1 MPaG at maximum. Further, when the operation of the equipment starts, it is desirable that the exhaust gas is supplied from the compressor 2009 to the gas accommodation unit 2010 and is accumulated in the gas accommodation unit 2010 while the outlet valve of the gas accommodation unit 2010 is closed. Accordingly, even when the flow rate of the exhaust gas of the semiconductor fabrication equipment largely changes, it is possible to maintain a pressure sufficient for maintaining the supply flow rate to the separation device to be constant and to increase the amount of a gas which may be accommodated in the gas accommodation unit 2010. Accordingly, it is possible to decrease the volume of the gas accommodation unit. Further, when a sufficient pressure is accumulated, the non-permeation side pressure of the membrane separation device may be set to be high, which is advantageous in operation due to a sufficient differential pressure with respect to the permeation side.

The flow rate control unit 2011 is used to control the flow rate of the mixed gas at a constant value. The control method is not particularly limited, but it is desirable that the control method is not influenced by a change in pressure of the mixed gas supplied to the flow rate control unit 2011, for example, a mass flow controller or the like may be exemplified.

According to the exhaust gas treatment system 2100 of the embodiment, the degradation state of the membrane separation device 2006b may be recognized by monitoring the hydrogen recovery rate calculated by the hydrogen recovery rate acquisition unit. Accordingly, the operation may be performed while maintaining the high hydrogen recovery rate at all times by controlling the addition amount of the third element gas, the temperature of the mixed gas supplied to the membrane separation device 2006*b*, or the permeation side pressure of the membrane separation device according to the following equations (3-1) to (3-3) with the degradation in the hydrogen recovery rate.

Furthermore, as the control method, a control of satisfying only the equation (3-1), a control of satisfying one of the equation (3-1), the equation (3-2), and the equation (3-3), and a control of satisfying all of the equation (3-1) to the equation (3-3) may be adopted. Further, when the operation is performed by the control, the hydrogen recovery rate may become 60% or more and the concentration of the monosilane of the permeation side gas may become 1.0% or less.

$$\Delta F = C_1 \times \Delta A,\ C_1 \geq 0.3 \qquad \text{Equation (3-1)}$$

Here, $\Delta A$ indicates a decrease rate (%) of the hydrogen recovery rate, and $\Delta F$ indicates a decrease amount (L/min) of the addition amount of the third element gas.

$$\Delta P = C_2 \times \Delta A,\ C_2 \geq 0.5 \qquad \text{Equation (3-2)}$$

Here, $\Delta A$ indicates a decrease rate (%) of the hydrogen recovery rate, and $\Delta P$ indicates a pressure decrease amount (kPa) from the permeation side pressure of the membrane separation device 5*b*.

$$\Delta T = C_3 \times \Delta A,\ C_3 \geq 0.8 \qquad \text{Equation (3-3)}$$

Here, $\Delta A$ indicates a decrease rate (%) of the hydrogen recovery rate, and $\Delta T$ indicates a temperature increase amount (° C.) of the mixed gas.

Furthermore, the above-described control is performed by using a calculation control unit 2030 illustrated in FIG. 30. Further, the calculation control unit 2030 may control the flow rate of the mixed gas using the flow rate control unit 2011 based on the flow rate of the controlled mixed gas, the measurement result of the concentration of the monosilane in the mixed gas obtained by the mixed gas analysis unit 2004, and the capacity of the membrane separation device.

Further, the calculation control unit 2030 may calculate the hydrogen recovery rate based on the flow rate value of the mixed gas obtained by the flow rate control unit 2011, the measurement result of the concentration of the monosilane in the mixed gas obtained by the mixed gas analysis unit 2004, and the measurement result of the flow rate of the permeation side gas and the concentration of the monosilane in the permeation side gas obtained by the permeation side gas analysis unit 2006.

The calculation control unit 2030 may control the temperature of the mixed gas supplied to the membrane separation unit 2005, the non-permeation side pressure and the permeation side pressure of the membrane separation unit 2005, and the addition amount of the third element gas with respect to the decrease amount of the calculated hydrogen recovery rate.

Further, the calculation control unit 2030 may determine how the operation condition of the hydrogen gas purification unit is or whether the collected hydrogen gas will be used again based on the measurement result of the flow rate of the permeation side gas and the concentration of the monosilane in the permeation side gas obtained by the permeation side gas analysis unit 2006. When the calculation control unit 2030 determines that the collected hydrogen gas will not be used again, the calculation control unit may control the dilution rate of the dilution unit 2007*b* of the hydrogen gas treatment unit 2007 so that the concentration of the monosilane becomes the allowable concentration (5 ppmv or less).

Further, the calculation control unit 2030 may determine how the operation condition of the monosilane purification unit is or whether the collected monosilane will be used again based on the measurement result of the flow rate of the non-permeation side gas and the concentration of the monosilane in the non-permeation side gas obtained by the non-permeation side gas analysis unit 2012. When the calculation control unit 2030 determines that the collected monosilane will not be used again, the calculation control unit may control the dilution rate of the dilution unit 2008*b* of the silane gas treatment unit 2008 so that the concentration of the monosilane becomes the allowable concentration (for example, about 2 vol %) or less of the detoxifying device.

According to the exhaust gas treatment system of the third embodiment, the mixed gas containing at least the hydrogen and the monosilane is separated by the separation membrane into the monosilane which needs to be detoxified and the hydrogen which does not need to be detoxified. When the hydrogen and the monosilane separated from the mixed gas are respectively treated, a treatment instrument may be decreased in size, and further the exhaust gas treatment system may be made to be compact.

Further, the temperature may be controlled in a comparatively mild condition by adding the third element gas, whereby energy may be saved. The degradation in the separation performance with the degradation of the membrane separation device may be suppressed by controlling the addition amount of the third element gas, whereby the high separation performance may be maintained for a long period of time.

Accordingly, it is possible to decrease the size of the equipment which treats the exhaust gas discharged from the plasma CVD device that forms a film of thin-film silicon used in a solar cell. Further, it is possible to efficiently treat the exhaust gas discharged from the plasma CVD device that forms a film of thin-film silicon used in a solar cell.

Hereinafter, the embodiment will be described in detail based on Example, but the embodiment is not limited to the example.

FIG. 31 is a system diagram illustrating a configuration of an exhaust gas treatment system of Example 3. As illustrated in FIG. 31, the exhaust gas treatment system according to the third embodiment is connected to three thin-film silicon solar cell manufacturing CVD devices which is one of the semiconductor fabrication equipments 1. The exhaust gas treatment system 2100 suctions the mixed gas discharged from plural PE-CVD devices 2013 together with nitrogen introduced from the outside by a dry pump 2014*a* corresponding to each device, and sends the result toward a compressor 2016 through a filter 2015. Furthermore, a switching valve (not illustrated) may be provided behind the dry pump 2014*a*. Accordingly, when the exhaust gas of the chemical cleaning comes out, a combustion supporting gas treatment system is selected, so that such an exhaust gas is prevented from being mixed with a treatment line of a silane gas.

As the compressor 2016, a compressor is selected which may be operated at the compression ratio of 4. In a state where an accumulation valve 2032 is closed, the purging nitrogen of the dry pump 2014*a* flows at the flow rate of 30 NL/min, so that the pressure of the hermetic tank 2017 (capacity: m$^3$) increases to 0.3 MPaG. Subsequently, the accumulation valve 2032 is opened so that the supply of a gas to a mass flow controller 2018 starts and the respective PE-CVD devices 2013 are operated so as to be late by 4 minutes. The flow rate of the gas is controlled by the mass flow controller 2018, and the temperature thereof is adjusted to a predetermined temperature by a heat exchanger 2021, and then the gas is supplied to a membrane separation device 2023 (polyimide hollow fiber membrane). At this time, the permeation side pressure is adjusted to be a predetermined pressure by a permeation side back pressure valve 2025*a*. Further, the pressure is adjusted to be a normal pressure by the non-permeation side back pressure valve 2025b. Further, after the operation of the PE-CVD device starts, the amount of the purging nitrogen of the dry pump 2014a is adjusted to be a predetermined flow rate.

An analysis device 2019a is used to measure the concentration of the hydrogen and the monosilane in the mixed gas, and includes an FT-IR device with a gas cell and an on-line gas chromatograph (GC) device. As for the mixed gas of which the flow rate or the pressure is adjusted to be a predetermined value by the mass flow controller 2018, the concentration of the hydrogen and the monosilane is measured by the analysis device 2019a. After a predetermined amount of the third element gas is added by a third element gas addition unit 2020, the temperature of the mixed gas having the third element gas added thereto is controlled by the functions of the heat exchanger 2021 and a circulation constant temperature reservoir 2022, and the mixed gas flows into the membrane separation device 2023. Flowmeters 2024a and 2024b are respectively provided at the rear stages of the permeation side and the non-permeation side of the membrane separation device 2023.

In the exhaust gas treatment system illustrated in FIG. 31, the permeation side separated gas of the membrane separation device 2023 passes through the flowmeter 2024a and an analysis device 2019b, so that the flow rate and the concentration of the hydrogen and the monosilane are measured. The permeation side separated gas is diluted by nitrogen appropriately based on the measurement result, and is emitted into the atmosphere by the dry pump 2014b. On the other hand, the non-permeation side separated gas of the membrane separation device 2023 passes through the flowmeter 2024b and the analysis device 2019c, so that the flow rate and the concentration of the monosilane are detected, and the non-permeation side separated gas is combusted and detoxified by the combustion detoxifying device 2026. As for the gas which is combusted and discharged by the combustion detoxifying device 2026, foreign matter such as particles produced by the combustion are removed by a bag filter 2027, and the gas is emitted into the atmosphere by the blower 2028.

The exhaust gas treatment system with a configuration illustrated in FIG. 31 is connected to the thin-film silicon solar cell CVD device, and a change over time in hydrogen gas recovery rate is monitored while the operation is continued with several patterns of the flow rate and the concentration of the monosilane.

Figure 32A:
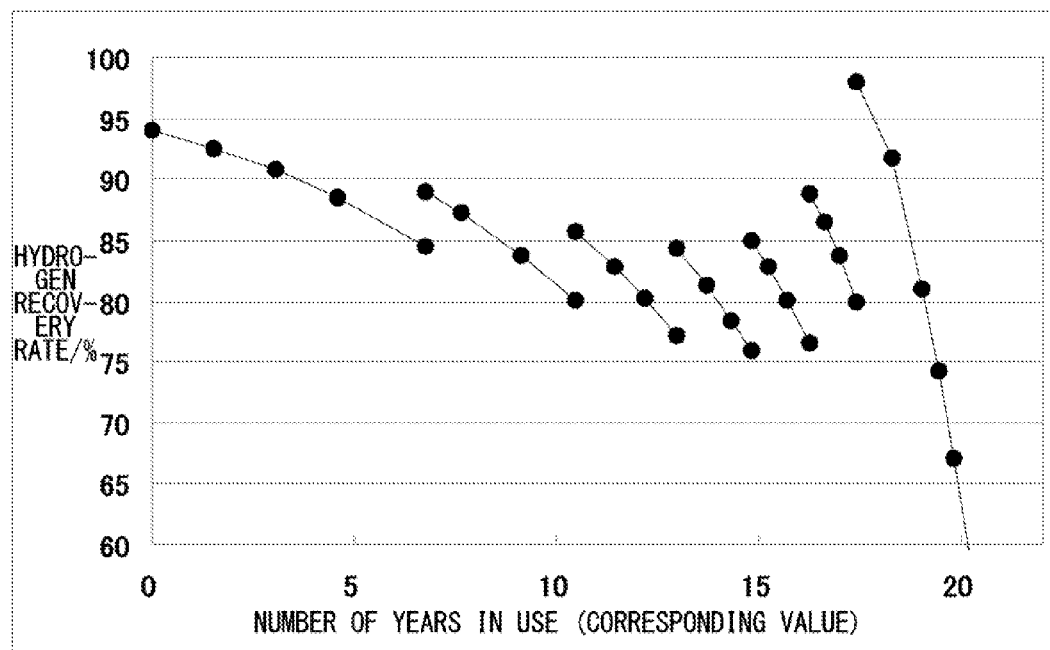
FIG. 32A is a graph illustrating a change in hydrogen recovery rate when the operation is performed with the adjustment of a nitrogen addition amount ($C_1$=0.5) on the condition that the purging nitrogen of the pump is not introduced.
Figure 32B:
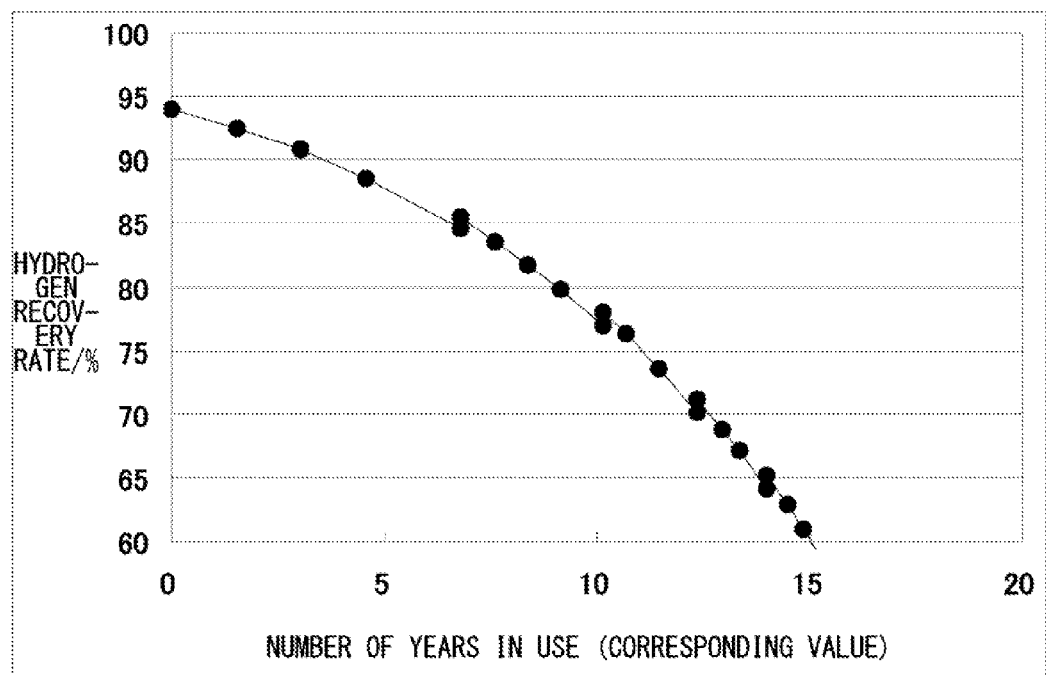
FIG. 32B is a graph illustrating a change in hydrogen recovery rate when the operation is performed with the adjustment of a nitrogen addition amount ($C_1$=0.1) on the condition that the purging nitrogen of the pump is not introduced.
Figure 32C:
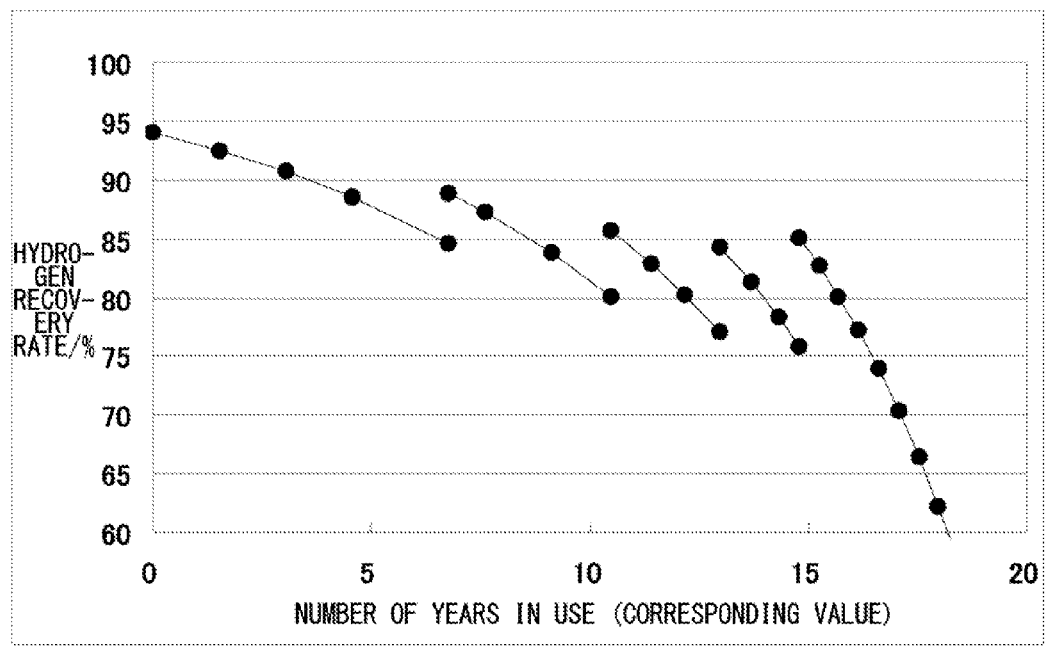
FIG. 32C is a graph illustrating a change in hydrogen recovery rate when the operation is performed with the adjustment of a nitrogen addition amount ($C_1$=0.5) on the condition that the purging nitrogen of the pump is introduced by 10 NL/min.
Figure 32D:
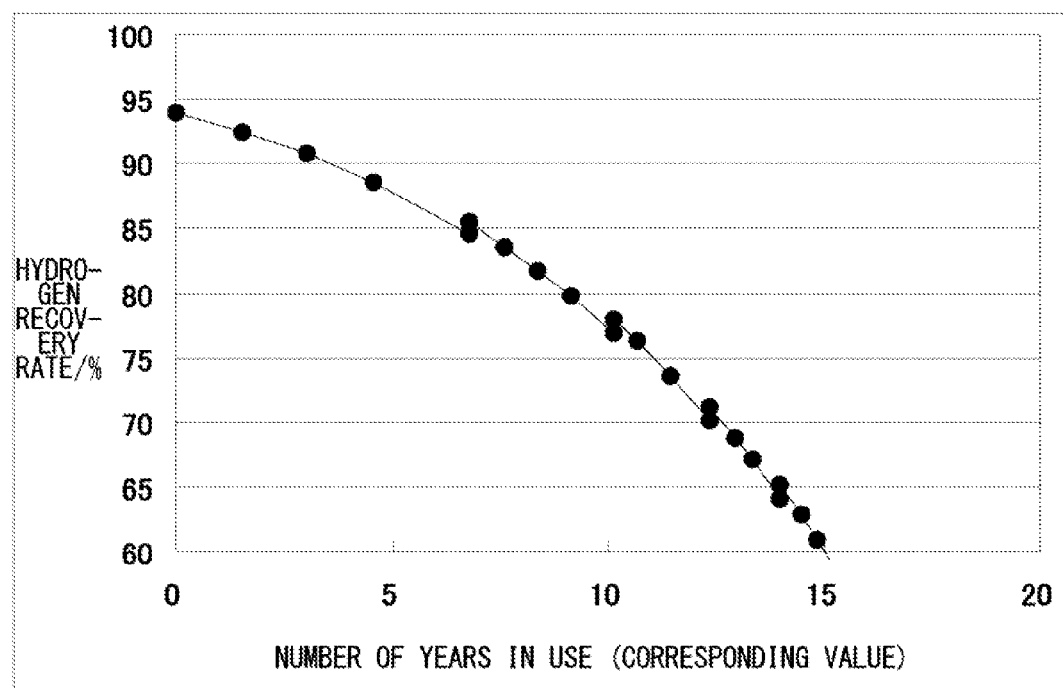
FIG. 32D is a graph illustrating a change in hydrogen recovery rate when the operation is performed with the adjustment of a nitrogen addition amount ($C_1$=0.1) on the condition that the purging nitrogen of the pump is introduced by 10 NL/min.
Figure 32E:
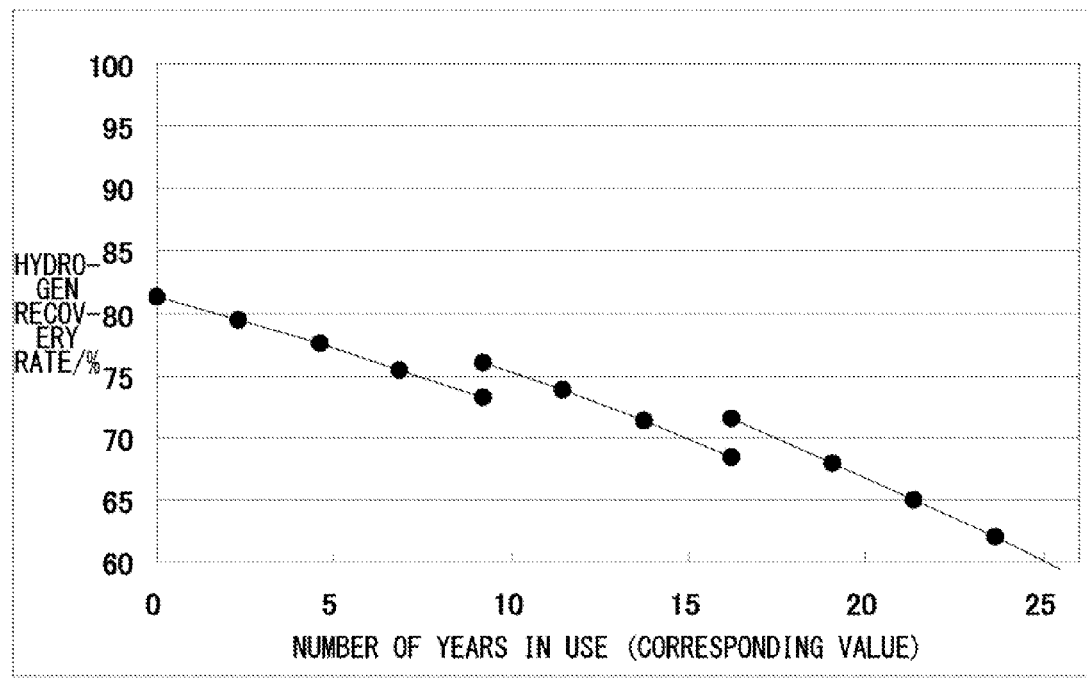
FIG. 32E is a graph illustrating a change in hydrogen recovery rate when the operation is performed with the adjustment of a nitrogen addition amount ($C_1$=1.0) on the condition that the purging nitrogen of the pump is introduced by 50 NL/min.
Figure 32F:
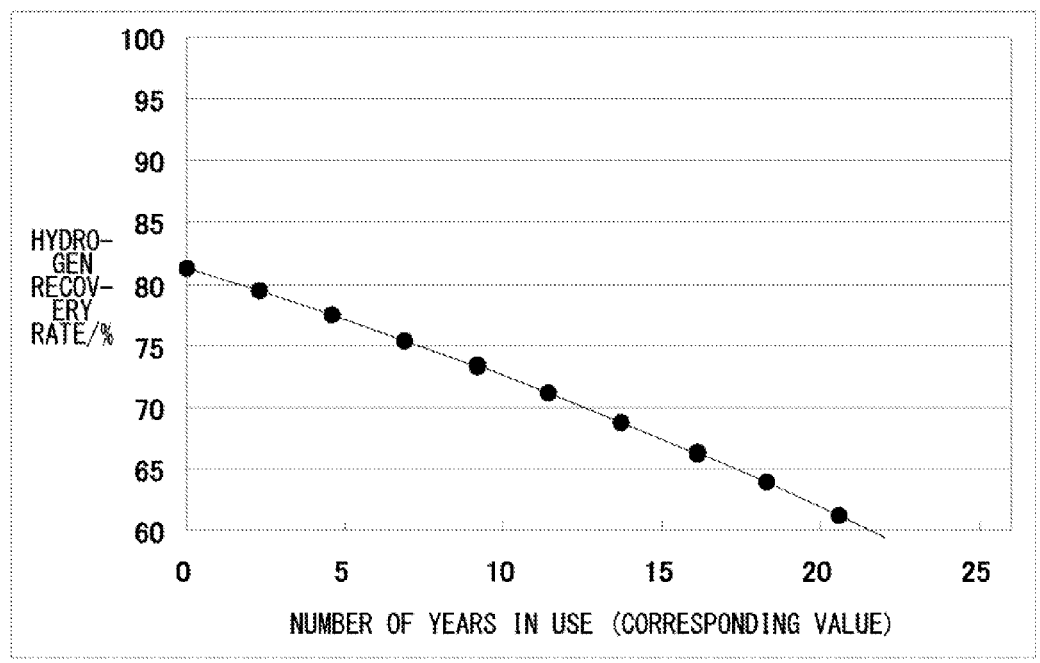
FIG. 32F is a graph illustrating a change in hydrogen recovery rate when the operation is performed with the adjustment of a nitrogen addition amount ($C_1$=0.1) on the condition that the purging nitrogen of the pump is introduced by 50 NL/min.

FIG. 32A is a graph illustrating a change in hydrogen recovery rate when the operation is performed with the adjustment of the nitrogen addition amount so as to satisfy the equation (3-1) ($C_1=0.5$) on the condition that the purging nitrogen of the pump is 0 NL/min. Further, for comparison, FIG. 32B illustrates the operation result when the equation (3-1) is not satisfied ($C_1=0.1$) on the condition that the purging nitrogen of the pump is 0 NL/min. The initial condition of the test is illustrated in Table 11. Table 14 illustrates the total result of a change in hydrogen recovery rate with respect to the number of years in use (corresponding value). Further, FIG. 32C is a graph illustrating a change in hydrogen recovery rate when the operation is performed with the adjustment of the nitrogen addition amount so as to satisfy the equation (3-1) ($C_1=0.5$) on the condition that the purging nitrogen of the pump is 10 NL/min. Further, for comparison, FIG. 32D illustrates the operation result when the operation is performed so as not to satisfy the equation (3-1) ($C_1=0.1$) on the condition that the purging nitrogen of the pump is 10 NL/min. The initial condition of the test is illustrated in Table 12. Table 15 illustrates the total result of a change in hydrogen recovery rate with respect to the number of years in use (corresponding value). Further, FIG. 32E is a graph illustrating a change in hydrogen recovery rate when the operation is performed with the adjustment of the nitrogen addition amount so as to satisfy the equation (3-1) ($C_1=1.0$) on the condition that the purging nitrogen of the pump is 50 NL/min. Further, for comparison, FIG. 32F illustrates the operation result when the operation is performed so as not to satisfy the equation (3-1) ($C_1=0.1$) on the condition that the purging nitrogen of the pump is 50 NL/min. The initial condition of the test is illustrated in Table 13. Table 16 illustrates the total result of a change in hydrogen recovery rate with respect to the number of years in use (corresponding value).

Furthermore, the number of years in use (corresponding value) is a value which is obtained by converting the operation time of the accelerated degradation test into the number of real years. The accelerated degradation test was performed so that the total flow rate of the supplied mixed gas is set to 50 times that of the normal test and the supplied monosilane gas concentration and the supplied nitrogen gas concentration are constant. The method of the accelerated degradation test is further written in Table 14, Table 15, and Table 16. From this result, it is found that the exhaust gas treatment system may be operated for a long period of time while maintaining the high hydrogen recovery rate by operating the exhaust gas treatment system so as to satisfy the equation (3-1).

TABLE 11

| SUPPLY SIDE GAS TOTAL FLOW RATE | SUPPLY SIDE MONOSILANE CONCENTRATION | PUMP NITROGEN ADDITION AMOUNT | THIRD ELEMENT NITROGEN ADDITION AMOUNT | PERMEATION SIDE PRESSURE | TEMPERATURE | MEMBRANE SEPARATION DEVICE CAPACITY |
|---|---|---|---|---|---|---|
| 50 NL/min | 4.0 vol % | 0 NL/min | 30 NL/min | −100 kPa | 50° C. | 1.8 L |

TABLE 12

| SUPPLY SIDE GAS TOTAL FLOW RATE | SUPPLY SIDE MONOSILANE CONCENTRATION | PUMP NITROGEN ADDITION AMOUNT | THIRD ELEMENT NITROGEN ADDITION AMOUNT | PERMEATION SIDE PRESSURE | TEMPERATURE | MEMBRANE SEPARATION DEVICE CAPACITY |
|---|---|---|---|---|---|---|
| 50 NL/min | 4.0 vol % | 10 NL/min | 20 NL/min | −100 kPa | 50° C. | 1.8 L |

TABLE 13

| SUPPLY SIDE GAS TOTAL FLOW RATE | SUPPLY SIDE MONOSILANE CONCENTRATION | PUMP NITROGEN ADDITION AMOUNT | THIRD ELEMENT NITROGEN ADDITION AMOUNT | PERMEATION SIDE PRESSURE | TEMPERATURE | MEMBRANE SEPARATION DEVICE CAPACITY |
|---|---|---|---|---|---|---|
| 270 NL/min | 3.7 vol % | 50 NL/min | 20 NL/min | −100 kPa | 50° C. | 4.8 L |

TABLE 14

| TEST CONDITION | NUMBER OF YEARS IN USE (CORRESPONDING VALUE) YEAR | SUPPLY SIDE GAS TOTAL FLOW RATE NL/min | SUPPLY SIDE MONO-SILANE CONCEN-TRATION vol % | PUMP NITROGEN ADDITION AMOUNT NL/min | THIRD ELEMENT NITROGEN ADDITION AMOUNT NL/min | PERME-ATION SIDE MONOSILANE CONCEN-TRATION vol % | HYDROGEN RECOVERY RATE % | REMARK |
|---|---|---|---|---|---|---|---|---|
| NITROGEN ADDITION AMOUNT ADJUSTMENT $C_1 = 0.5$ | 0 | 50 | 4.0 | 0 | 30 | 0.025 | 94.0 | INITIAL |
| | | 2500 | 4.0 | 0 | 1500 | | | ACCELERATED DEGRADATION TEST |
| | 6.8 | 50 | 4.0 | 0 | 30 | 0.019 | 84.6 | |
| | 6.8 | 45 | 4.4 | 0 | 25 | 0.021 | 88.9 | NITROGEN ADDITION AMOUNT REDUCTION |
| | | 2250 | 4.4 | 0 | 1250 | | | ACCELERATED DEGRADATION TEST |
| | 10.5 | 45 | 4.4 | 0 | 25 | 0.018 | 80.0 | |
| | 10.5 | 40 | 5.0 | 0 | 20 | 0.020 | 85.7 | NITROGEN ADDITION AMOUNT REDUCTION |
| | | 2000 | 5.0 | 0 | 1000 | | | ACCELERATED DEGRADATION TEST |
| | 13.0 | 40 | 5.0 | 0 | 20 | 0.017 | 77.2 | |
| | 13.0 | 35 | 5.7 | 0 | 15 | 0.020 | 84.3 | NITROGEN ADDITION AMOUNT REDUCTION |
| | | 1750 | 5.7 | 0 | 750 | | | ACCELERATED DEGRADATION TEST |
| | | 35 | 5.7 | 0 | 15 | 0.017 | 75.9 | |
| | | 30 | 6.7 | 0 | 10 | 0.021 | 85.0 | NITROGEN ADDITION AMOUNT REDUCTION |
| | | 1500 | 6.7 | 0 | 500 | | | ACCELERATED DEGRADATION TEST |
| | | 30 | 6.7 | 0 | 10 | 0.017 | 76.5 | |
| | | 25 | 8.0 | 0 | 5 | 0.023 | 88.9 | NITROGEN ADDITION AMOUNT REDUCTION |
| | | 1250 | 8.0 | 0 | 250 | | | ACCELERATED DEGRADATION TEST |
| | | 25 | 8.0 | 0 | 5 | 0.019 | 80.0 | |
| | | 20 | 10.0 | 0 | 0 | 0.038 | 98.0 | NITROGEN ADDITION AMOUNT REDUCTION |
| | | 1000 | 10.0 | 0 | 0 | | | ACCELERATED DEGRADATION TEST |
| | 20.1 | 20 | 10.0 | 0 | 0 | 0.0015 | 60.2 | END |
| NITROGEN ADDITION AMOUNT ADJUSTMENT | 0 | 50 | 4.0 | 10 | 30 | 0.025 | 94.0 | INITIAL |
| | | 2500 | 4.0 | 0 | 1500 | | | ACCELERATED DEGRADATION TEST |

TABLE 14-continued

| TEST CONDITION | NUMBER OF YEARS IN USE (CORRESPONDING VALUE) YEAR | SUPPLY SIDE GAS TOTAL FLOW RATE NL/min | SUPPLY SIDE MONO-SILANE CONCEN-TRATION vol % | PUMP NITROGEN ADDITION AMOUNT NL/min | THIRD ELEMENT NITROGEN ADDITION AMOUNT NL/min | PERMEATION SIDE MONOSILANE CONCEN-TRATION vol % | HYDROGEN RECOVERY RATE % | REMARK |
|---|---|---|---|---|---|---|---|---|
| $C_1 = 0.1$ | 6.8 | 50 | 4.0 | 0 | 30 | 0.019 | 84.6 | |
| | 6.8 | 49 | 4.1 | 0 | 29 | 0.019 | 85.4 | NITROGEN ADDITION AMOUNT REDUCTION |
| | | 2450 | 4.1 | 0 | 1450 | | | ACCELERATED DEGRADATION TEST |
| | 10.1 | 49 | 4.1 | 0 | 29 | 0.017 | 76.9 | |
| | 10.1 | 48 | 4.2 | 0 | 28 | 0.017 | 77.9 | NITROGEN ADDITION AMOUNT REDUCTION |
| | | 2400 | 4.2 | 0 | 1400 | | | ACCELERATED DEGRADATION TEST |
| | 12.4 | 48 | 4.2 | 0 | 28 | 0.015 | 70.1 | |
| | 12.4 | 47 | 4.3 | 0 | 27 | 0.015 | 71.2 | NITROGEN ADDITION AMOUNT REDUCTION |
| | | 2350 | 4.3 | 0 | 1350 | | | ACCELERATED DEGRADATION TEST |
| | 14.0 | 47 | 4.2 | 0 | 27 | 0.014 | 64.1 | |
| | 14.0 | 46 | 4.3 | 0 | 26 | 0.014 | 65.2 | NITROGEN ADDITION AMOUNT REDUCTION |
| | | 2300 | 4.3 | 0 | 1300 | | | ACCELERATED DEGRADATION TEST |
| | 15.0 | 46 | 4.3 | 0 | 26 | 0.014 | 60.5 | END |

TABLE 15

| TEST CONDITION | NUMBER OF YEARS IN USE (CORRESPONDING VALUE) YEAR | SUPPLY SIDE GAS TOTAL FLOW RATE NL/min | SUPPLY SIDE MONO-SILANE CONCEN-TRATION vol % | PUMP NITROGEN ADDITION AMOUNT NL/min | THIRD ELEMENT NITROGEN ADDITION AMOUNT NL/min | PERMEATION SIDE MONO-SILANE CONCEN-TRATION vol % | HYDROGEN RECOVERY RATE % | REMARK |
|---|---|---|---|---|---|---|---|---|
| NITROGEN ADDITION AMOUNT ADJUSTMENT $C_1 = 0.5$ | 0 | 50 | 4.0 | 10 | 20 | 0.025 | 94.0 | INITIAL |
| | | 2500 | 4.0 | 500 | 1000 | | | ACCELERATED DEGRADATION TEST |
| | 6.8 | 50 | 4.0 | 10 | 20 | 0.019 | 84.6 | |
| | 6.8 | 45 | 4.4 | 10 | 15 | 0.021 | 89.0 | NITROGEN ADDITION AMOUNT REDUCTION |
| | | 2250 | 4.4 | 500 | 750 | | | ACCELERATED DEGRADATION TEST |
| | 10.5 | 45 | 4.4 | 10 | 15 | 0.018 | 80.0 | |
| | 10.5 | 40 | 5.0 | 10 | 10 | 0.020 | 85.7 | NITROGEN ADDITION AMOUNT REDUCTION |
| | | 2000 | 5.0 | 500 | 500 | | | ACCELERATED DEGRADATION TEST |
| | 13.0 | 40 | 5.0 | 10 | 10 | 0.017 | 77.2 | |
| | 13.0 | 35 | 5.7 | 10 | 5 | 0.020 | 84.3 | NITROGEN ADDITION AMOUNT REDUCTION |

TABLE 15-continued

| TEST CONDITION | NUMBER OF YEARS IN USE (CORRESPONDING VALUE) YEAR | SUPPLY SIDE GAS TOTAL FLOW RATE NL/min | SUPPLY SIDE MONO-SILANE CONCENTRATION vol % | PUMP NITROGEN ADDITION AMOUNT NL/min | THIRD ELEMENT NITROGEN ADDITION AMOUNT NL/min | PERMEATION SIDE MONO-SILANE CONCENTRATION vol % | HYDROGEN RECOVERY RATE % | REMARK |
|---|---|---|---|---|---|---|---|---|
| | | 1750 | 5.7 | 500 | 250 | | | ACCELERATED DEGRADATION TEST |
| | 14.8 | 35 | 5.7 | 10 | 5 | 0.017 | 75.9 | |
| | 14.8 | 30 | 6.7 | 10 | 0 | 0.020 | 85.0 | NITROGEN ADDITION AMOUNT REDUCTION |
| | | 1500 | 6.7 | 500 | 0 | | | ACCELERATED DEGRADATION TEST |
| | 18.1 | 30 | 6.7 | 10 | 0 | 0.015 | 60.2 | END |
| NITROGEN ADDITION AMOUNT ADJUSTMENT $C_1 = 0.1$ | 0 | 50 | 4.0 | 10 | 20 | 0.025 | 94.0 | INITIAL |
| | | 2500 | 4.0 | 500 | 1000 | | | ACCELERATED DEGRADATION TEST |
| | 6.8 | 50 | 4.0 | 10 | 20 | 0.019 | 84.6 | |
| | 6.8 | 49 | 4.1 | 10 | 19 | 0.019 | 85.4 | NITROGEN ADDITION AMOUNT REDUCTION |
| | | 2450 | 4.1 | 500 | 950 | | | ACCELERATED DEGRADATION TEST |
| | 10.1 | 49 | 4.1 | 10 | 19 | 0.017 | 76.9 | |
| | 10.1 | 48 | 4.2 | 10 | 18 | 0.017 | 77.9 | NITROGEN ADDITION AMOUNT REDUCTION |
| | | 2400 | 4.2 | 500 | | | | ACCELERATED DEGRADATION TEST |
| | 12.4 | 48 | 4.2 | 10 | 18 | 0.015 | 70.1 | |
| | 12.4 | 47 | 4.3 | 10 | 17 | 0.015 | 71.2 | NITROGEN ADDITION AMOUNT REDUCTION |
| | | 2350 | 4.3 | 500 | 850 | | | ACCELERATED DEGRADATION TEST |
| | 14.0 | 47 | 4.2 | 10 | 17 | 0.014 | 64.1 | |
| | 14.0 | 46 | 4.3 | 10 | 16 | 0.014 | 65.2 | NITROGEN ADDITION AMOUNT REDUCTION |
| | | 2300 | 4.3 | 500 | 800 | | | ACCELERATED DEGRADATION TEST |
| | 15.0 | 46 | 4.3 | 10 | 16 | 0.014 | 60.5 | END |

TABLE 16

| TEST CONDITION | NUMBER OF YEARS IN USE (CORRESPONDING VALUE) YEAR | SUPPLY SIDE GAS TOTAL FLOW RATE NL/min | SUPPLY SIDE MONO-SILANE CONCENTRATION vol % | PUMP NITROGEN ADDITION AMOUNT NL/min | THIRD ELEMENT NITROGEN ADDITION AMOUNT NL/min | PERMEATION SIDE MONO-SILANE CONCENTRATION vol % | HYDROGEN RECOVERY RATE % | REMARK |
|---|---|---|---|---|---|---|---|---|
| NITROGEN ADDITION AMOUNT ADJUSTMENT $C_1 = 1.0$ | 0 | 270 | 3.7 | 50 | 20 | 0.009 | 81.3 | INITIAL |
| | | 13500 | 3.7 | 2500 | 1000 | | | ACCELERATED DEGRADATION TEST |
| | 9.2 | 270 | 3.7 | 50 | 20 | 0.008 | 73.2 | |
| | 9.2 | 260 | 3.8 | 50 | 10 | 0.008 | 76.1 | NITROGEN ADDITION AMOUNT REDUCTION |

TABLE 16-continued

| TEST CONDITION | NUMBER OF YEARS IN USE (CORRESPONDING VALUE) YEAR | SUPPLY SIDE GAS TOTAL FLOW RATE NL/min | SUPPLY SIDE MONO-SILANE CONCEN-TRATION vol % | PUMP NITROGEN ADDITION AMOUNT NL/min | THIRD ELEMENT NITROGEN ADDITION AMOUNT NL/min | PERMEATION SIDE MONO-SILANE CONCEN-TRATION vol % | HYDROGEN RECOVERY RATE % | REMARK |
|---|---|---|---|---|---|---|---|---|
| | | 13000 | 3.8 | 2500 | 500 | | | ACCELERATED DEGRADATION TEST |
| | 16.2 | 260 | 3.8 | 50 | 10 | 0.007 | 68.5 | |
| | 16.2 | 250 | 4.0 | 50 | 0 | 0.008 | 71.5 | NITROGEN ADDITION AMOUNT REDUCTION |
| | | 12500 | 4.0 | 2500 | 0 | | | ACCELERATED DEGRADATION TEST |
| | 25.0 | 250 | 4.0 | 50 | 0 | 0.007 | 60.0 | END |
| NITROGEN ADDITION AMOUNT ADJUSTMENT $C_1 = 0.1$ | 0 | 270 | 3.7 | 50 | 20 | 0.009 | 81.3 | INITIAL |
| | | 13500 | 3.7 | 2500 | 1000 | | | ACCELERATED DEGRADATION TEST |
| | 9.2 | 270 | 3.7 | 50 | 20 | 0.008 | 73.2 | |
| | 9.2 | 269 | 3.7 | 50 | 19 | 0.008 | 73.5 | NITROGEN ADDITION AMOUNT REDUCTION |
| | | 13450 | 3.7 | 2500 | 950 | | | ACCELERATED DEGRADATION TEST |
| | 16.1 | 269 | 3.7 | 50 | 19 | 0.007 | 66.1 | |
| | 16.1 | 268 | 3.7 | 50 | 19 | 0.007 | 66.4 | NITROGEN ADDITION AMOUNT REDUCTION |
| | | 13400 | 3.7 | 2500 | 950 | | | ACCELERATED DEGRADATION TEST |
| | 21.0 | 268 | 3.7 | 50 | 18 | 0.007 | 60.2 | END |

Figure 33:
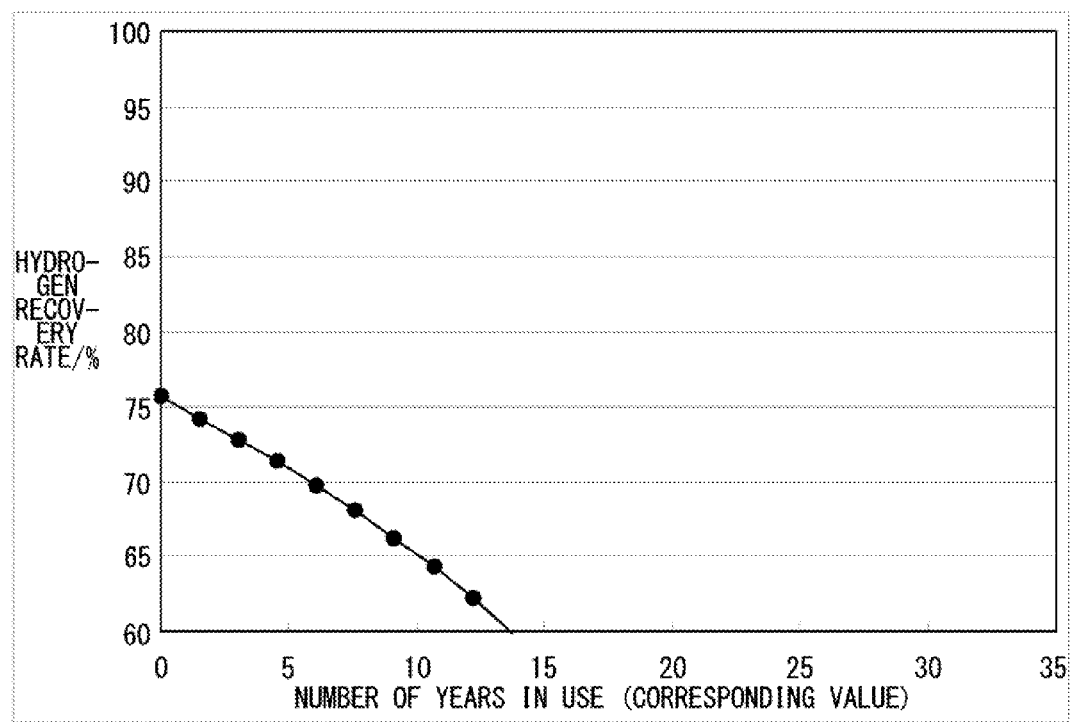
FIG. 33 is a graph illustrating a change in hydrogen recovery rate when the operation is performed without the adjustment of a nitrogen addition amount on the condition that the purging nitrogen of the pump is not introduced.
Figure 34:
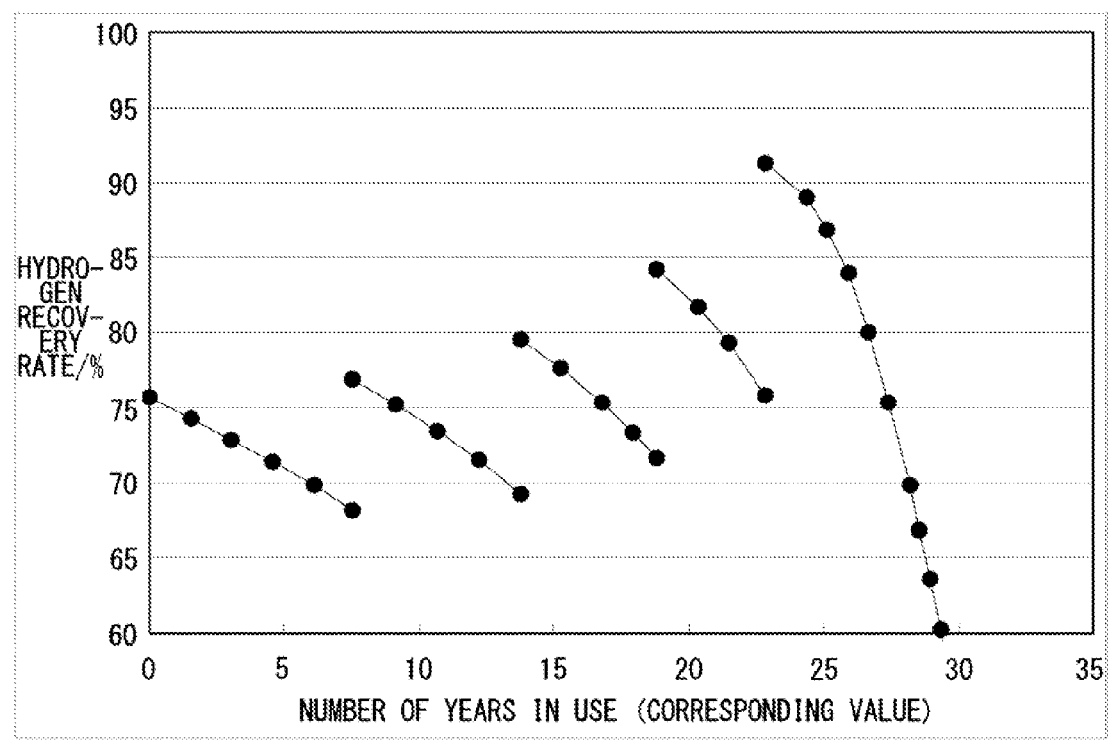
FIG. 34 is a graph illustrating a change in hydrogen recovery rate when the operation is performed with the adjustment of a nitrogen addition amount ($C_1$=0.3) on the condition that the purging nitrogen of the pump is not introduced.
Figure 35:
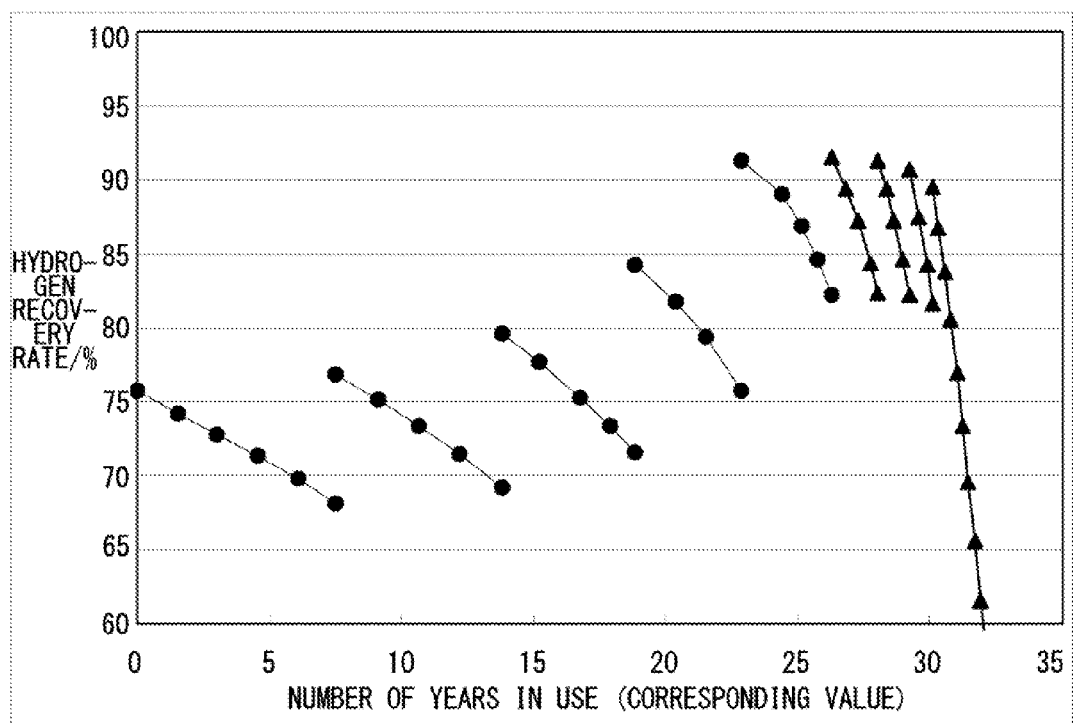
FIG. 35 is a graph illustrating a change in hydrogen recovery rate when the operation is performed with the adjustment of a nitrogen addition amount ($C_1$=0.3) on the condition that the purging nitrogen of the pump is not introduced, and the operation is performed with the adjustment of a permeation side pressure of a membrane separation device ($C_2$=1.0)
Figure 36:
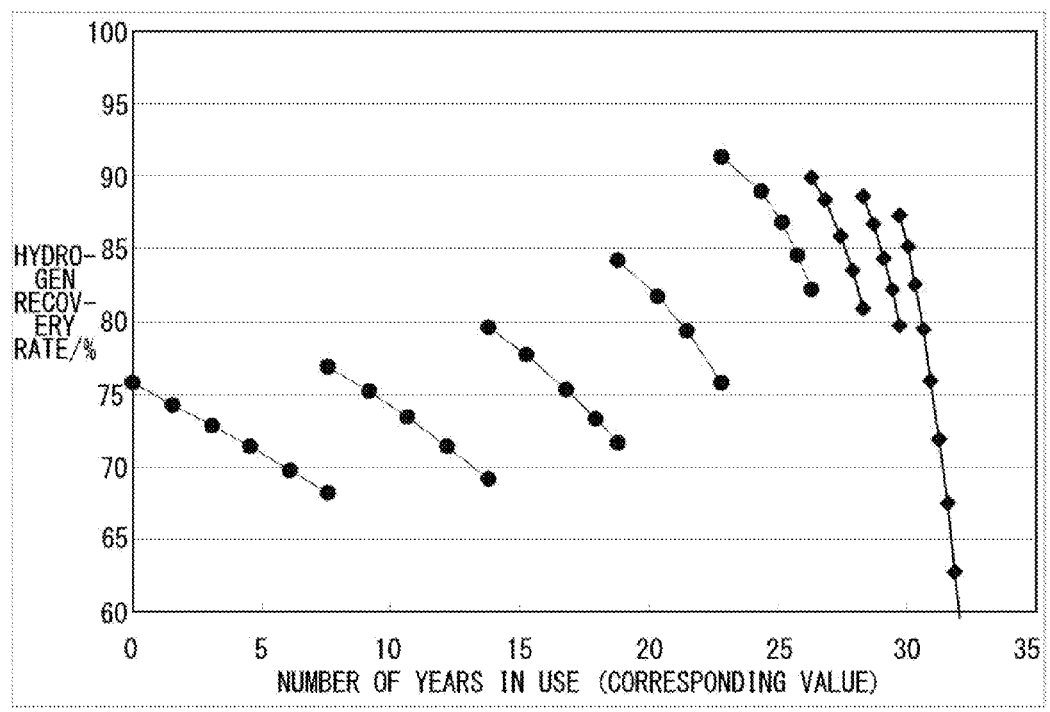
FIG. 36 is a graph illustrating a change in hydrogen recovery rate when the operation is performed with the adjustment of a nitrogen addition amount ($C_1$=0.3) on the condition that the purging nitrogen of the pump is not introduced, and the operation is performed with the adjustment of a temperature of a temperature control unit ($C_3$=2.0)
Figure 37:
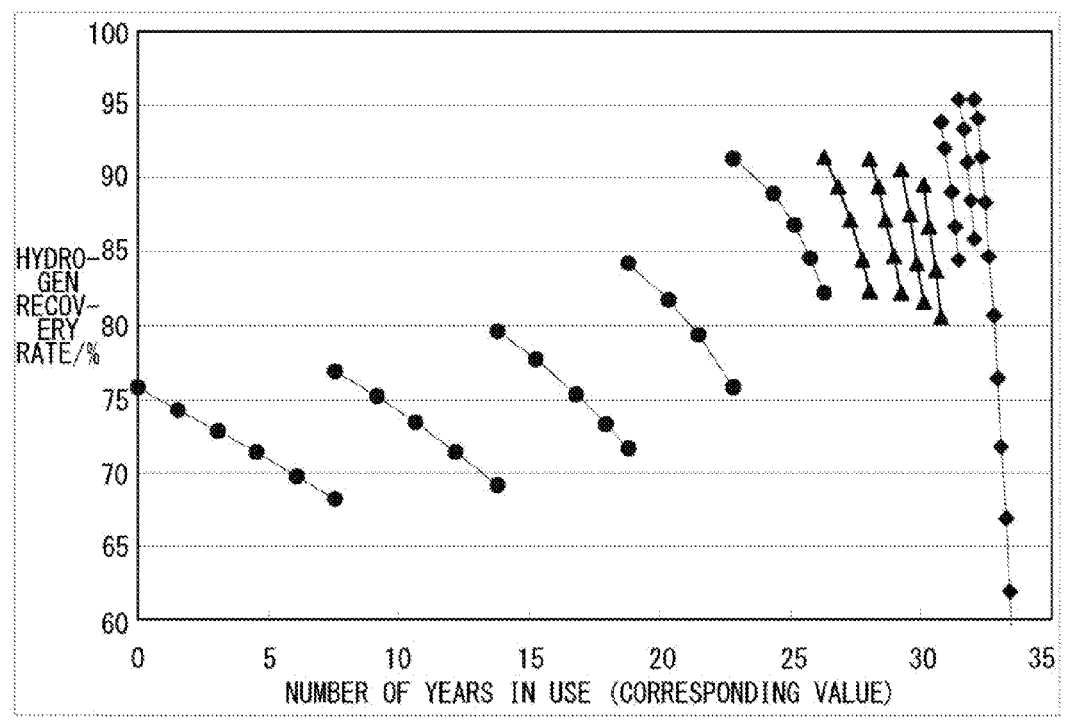
FIG. 37 is a graph illustrating a change in hydrogen recovery rate when the operation is performed with the adjustment of a nitrogen addition amount ($C_1$=0.3) on the condition that the purging nitrogen of the pump is not introduced, the operation is performed with the adjustment of a permeation side pressure of a membrane separation device ($C_2$=1.0), and further the operation is performed with the adjustment of a temperature of a temperature control unit ($C_3$=2.0)

FIGS. 33 to 37 are graphs obtained by measuring a change in hydrogen recovery rate by changing the nitrogen addition amount supplied by the third element gas addition unit 2020, the permeation side pressure of the membrane separation device, and the temperature of the temperature control unit with respect to a change in hydrogen gas recovery rate when the purging nitrogen of the pump is not introduced. FIG. 33 illustrates the result when the operation is performed without the adjustment of the initial nitrogen addition amount. FIG. 34 illustrates the result when the operation is performed so that the initial nitrogen addition amount satisfies the equation (3-1) ($C_1$=0.3). FIG. 35 illustrates the result when the operation is performed so that the initial nitrogen addition amount satisfies the equation (3-1) ($C_1$=0.3) and the operation is performed so that the permeation side pressure of the membrane separation device satisfies the equation (3-1) ($C_2$=1.0). FIG. 36 illustrates the result when the operation is performed so that the initial nitrogen addition amount satisfies the equation (3-1) ($C_1$=0.3) and the operation is performed so that the temperature of the temperature control unit satisfies the equation (3-2) ($C_3$=2.0). FIG. 37 illustrates the result when the operation is performed so that the initial nitrogen addition amount satisfies the equation (3-1) ($C_1$=0.3), the operation is performed so that the permeation side pressure of the membrane separation device satisfies the equation (3-2) ($C_2$=1.0), and then the operation is performed so that the temperature of the temperature control unit satisfies the equation (3-3) ($C_3$=2.0). The initial condition of the test is illustrated in Table 17. Table 18 illustrates the total result of a change in hydrogen recovery rate with respect to the number of years in use (corresponding value). Furthermore, the number of years in use (corresponding value) is a value which is obtained by converting the operation time of the accelerated degradation test into the number of real years. The accelerated degradation test was performed so that the total flow rate of the supplied mixed gas is set to 50 times that of the normal test and the supplied monosilane gas concentration and the supplied nitrogen gas concentration are constant. The method of the accelerated degradation test is further written in Table 18. From this result, it is found that the exhaust gas treatment system may be operated for a long period of time while maintaining the high hydrogen recovery rate by operating the exhaust gas treatment system so that the nitrogen addition amount supplied by the third element gas addition unit, the permeation side pressure of the membrane separation device, and the temperature of the temperature control unit respectively satisfy the equation (3-1), the equation (3-2), and the equation (3-3).

TABLE 17

| SUPPLY SIDE GAS TOTAL FLOW RATE | SUPPLY SIDE MONOSILANE CONCENTRATION | PUMP NITROGEN ADDITION AMOUNT | THIRD ELEMENT NITROGEN ADDITION AMOUNT | PERMEATION SIDE PRESSURE | TEMPERATURE | MEMBRANE SEPARATION DEVICE CAPACITY |
|---|---|---|---|---|---|---|
| 32 NL/min | 6.3 vol % | 0 NL/min | 12 NL/min | −60 kPa | 40° C. | 2.8 L |

TABLE 18

| TEST CONDITION | NUMBER OF YEARS IN USE (CORRESPONDING VALUE) YEAR | SUPPLY SIDE GAS TOTAL FLOW RATE NL/min | SUPPLY SIDE MONOSILANE CONCENTRATION vol % | PUMP NITROGEN ADDITION AMOUNT NL/min | THIRD ELEMENT NITROGEN ADDITION AMOUNT NL/min | PERMEATION SIDE PRESSURE kPa | TEMPERATURE ° C. |
|---|---|---|---|---|---|---|---|
| WITHOUT NITROGEN ADDITION AMOUNT ADJUSTMENT | 0 | 32 | 6.3 | 0 | 12 | −60 | 40 |
| | | 1600 | 6.3 | 0 | 600 | −60 | 40 |
| | 13.7 | 32 | 6.3 | 0 | 12 | −60 | 40 |
| NITROGEN ADDITION AMOUNT ADJUSTMENT $C_1 = 0.3$ | 0 | 32 | 6.3 | 0 | 12 | −60 | 40 |
| | | 1600 | 6.3 | 0 | 600 | −60 | 40 |
| | 7.5 | 32 | 6.3 | 0 | 12 | −60 | 40 |
| | 7.5 | 29 | 6.9 | 0 | 9 | −60 | 40 |
| | | 1450 | 6.9 | 0 | 450 | −60 | 40 |
| | 13.8 | 29 | 6.9 | 0 | 9 | −60 | 40 |
| | 13.8 | 26 | 7.7 | 0 | 6 | −60 | 40 |
| | | 1300 | 7.7 | 0 | 300 | −60 | 40 |
| | 18.8 | 26 | 7.7 | 0 | 6 | −60 | 40 |
| | 18.8 | 23 | 8.7 | 0 | 3 | −60 | 40 |
| | | 1150 | 8.7 | 0 | 150 | −60 | 40 |
| | 22.9 | 23 | 8.7 | 0 | 3 | −60 | 40 |
| | 22.9 | 20 | 10.0 | 0 | 0 | −60 | 40 |
| | | 1000 | 10.0 | 0 | 0 | −60 | 40 |
| | 29.3 | 20 | 10.0 | 0 | 0 | −60 | 40 |
| NITROGEN ADDITION AMOUNT ADJUSTMENT $C_1 = 0.3$ | 0 | 32 | 6.3 | 0 | 12 | −60 | 40 |
| | | 1600 | 6.3 | 0 | 600 | −60 | 40 |
| | 7.5 | 32 | 6.3 | 0 | 12 | −60 | 40 |
| | 7.5 | 29 | 6.9 | 0 | 9 | −60 | 40 |
| | | 1450 | 6.9 | 0 | 450 | −60 | 40 |
| | 13.8 | 29 | 6.9 | 0 | 9 | −60 | 40 |
| | 13.8 | 26 | 7.7 | 0 | 6 | −60 | 40 |
| | | 1300 | 7.7 | 0 | 300 | −60 | 40 |
| | 18.8 | 26 | 7.7 | 0 | 6 | −60 | 40 |
| | 18.8 | 23 | 8.7 | 0 | 3 | −60 | 40 |
| | | 1150 | 8.7 | 0 | 150 | −60 | 40 |
| | 22.9 | 23 | 8.7 | 0 | 3 | −60 | 40 |
| | 22.9 | 20 | 10.0 | 0 | 0 | −60 | 40 |
| | | 1000 | 10.0 | 0 | 0 | −60 | 40 |
| | 26.3 | 20 | 10.0 | 0 | 0 | −60 | 40 |
| PERMEATION SIDE PRESSURE ADJUSTMENT $C_2 = 1.0$ | 26.3 | 20 | 10.0 | 0 | 0 | −70 | 40 |
| | | 20 | 10.0 | 0 | 0 | −70 | 40 |
| | 28.0 | 20 | 10.0 | 0 | 0 | −70 | 40 |
| | 28.0 | 20 | 10.0 | 0 | 0 | −80 | 40 |
| | | 20 | 10.0 | 0 | 0 | −80 | 40 |
| | 29.2 | 20 | 10.0 | 0 | 0 | −80 | 40 |
| | 29.2 | 20 | 10.0 | 0 | 0 | −90 | 40 |
| | | 20 | 10.0 | 0 | 0 | −90 | 40 |
| | 30.1 | 20 | 10.0 | 0 | 0 | −90 | 40 |
| | 30.1 | 20 | 10.0 | 0 | 0 | −100 | 40 |
| | | 20 | 10.0 | 0 | 0 | −100 | 40 |
| | 32.1 | 20 | 10.0 | 0 | 0 | −100 | 40 |
| NITROGEN ADDITION AMOUNT ADJUSTMENT $C_1 = 0.3$ | 0 | 32 | 6.3 | 0 | 12 | −60 | 40 |
| | | 1600 | 6.3 | 0 | 600 | −60 | 40 |
| | 7.5 | 32 | 6.3 | 0 | 12 | −60 | 40 |
| | 7.5 | 29 | 6.9 | 0 | 9 | −60 | 40 |
| | | 1450 | 6.9 | 0 | 450 | −60 | 40 |
| | 13.8 | 29 | 6.9 | 0 | 9 | −60 | 40 |
| | 13.8 | 26 | 7.7 | 0 | 6 | −60 | 40 |
| | | 1300 | 7.7 | 0 | 300 | −60 | 40 |
| | 18.8 | 26 | 7.7 | 0 | 6 | −60 | 40 |
| | 18.8 | 23 | 8.7 | 0 | 3 | −60 | 40 |
| | | 1150 | 8.7 | 0 | 150 | −60 | 40 |
| | 22.9 | 23 | 8.7 | 0 | 3 | −60 | 40 |
| | 22.9 | 20 | 10.0 | 0 | 0 | −60 | 40 |
| | | 1000 | 10.0 | 0 | 0 | −60 | 40 |
| | 26.3 | 20 | 10.0 | 0 | 0 | −60 | 40 |

TABLE 18-continued

| | | | | | | | |
|---|---|---|---|---|---|---|---|
| TEMPERATURE | 26.3 | 20 | 10.0 | 0 | 0 | −60 | 60 |
| ADJUSTMENT | | 1000 | 10.0 | 0 | 0 | −60 | 60 |
| $C_3 = 2.0$ | 28.3 | 20 | 10.0 | 0 | 0 | −60 | 60 |
| | 28.3 | 20 | 10.0 | 0 | 0 | −60 | 80 |
| | | 1000 | 10.0 | 0 | 0 | −60 | 80 |
| | 29.7 | 20 | 10.0 | 0 | 0 | −60 | 80 |
| | 29.7 | 20 | 10.0 | 0 | 0 | −60 | 100 |
| | | 1000 | 10.0 | 0 | 0 | −60 | 100 |
| | 32.0 | 20 | 10.0 | 0 | 0 | −60 | 100 |
| NITROGEN | 0 | 32 | 6.3 | 0 | 12 | −60 | 40 |
| ADDITION | | 1600 | 6.3 | 0 | 600 | −60 | 40 |
| AMOUNT | 7.5 | 32 | 6.3 | 0 | 12 | −60 | 40 |
| ADJUSTMENT | 7.5 | 29 | 6.9 | 0 | 9 | −60 | 40 |
| $C_1 = 0.3$ | | 1450 | 6.9 | 0 | 450 | −60 | 40 |
| | 13.8 | 29 | 6.9 | 0 | 9 | −60 | 40 |
| | 13.8 | 26 | 7.7 | 0 | 6 | −60 | 40 |
| | | 1300 | 7.7 | 0 | 300 | −60 | 40 |
| | 18.8 | 26 | 7.7 | 0 | 6 | −60 | 40 |
| | 18.8 | 23 | 8.7 | 0 | 3 | −60 | 40 |
| | | 1150 | 8.7 | 0 | 150 | −60 | 40 |
| | 22.9 | 23 | 8.7 | 0 | 3 | −60 | 40 |
| | 22.9 | 20 | 10.0 | 0 | 0 | −60 | 40 |
| | | 1000 | 10.0 | 0 | 0 | −60 | 40 |
| | 26.3 | 20 | 10.0 | 0 | 0 | −60 | 40 |
| PERMEATION | 26.3 | 20 | 10.0 | 0 | 0 | −70 | 40 |
| PRESSURE | | 20 | 10.0 | 0 | 0 | −70 | 40 |
| ADJUSTMENT | 28.0 | 20 | 10.0 | 0 | 0 | −70 | 40 |
| $C_2 = 1.0$ | 28.0 | 20 | 10.0 | 0 | 0 | −80 | 40 |
| | | 20 | 10.0 | 0 | 0 | −80 | 40 |
| | 29.2 | 20 | 10.0 | 0 | 0 | −80 | 40 |
| | 29.2 | 20 | 10.0 | 0 | 0 | −90 | 40 |
| | | 20 | 10.0 | 0 | 0 | −90 | 40 |
| | 30.1 | 20 | 10.0 | 0 | 0 | −90 | 40 |
| | 30.1 | 20 | 10.0 | 0 | 0 | −100 | 40 |
| | | 20 | 10.0 | 0 | 0 | −100 | 40 |
| | 30.8 | 20 | 10.0 | 0 | 0 | −100 | 40 |
| TEMPERATURE | 30.8 | 20 | 10.0 | 0 | 0 | −100 | 60 |
| ADJUSTMENT | | 20 | 10.0 | 0 | 0 | −100 | 60 |
| $C_3 = 2.0$ | 31.5 | 20 | 10.0 | 0 | 0 | −100 | 60 |
| | 31.5 | 20 | 10.0 | 0 | 0 | −100 | 80 |
| | | 20 | 10.0 | 0 | 0 | −100 | 80 |
| | 32.1 | 20 | 10.0 | 0 | 0 | −100 | 80 |
| | 32.1 | 20 | 10.0 | 0 | 0 | −100 | 100 |
| | | 20 | 10.0 | 0 | 0 | −100 | 100 |
| | 33.4 | 20 | 10.0 | 0 | 0 | −100 | 100 |

| TEST CONDITION | | NUMBER OF YEARS IN USE (CORRESPONDING VALUE) YEAR | SUPPLY SIDE GAS TOTAL FLOW RATE NL/min | PERMEATION SIDE MONOSILANE CONCENTRATION vol % | HYDROGEN RECOVERY RATE % | REMARK |
|---|---|---|---|---|---|---|
| | WITHOUT NITROGEN ADDITION AMOUNT ADJUSTMENT | 0 | 32 1600 | 0.064 | 75.7 | INITIAL ACCELERATED DEGRADATION TEST |
| | | 13.7 | 32 | 0.045 | 60.0 | END |
| | NITROGEN ADDITION AMOUNT ADJUSTMENT $C_1 = 0.3$ | 0 | 32 1600 | 0.064 | 75.7 | INITIAL ACCELERATED DEGRADATION TEST |
| | | 7.5 | 32 | 0.054 | 68.2 | |
| | | 7.5 | 29 1450 | 0.061 | 76.9 | NITROGEN ADDITION AMOUNT REDUCTION ACCELERATED DEGRADATION TEST |
| | | 13.8 | 29 | 0.049 | 69.2 | |
| | | 13.8 | 26 1300 | 0.058 | 79.5 | NITROGEN ADDITION AMOUNT REDUCTION ACCELERATED DEGRADATION TEST |
| | | 18.8 | 26 | 0.045 | 71.6 | |
| | | 18.8 | 23 1150 | 0.057 | 84.2 | NITROGEN ADDITION AMOUNT REDUCTION ACCELERATED DEGRADATION TEST |
| | | 22.9 | 23 | 0.041 | 75.8 | |
| | | 22.9 | 20 | 0.067 | 91.3 | NITROGEN ADDITION AMOUNT REDUCTION |

TABLE 18-continued

|  |  |  |  |  |  |
|---|---|---|---|---|---|
|  |  | 1000 |  |  | ACCELERATED DEGRADATION TEST |
|  | 29.3 | 20 | 0.025 | 60.3 | END |
| NITROGEN ADDITION AMOUNT ADJUSTMENT $C_1 = 0.3$ | 0 | 32 | 0.064 | 75.7 | INITIAL ACCELERATED DEGRADATION TEST |
|  |  | 1600 |  |  |  |
|  | 7.5 | 32 | 0.054 | 68.2 |  |
|  | 7.5 | 29 | 0.061 | 76.9 | NITROGEN ADDITION AMOUNT REDUCTION |
|  |  | 1450 |  |  | ACCELERATED DEGRADATION TEST |
|  | 13.8 | 29 | 0.049 | 69.2 |  |
|  | 13.8 | 26 | 0.058 | 79.5 | NITROGEN ADDITION AMOUNT REDUCTION |
|  |  | 1300 |  |  | ACCELERATED DEGRADATION TEST |
|  | 18.8 | 26 | 0.045 | 71.6 |  |
|  | 18.8 | 23 | 0.057 | 84.2 | NITROGEN ADDITION AMOUNT REDUCTION |
|  |  | 1150 |  |  | ACCELERATED DEGRADATION TEST |
|  | 22.9 | 23 | 0.041 | 75.8 |  |
|  | 22.9 | 20 | 0.067 | 91.3 | NITROGEN ADDITION AMOUNT REDUCTION |
|  |  | 1000 |  |  | ACCELERATED DEGRADATION TEST |
|  | 26.3 | 20 | 0.038 | 82.2 |  |
| PERMEATION SIDE PRESSURE ADJUSTMENT $C_2 = 1.0$ | 26.3 | 20 | 0.043 | 91.5 | PRESSURE ADJUSTMENT START |
|  |  | 20 |  |  | ACCELERATED DEGRADATION TEST |
|  | 28.0 | 20 | 0.030 | 82.3 |  |
|  | 28.0 | 20 | 0.033 | 91.3 | PRESSURE REDUCTION |
|  |  | 20 |  |  | ACCELERATED DEGRADATION TEST |
|  | 29.2 | 20 | 0.024 | 82.2 |  |
|  | 29.2 | 20 | 0.026 | 90.6 | PRESSURE REDUCTION |
|  |  | 20 |  |  | ACCELERATED DEGRADATION TEST |
|  | 30.1 | 20 | 0.020 | 81.6 |  |
|  | 30.1 | 20 | 0.022 | 89.5 | PRESSURE REDUCTION |
|  |  | 20 |  |  | ACCELERATED DEGRADATION TEST |
|  | 32.1 | 20 | 0.013 | 60.7 | END |
| NITROGEN ADDITION AMOUNT ADJUSTMENT $C_1 = 0.3$ | 0 | 32 | 0.064 | 75.7 | INITIAL ACCELERATED DEGRADATION TEST |
|  |  | 1600 |  |  |  |
|  | 7.5 | 32 | 0.054 | 68.2 |  |
|  | 7.5 | 29 | 0.061 | 76.9 | NITROGEN ADDITION AMOUNT REDUCTION |
|  |  | 1450 |  |  | ACCELERATED DEGRADATION TEST |
|  | 13.8 | 29 | 0.049 | 69.2 |  |
|  | 13.8 | 26 | 0.058 | 79.5 | NITROGEN ADDITION AMOUNT REDUCTION |
|  |  | 1300 |  |  | ACCELERATED DEGRADATION TEST |
|  | 18.8 | 26 | 0.045 | 71.6 |  |
|  | 18.8 | 23 | 0.057 | 84.2 | NITROGEN ADDITION AMOUNT REDUCTION |
|  |  | 1150 |  |  | ACCELERATED DEGRADATION TEST |
|  | 22.9 | 23 | 0.041 | 75.8 |  |
|  | 22.9 | 20 | 0.067 | 91.3 | NITROGEN ADDITION AMOUNT REDUCTION |
|  |  | 1000 |  |  | ACCELERATED DEGRADATION TEST |
|  | 26.3 | 20 | 0.038 | 82.2 |  |
| TEMPERATURE ADJUSTMENT $C_3 = 2.0$ | 26.3 | 20 | 0.068 | 89.9 | TEMPERATURE ADJUSTMENT START |
|  |  | 1000 |  |  | ACCELERATED DEGRADATION TEST |
|  | 28.3 | 20 | 0.044 | 80.9 |  |
|  | 28.3 | 20 | 0.073 | 88.6 | TEMPERATURE INCREASE |
|  |  | 1000 |  |  | ACCELERATED DEGRADATION TEST |
|  | 29.7 | 20 | 0.051 | 79.7 |  |
|  | 29.7 | 20 | 0.079 | 87.3 | TEMPERATURE INCREASE |

TABLE 18-continued

| | | | | | |
|---|---|---|---|---|---|
| | | 1000 | | | ACCELERATED DEGRADATION TEST |
| | 32.0 | 20 | 0.042 | 60.1 | END |
| NITROGEN ADDITION AMOUNT ADJUSTMENT $C_1 = 0.3$ | 0 | 32 | 0.064 | 75.7 | INITIAL |
| | | 1600 | | | ACCELERATED DEGRADATION TEST |
| | 7.5 | 32 | 0.054 | 68.2 | |
| | 7.5 | 29 | 0.061 | 76.9 | NITROGEN ADDITION AMOUNT REDUCTION |
| | | 1450 | | | ACCELERATED DEGRADATION TEST |
| | 13.8 | 29 | 0.049 | 69.2 | |
| | 13.8 | 26 | 0.058 | 79.5 | NITROGEN ADDITION AMOUNT REDUCTION |
| | | 1300 | | | ACCELERATED DEGRADATION TEST |
| | 18.8 | 26 | 0.045 | 71.6 | |
| | 18.8 | 23 | 0.057 | 84.2 | NITROGEN ADDITION AMOUNT REDUCTION |
| | | 1150 | | | ACCELERATED DEGRADATION TEST |
| | 22.9 | 23 | 0.041 | 75.8 | |
| | 22.9 | 20 | 0.067 | 91.3 | NITROGEN ADDITION AMOUNT REDUCTION |
| | | 1000 | | | ACCELERATED DEGRADATION TEST |
| | 26.3 | 20 | 0.038 | 82.2 | |
| PERMEATION PRESSURE ADJUSTMENT $C_2 = 1.0$ | 26.3 | 20 | 0.043 | 91.5 | PRESSURE ADJUSTMENT START |
| | | 20 | | | ACCELERATED DEGRADATION TEST |
| | 28.0 | 20 | 0.030 | 82.3 | |
| | 28.0 | 20 | 0.033 | 91.3 | PRESSURE REDUCTION |
| | | 20 | | | ACCELERATED DEGRADATION TEST |
| | 29.2 | 20 | 0.024 | 82.2 | |
| | 29.2 | 20 | 0.026 | 90.6 | PRESSURE REDUCTION |
| | | 20 | | | ACCELERATED DEGRADATION TEST |
| | 30.1 | 20 | 0.020 | 81.6 | |
| | 30.1 | 20 | 0.022 | 89.5 | PRESSURE REDUCTION |
| | | 20 | | | ACCELERATED DEGRADATION TEST |
| | 30.8 | 20 | 0.017 | 80.5 | |
| TEMPERATURE ADJUSTMENT $C_3 = 2.0$ | 30.8 | 20 | 0.031 | 93.9 | TEMPERATURE ADJUSTMENT START |
| | | 20 | | | ACCELERATED DEGRADATION TEST |
| | 31.5 | 20 | 0.023 | 84.5 | |
| | 31.5 | 20 | 0.040 | 95.4 | TEMPERATURE INCREASE |
| | | 20 | | | ACCELERATED DEGRADATION TEST |
| | 32.1 | 20 | 0.028 | 85.9 | |
| | 32.1 | 20 | 0.047 | 95.4 | TEMPERATURE INCREASE |
| | | 20 | | | ACCELERATED DEGRADATION TEST |
| | 33.4 | 20 | 0.022 | 60.3 | END |

Figure 38:
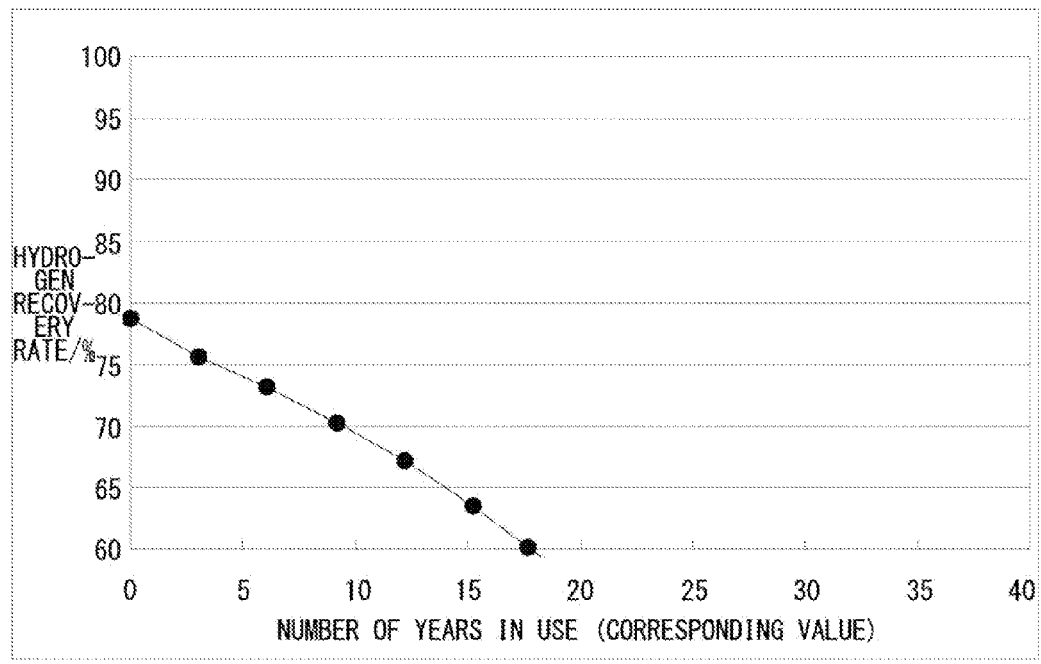
FIG. 38 is a graph illustrating a change in hydrogen recovery rate when the operation is performed without the adjustment of a nitrogen addition amount on the condition that the purging nitrogen of the pump is introduced by 10 NL/min.
Figure 39:
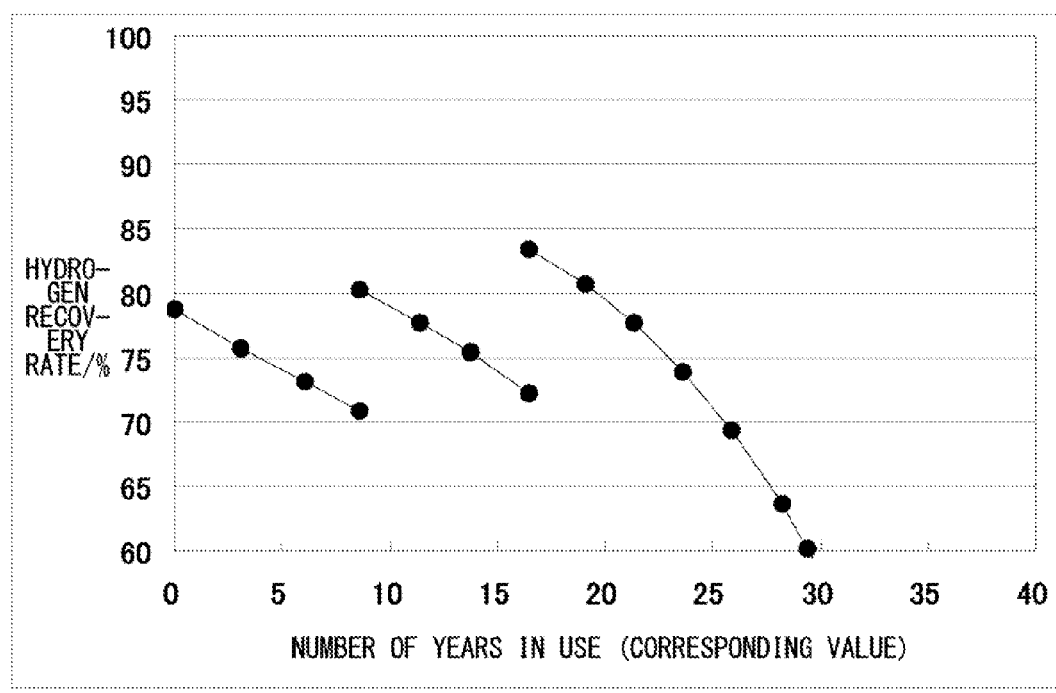
FIG. 39 is a graph illustrating a change in hydrogen recovery rate when the operation is performed with the adjustment of a nitrogen addition amount ($C_1$=0.5) on the condition that the purging nitrogen of the pump is introduced by 10 NL/min.
Figure 40:
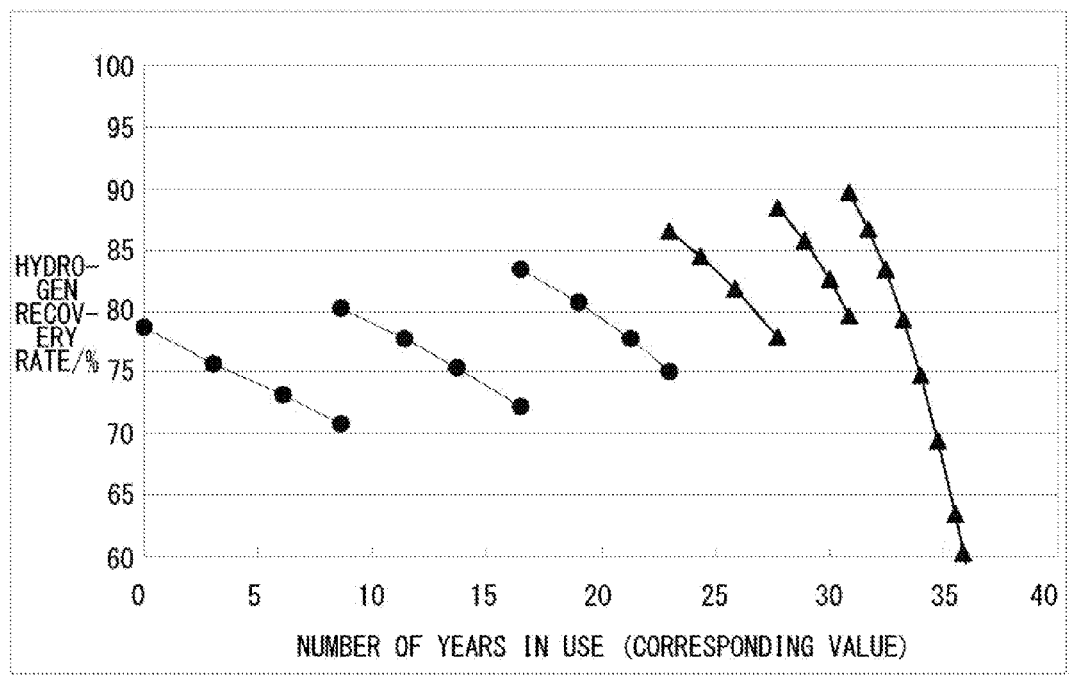
FIG. 40 is a graph illustrating a change in hydrogen recovery rate when the operation is performed with the adjustment of a nitrogen addition amount ($C_1$=0.5) on the condition that the purging nitrogen of the pump is introduced by 10 NL/min, and the operation is performed with the adjustment of the permeation side pressure of the membrane separation device ($C_2$=1.0)
Figure 41:
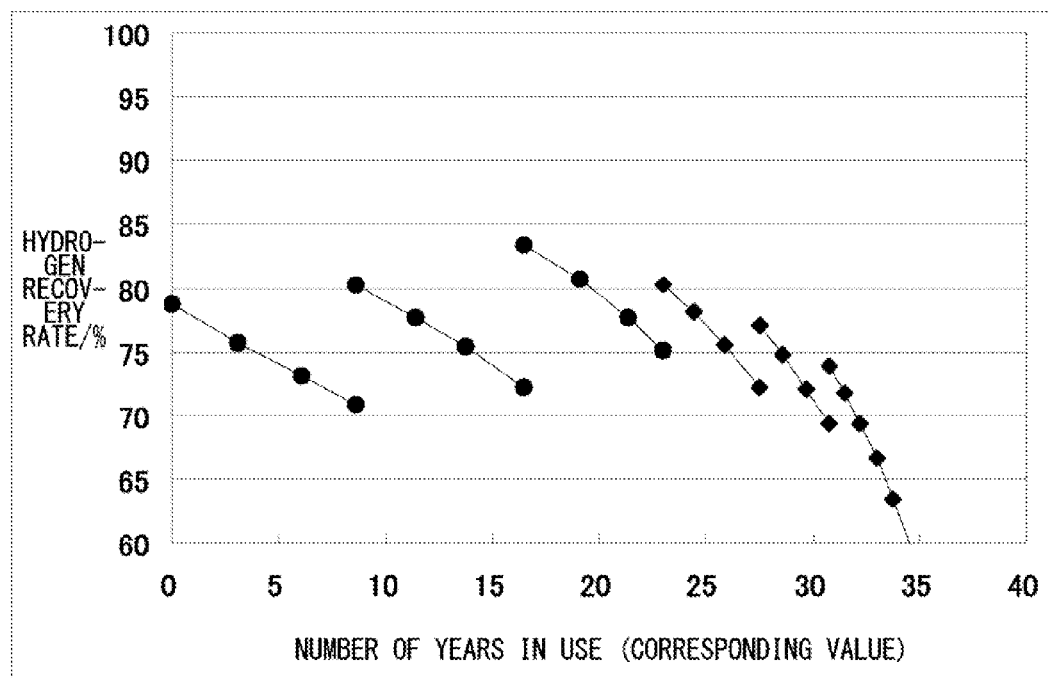
FIG. 41 is a graph illustrating a change in hydrogen recovery rate when the operation is performed with the adjustment of a nitrogen addition amount ($C_1$=0.5) on the condition that the purging nitrogen of the pump is introduced by 10 NL/min, and the operation is performed with the adjustment of a temperature of a temperature control unit ($C_3$=2.0)
Figure 42:
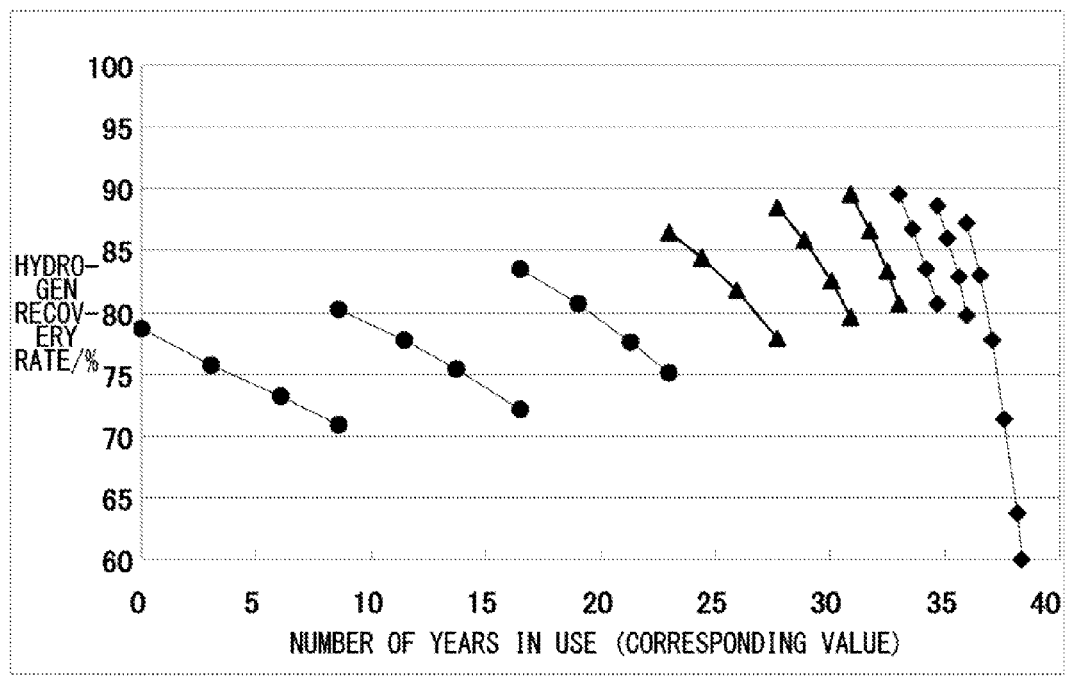
FIG. 42 is a graph illustrating a change in hydrogen recovery rate when the operation is performed with the adjustment of a nitrogen addition amount ($C_1$=0.5) on the condition that the purging nitrogen of the pump is introduced by 10 NL/min, the operation is performed with the adjustment of a permeation side pressure of a membrane separation device ($C_2$=1.0), and further the operation is performed with the adjustment of a temperature of a temperature control unit ($C_3$=2.0).

FIGS. 38 to 42 are graphs obtained by measuring a change in hydrogen recovery rate by changing the nitrogen addition amount supplied by the third element gas addition unit, the permeation side pressure of the membrane separation device, and the temperature of the temperature control unit with respect to a change in hydrogen gas recovery rate when the purging nitrogen of the pump is introduced by 10 NL/min. FIG. 38 illustrates the result when the operation is performed without the adjustment of the initial nitrogen addition amount. FIG. 39 illustrates the result when the operation is performed so that the initial nitrogen addition amount satisfies the equation (3-1) ($C_1$=0.5). FIG. 40 illustrates the result when the operation is performed so that the initial nitrogen addition amount satisfies the equation (3-1) ($C_1$=0.5) and the operation is performed so that the permeation side pressure of the membrane separation device satisfies the equation (3-2) ($C_2$=1.0). FIG. 41 illustrates the result when the operation is performed so that the initial nitrogen addition amount satisfies the equation (3-1) ($C_1$=0.5) and the operation is performed so that the temperature of the temperature control unit satisfies the equation (3-3) ($C_3$=2.0). FIG. 42 illustrates the result when the operation is performed so that the initial nitrogen addition amount satisfies the equation (3-1) ($C_1$=0.5), the operation is performed so that the permeation side pressure of the membrane separation device satisfies the equation (3-2) ($C_2$=1.0), and then the operation is performed so that the temperature of the temperature control unit satisfies the equation (3-3) ($C_3$=2.0). The initial condition of the test is illustrated in Table 19. Table 20 illustrates the total result of a change in hydrogen recovery rate with respect to the number of years in use (corresponding value). Furthermore, the number of years in use (corresponding value) is a value which is obtained by converting the operation time of the accelerated degradation test into the number of real years. The accelerated degradation test was performed so that the total flow rate of the supplied mixed gas is set to 50 times that of the normal test and the supplied monosilane gas concentration and the supplied nitrogen gas concentration are constant. The method of the accelerated degradation test is further written in Table 20. From this result, it is found that the exhaust gas treatment system may be operated for a long period of time while maintaining the high hydrogen recovery rate by operating the exhaust gas treatment system so that the nitrogen addition amount supplied by the third element gas addition unit, the permeation side pressure of the membrane separation device, and the temperature of the temperature control unit respectively satisfy the equation (3-1), the equation (3-2), and the equation (3-3).

TABLE 19

| SUPPLY SIDE GAS TOTAL FLOW RATE | SUPPLY SIDE MONOSILANE CONCENTRATION | PUMP NITROGEN ADDITION AMOUNT | THIRD ELEMENT NITROGEN ADDITION AMOUNT | PERMEATION SIDE PRESSURE | TEMPERATURE | MEMBRANE SEPARATION DEVICE CAPACITY |
|---|---|---|---|---|---|---|
| 40 NL/min | 5.0 vol % | 10 NL/min | 10 NL/min | −70 kPa | 40° C. | 3.2 L |

TABLE 20

| TEST CONDITION | NUMBER OF YEARS IN USE (CORRESPONDING VALUE) YEAR | SUPPLY SIDE GAS TOTAL FLOW RATE NL/min | SUPPLY SIDE MONOSILANE CONCENTRATION vol % | PUMP NITROGEN ADDITION AMOUNT NL/min | THIRD ELEMENT NITROGEN ADDITION AMOUNT NL/min | PERMEATION SIDE PRESSURE kPa | TEMPERATURE ° C. |
|---|---|---|---|---|---|---|---|
| WITHOUT NITROGEN ADDITION AMOUNT ADJUSTMENT | 0 | 40 | 5.0 | 10 | 10 | −70 | 40 |
| | | 2000 | 5.0 | 500 | 500 | −70 | 40 |
| | 17.7 | 40 | 5.0 | 10 | 10 | −70 | 40 |
| NITROGEN ADDITION ADJUSTMENT $C_1 = 0.5$ | 0 | 40 | 5.0 | 10 | 10 | −70 | 40 |
| | | 2000 | 5.0 | 500 | 500 | −70 | 40 |
| | 8.6 | 40 | 5.0 | 10 | 10 | −70 | 40 |
| | 8.6 | 35 | 5.7 | 10 | 5 | −70 | 40 |
| | | 1750 | 5.7 | 500 | 250 | −70 | 40 |
| | 16.5 | 35 | 5.7 | 10 | 5 | −70 | 40 |
| | 16.5 | 30 | 6.7 | 10 | 0 | −70 | 40 |
| | | 1500 | 6.7 | 500 | 0 | −70 | 40 |
| | 29.4 | 30 | 6.7 | 10 | 0 | −70 | 40 |
| NITROGEN ADDITION AMOUNT ADJUSTMENT $C_1 = 0.5$ | 0 | 40 | 5.0 | 10 | 10 | −70 | 40 |
| | | 2000 | 5.0 | 500 | 500 | −70 | 40 |
| | 8.6 | 40 | 5.0 | 10 | 10 | −70 | 40 |
| | 8.6 | 35 | 5.7 | 10 | 5 | −70 | 40 |
| | | 1750 | 5.7 | 500 | 250 | −70 | 40 |
| | 16.5 | 35 | 5.7 | 10 | 5 | −70 | 40 |
| | 16.5 | 30 | 6.7 | 10 | 0 | −70 | 40 |
| | | 1500 | 6.7 | 500 | 0 | −70 | 40 |
| | 23.0 | 30 | 6.7 | 10 | 0 | −70 | 40 |
| PERMEATION SIDE PRESSURE ADJUSTMENT $C_2 = 1.0$ | 23.0 | 30 | 6.7 | 10 | 0 | −80 | 40 |
| | | 1500 | 6.7 | 500 | 0 | −80 | 40 |
| | 27.7 | 30 | 6.7 | 10 | 0 | −80 | 40 |
| | 27.7 | 30 | 6.7 | 10 | 0 | −90 | 40 |
| | | 1500 | 6.7 | 500 | 0 | −90 | 40 |
| | 30.9 | 30 | 6.7 | 10 | 0 | −90 | 40 |
| | 30.9 | 30 | 6.7 | 10 | 0 | −100 | 40 |
| | | 1500 | 6.7 | 500 | 0 | −100 | 40 |
| | 35.9 | 30 | 6.7 | 10 | 0 | −100 | 40 |
| NITROGEN ADDITION AMOUNT ADJUSTMENT $C_1 = 0.5$ | 0 | 40 | 5.0 | 10 | 10 | −70 | 40 |
| | | 2000 | 5.0 | 500 | 500 | −70 | 40 |
| | 8.6 | 40 | 5.0 | 10 | 10 | −70 | 40 |
| | 8.6 | 35 | 5.7 | 10 | 5 | −70 | 40 |
| | | 1750 | 5.7 | 500 | 250 | −70 | 40 |
| | 16.5 | 35 | 5.7 | 10 | 5 | −70 | 40 |
| | 16.5 | 30 | 6.7 | 10 | 0 | −70 | 40 |
| | | 1500 | 6.7 | 500 | 0 | −70 | 40 |
| | 23.0 | 30 | 6.7 | 10 | 0 | −70 | 40 |
| TEMPERATURE ADJUSTMENT $C_3 = 2.0$ | 23.0 | 30 | 6.7 | 10 | 0 | −70 | 60 |
| | | 1500 | 6.7 | 500 | 0 | −70 | 60 |
| | 27.5 | 30 | 6.7 | 10 | 0 | −70 | 60 |
| | 27.5 | 30 | 6.7 | 10 | 0 | −70 | 80 |
| | | 1500 | 6.7 | 500 | 0 | −70 | 80 |
| | 30.7 | 30 | 6.7 | 10 | 0 | −70 | 80 |
| | 30.7 | 30 | 6.7 | 10 | 0 | −70 | 100 |
| | | 1500 | 6.7 | 500 | 0 | −70 | 100 |
| | 34.5 | 30 | 6.7 | 10 | 0 | −70 | 100 |

TABLE 20-continued

| | | | | | | | |
|---|---|---|---|---|---|---|---|
| NITROGEN | 0 | 40 | 5.0 | 10 | 10 | −70 | 40 |
| ADDITION | | 2000 | 5.0 | 500 | 500 | −70 | 40 |
| AMOUNT | 8.6 | 40 | 5.0 | 10 | 10 | −70 | 40 |
| ADJUSTMENT | 8.6 | 35 | 5.7 | 10 | 5 | −70 | 40 |
| $C_1 = 0.5$ | | 1750 | 5.7 | 500 | 250 | −70 | 40 |
| | 16.5 | 35 | 5.7 | 10 | 5 | −70 | 40 |
| | 16.5 | 30 | 6.7 | 10 | 0 | −70 | 40 |
| | | 1500 | 6.7 | 500 | 0 | −70 | 40 |
| | 23.0 | 30 | 6.7 | 10 | 0 | −70 | 40 |
| PERMEATION | 23.0 | 30 | 6.7 | 10 | 0 | −80 | 40 |
| SIDE | | 1500 | 6.7 | 500 | 0 | −80 | 40 |
| PRESSURE | 27.7 | 30 | 6.7 | 10 | 0 | −80 | 40 |
| ADJUSTMENT | 27.7 | 30 | 6.7 | 10 | 0 | −90 | 40 |
| $C_2 = 1.0$ | | 1500 | 6.7 | 500 | 0 | −90 | 40 |
| | 30.9 | 30 | 6.7 | 10 | 0 | −90 | 40 |
| | 30.9 | 30 | 6.7 | 10 | 0 | −100 | 40 |
| | | 1500 | 6.7 | 500 | 0 | −100 | 40 |
| | 33.0 | 30 | 6.7 | 10 | 0 | −100 | 40 |
| TEMPERATURE | 33.0 | 30 | 6.7 | 10 | 0 | −100 | 60 |
| ADJUSTMENT | | 1500 | 6.7 | 500 | 0 | −100 | 60 |
| $C_3 = 2.0$ | 34.7 | 30 | 6.7 | 10 | 0 | −100 | 60 |
| | 34.7 | 30 | 6.7 | 10 | 0 | −100 | 80 |
| | | 1500 | 6.7 | 500 | 0 | −100 | 80 |
| | 36.0 | 30 | 6.7 | 10 | 0 | −100 | 80 |
| | 36.0 | 30 | 6.7 | 10 | 0 | −100 | 100 |
| | | 1500 | 6.7 | 500 | 0 | −100 | 100 |
| | 38.4 | 30 | 6.7 | 10 | 0 | −100 | 100 |

| TEST CONDITION | NUMBER OF YEARS IN USE (CORRESPONDING VALUE) YEAR | SUPPLY SIDE GAS TOTAL FLOW RATE NL/min | PERMEATION SIDE MONOSILANE CONCENTRATION vol % | HYDROGEN RECOVERY RATE % | REMARK |
|---|---|---|---|---|---|
| | WITHOUT NITROGEN ADDITION | 0 | 40 2000 | 0.051 | 78.7 | INITIAL ACCELERATED DEGRADATION TEST |
| | AMOUNT ADJUSTMENT | 17.7 | 40 | 0.035 | 60.2 | END |
| | NITROGEN ADDITION ADJUSTMENT | 0 | 40 2000 | 0.061 | 78.7 | INITIAL ACCELERATED DEGRADATION TEST |
| | $C_1 = 0.5$ | 8.6 | 40 | 0.043 | 70.8 | |
| | | 8.6 | 35 1750 | 0.051 | 80.2 | NITROGEN ADDITION AMOUNT REDUCTION ACCELERATED DEGRADATION TEST |
| | | 16.5 | 35 | 0.041 | 72.2 | |
| | | 16.5 | 30 1500 | 0.051 | 83.5 | NITROGEN ADDITION AMOUNT REDUCTION ACCELERATED DEGRADATION TEST |
| | | 29.4 | 30 | 0.028 | 60.1 | END |
| | NITROGEN ADDITION AMOUNT | 0 | 40 2000 | 0.061 | 78.7 | INITIAL ACCELERATED DEGRADATION TEST |
| | ADJUSTMENT $C_1 = 0.5$ | 8.6 | 40 | 0.043 | 70.8 | |
| | | 8.6 | 35 1750 | 0.051 | 80.2 | NITROGEN ADDITION AMOUNT REDUCTION ACCELERATED DEGRADATION TEST |
| | | 16.5 | 35 | 0.041 | 72.2 | |
| | | 16.5 | 30 1500 | 0.051 | 83.5 | NITROGEN ADDITION AMOUNT REDUCTION ACCELERATED DEGRADATION TEST |
| | | 23.0 | 30 | 0.039 | 75.1 | |
| | PERMEATION SIDE PRESSURE ADJUSTMENT $C_2 = 1.0$ | 23.0 | 30 1500 | 0.038 | 86.5 | PRESSURE ADJUSTMENT START ACCELERATED DEGRADATION TEST |
| | | 27.7 | 30 | 0.028 | 77.8 | |
| | | 27.7 | 30 1500 | 0.028 | 88.4 | PRESSURE REDUCTION ACCELERATED DEGRADATION TEST |
| | | 30.9 | 30 | 0.021 | 79.6 | |
| | | 30.9 | 30 1500 | 0.021 | 89.6 | PRESSURE REDUCTION ACCELERATED DEGRADATION TEST |
| | | 35.9 | 30 | 0.013 | 60.3 | END |

TABLE 20-continued

| | | | | | |
|---|---|---|---|---|---|
| NITROGEN ADDITION AMOUNT ADJUSTMENT $C_1 = 0.5$ | 0 | 40 2000 | 0.061 | 78.7 | INITIAL ACCELERATED DEGRADATION TEST |
| | 8.6 | 40 | 0.043 | 70.8 | |
| | 8.6 | 35 1750 | 0.051 | 80.2 | NITROGEN ADDITION AMOUNT REDUCTION ACCELERATED DEGRADATION TEST |
| | 16.5 | 35 | 0.041 | 72.2 | |
| | 16.5 | 30 1500 | 0.051 | 83.5 | NITROGEN ADDITION AMOUNT REDUCTION ACCELERATED DEGRADATION TEST |
| | 23.0 | 30 | 0.039 | 75.1 | |
| TEMPERATURE ADJUSTMENT $C_3 = 2.0$ | 23.0 | 30 1500 | 0.059 | 80.2 | TEMPERATURE ADJUSTMENT START ACCELERATED DEGRADATION TEST |
| | 27.5 | 30 | 0.046 | 72.2 | |
| | 27.5 | 30 1500 | 0.067 | 77.0 | TEMPERATURE INCREASE ACCELERATED DEGRADATION TEST |
| | 30.7 | 30 | 0.063 | 69.3 | |
| | 30.7 | 30 1500 | 0.073 | 73.9 | TEMPERATURE INCREASE ACCELERATED DEGRADATION TEST |
| | 34.5 | 30 | 0.055 | 60.3 | END |
| NITROGEN ADDITION AMOUNT ADJUSTMENT $C_1 = 0.5$ | 0 | 40 2000 | 0.061 | 78.7 | INITIAL ACCELERATED DEGRADATION TEST |
| | 8.6 | 40 | 0.043 | 70.8 | |
| | 8.6 | 35 1750 | 0.051 | 80.2 | NITROGEN ADDITION AMOUNT REDUCTION ACCELERATED DEGRADATION TEST |
| | 16.5 | 35 | 0.041 | 72.2 | |
| | 16.5 | 30 1500 | 0.051 | 83.5 | NITROGEN ADDITION AMOUNT REDUCTION ACCELERATED DEGRADATION TEST |
| | 23.0 | 30 | 0.039 | 75.1 | |
| PERMEATION SIDE PRESSURE ADJUSTMENT $C_2 = 1.0$ | 23.0 | 30 1500 | 0.038 | 86.5 | PRESSURE ADJUSTMENT START ACCELERATED DEGRADATION TEST |
| | 27.7 | 30 | 0.028 | 77.8 | |
| | 27.7 | 30 1500 | 0.028 | 88.4 | PRESSURE REDUCTION ACCELERATED DEGRADATION TEST |
| | 30.9 | 30 | 0.021 | 79.6 | |
| | 30.9 | 30 1500 | 0.021 | 89.6 | PRESSURE REDUCTION ACCELERATED DEGRADATION TEST |
| | 33.0 | 30 | 0.017 | 80.7 | |
| TEMPERATURE ADJUSTMENT $C_3 = 2.0$ | 33.0 | 30 1500 | 0.026 | 89.6 | TEMPERATURE ADJUSTMENT START ACCELERATED DEGRADATION TEST |
| | 34.7 | 30 | 0.021 | 80.7 | |
| | 34.7 | 30 1500 | 0.030 | 88.7 | TEMPERATURE INCREASE ACCELERATED DEGRADATION TEST |
| | 36.0 | 30 | 0.025 | 79.8 | |
| | 36.0 | 30 1500 | 0.034 | 87.2 | TEMPERATURE INCREASE ACCELERATED DEGRADATION TEST |
| | 38.4 | 30 | 0.022 | 60.0 | END |

The invention is not limited to the above-described embodiments and examples, and various modifications such as a change in design may be made based on the knowledge of the person skilled in the art. Then, the modified embodiments are also included in the scope of the invention.

What is claimed is:

1. An exhaust gas treatment system which treats a mixed gas containing at least hydrogen and monosilane discharged from a semiconductor fabrication equipment, the exhaust gas treatment system comprising:
   a membrane separation unit which causes the hydrogen to selectively permeate therethrough and separates the monosilane and the hydrogen from the mixed gas;
   a hydrogen recovery rate acquisition unit which acquires information on a recovery rate of the hydrogen separated by the membrane separation unit and calculates the recovery rate of the hydrogen; and
   a pressure control unit which controls a permeation side pressure of the membrane separation unit in response to a change in hydrogen recovery rate.

2. The exhaust gas treatment system according to claim 1, wherein
   the pressure control unit changes the permeation side pressure based on the following equation:
   $$\Delta P = C_1 \times \Delta A, \ C_1 \geq 0.5$$
   wherein $\Delta A$ indicates a decrease rate (%) of the hydrogen recovery rate, and $\Delta P$ indicates a reduction amount (kPa) of the permeation side pressure.

3. An exhaust gas treatment system which treats a mixed gas containing at least hydrogen and monosilane discharged from a semiconductor fabrication equipment, the exhaust gas treatment system comprising:
   a membrane separation unit which causes the hydrogen to selectively permeate therethrough and separates the monosilane and the hydrogen from the mixed gas;
   a hydrogen recovery rate acquisition unit which acquires information on a recovery rate of the hydrogen separated by the membrane separation unit and calculates the recovery rate of the hydrogen; and
   a temperature control unit which controls a temperature of the mixed gas flowing into the membrane separation unit in response to a change in hydrogen recovery rate.

4. The exhaust gas treatment system according to claim 3, wherein
   the temperature control unit changes the temperature of the mixed gas flowing into the membrane separation unit based on the following equation:
   $$\Delta T = C_2 \times \Delta A, \ C_2 \geq 0.5$$
   wherein $\Delta A$ indicates a decrease rate (%) of the hydrogen recovery rate, and $\Delta T$ indicates a temperature increase amount (° C.) of the mixed gas.

5. The exhaust gas treatment system according to claim 1, wherein
   the hydrogen recovery rate acquisition unit includes
      a mixed gas analysis unit which measures a flow rate of the mixed gas flowing and a concentration of the hydrogen and the monosilane into the membrane separation unit, and
      a permeation side gas analysis unit which measures a flow rate of a gas and a concentration of the hydrogen and the monosilane, the gas comprising the hydrogen, and the monosilane being separated while permeating the membrane separation unit.

6. The exhaust gas treatment system according to claim 1, wherein
   the hydrogen recovery rate acquisition unit includes
      a flow rate control unit which controls a flow rate of the mixed gas flowing into the membrane separation unit;
      a mixed gas analysis unit which measures a concentration of the hydrogen and the monosilane in the mixed gas of which the flow rate is controlled; and
      a permeation side gas analysis unit which measures a flow rate of a gas and a concentration of the hydrogen and the monosilane, the gas comprising the hydrogen, and the monosilane being separated while permeating the membrane separation unit.

7. An exhaust gas treatment system which separates respective gases, by membrane separation, from a mixed gas containing at least hydrogen and monosilane discharged from a semiconductor fabrication equipment, the exhaust gas treatment system comprising:
   a gas addition unit which adds a third element gas to the mixed gas discharged from the semiconductor fabrication equipment;
   a membrane separation device which includes a semipermeable membrane causing the hydrogen to selectively permeate therethrough and separates the monosilane and the hydrogen from the mixed gas having the third element gas added thereto; and
   a hydrogen recovery rate acquisition unit which acquires a recovery rate of the hydrogen separated by the membrane separation device, wherein
   the gas addition unit changes an addition amount of the third element gas according to the following equation:
   $$\Delta F = C_1 \times \Delta A, \ C_1 \geq 0.3$$
   wherein $\Delta A$ indicates a decrease rate (%) of the hydrogen recovery rate, and $\Delta F$ indicates a decrease amount (L/min) of the addition amount of the third element gas.

8. The exhaust gas treatment system according to claim 7, further comprising:
   a pressure control unit which controls a permeation side pressure of the membrane separation device, wherein
   the pressure control unit changes the permeation side pressure of the membrane separation device according to the following equation:
   $$\Delta P = C_2 \times \Delta A, \ C_2 \geq 0.5$$
   wherein $\Delta A$ indicates a decrease rate (%) of the hydrogen recovery rate, and $\Delta P$ indicates a decrease amount (kPa) of the permeation side pressure of the membrane separation device.

9. The exhaust gas treatment system according to claim 7, further comprising:
   a temperature control unit which controls a temperature of the mixed gas, wherein
   the temperature control unit changes the temperature of the mixed gas according to the following equation:
   $$\Delta T = C_3 \times \Delta A, \ C_3 \geq 0.8$$
   wherein $\Delta A$ indicates a decrease rate (%) of the hydrogen recovery rate, and $\Delta T$ indicates an increase amount (° C.) of the temperature of the mixed gas.

* * * * *